United States Patent
Noh et al.

(10) Patent No.: US 10,941,171 B2
(45) Date of Patent: Mar. 9, 2021

(54) ORGANOMETALLIC COMPOUND AND ORGANIC LIGHT-EMITTING DEVICE INCLUDING THE SAME

(71) Applicants: Samsung Electronics Co., Ltd., Suwon-si (KR); Samsung SDI Co., Ltd., Yongin-si (KR)

(72) Inventors: Changho Noh, Suwon-si (KR); Wataru Sotoyama, Kanagawa (KR); Wook Kim, Suwon-si (KR); Juhyun Kim, Suwon-si (KR); Sangho Park, Anyang-si (KR); Satoko Ishibe, Seongnam-si (KR); Hasup Lee, Seoul (KR); Dmitry Kravchuk, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 279 days.

(21) Appl. No.: 16/031,443

(22) Filed: Jul. 10, 2018

(65) Prior Publication Data

US 2019/0153008 A1   May 23, 2019

(30) Foreign Application Priority Data

Nov. 22, 2017   (KR) .................. 10-2017-0156614

(51) Int. Cl.
| | | |
|---|---|---|
| *C07F 15/00* | (2006.01) | |
| *H01L 51/50* | (2006.01) | |
| *H01L 51/00* | (2006.01) | |

(52) U.S. Cl.
CPC ...... *C07F 15/0033* (2013.01); *H01L 51/0085* (2013.01); *H01L 51/5024* (2013.01);
(Continued)

(58) Field of Classification Search
None
See application file for complete search history.

(56) References Cited

U.S. PATENT DOCUMENTS

| | | |
|---|---|---|
| 2011/0198988 A1 | 8/2011 | Inoue et al. |
| 2016/0233441 A1 | 8/2016 | Kim et al. |

FOREIGN PATENT DOCUMENTS

| | | |
|---|---|---|
| JP | 5387563 B2 | 10/2013 |
| WO | 2013-150909 A1 | 10/2013 |

OTHER PUBLICATIONS

Machine English transslation of Katakura et al. (JP 5387563). Jun. 17, 2020.*

* cited by examiner

*Primary Examiner* — Jay Yang
(74) *Attorney, Agent, or Firm* — Cantor Colburn LLP

(57) ABSTRACT

An organometallic compound represented by Formula 1:

Formula 1

(Continued)

wherein, in Formula 1, groups and variables are the same as described in the specification.

16 Claims, 2 Drawing Sheets

(52) U.S. Cl.
CPC ...... *H01L 51/5004* (2013.01); *H01L 51/5016* (2013.01); *H01L 51/5056* (2013.01); *H01L 51/5072* (2013.01)

ORGANOMETALLIC COMPOUND AND ORGANIC LIGHT-EMITTING DEVICE INCLUDING THE SAME

CROSS-REFERENCE TO RELATED APPLICATION

This application claims priority to Korean Patent Application No. 10-2017-0156614, filed on Nov. 22, 2017, in the Korean Intellectual Property Office, and all the benefits accruing therefrom under 35 U.S.C. § 119, the content of which is incorporated herein in its entirety by reference.

BACKGROUND

1. Technical Field

One or more embodiments relate to an organometallic compound and an organic light-emitting device including the same.

2. Description of the Related Art

Organic light-emitting devices (OLEDs) are self-emission devices that produce full-color images, and also have wide viewing angles, high contrast ratios, short response times, and excellent characteristics in terms of brightness, driving voltage, and response speed, compared to the devices in the art.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

One or more embodiments relate to a novel organometallic compound and an organic light-emitting device including the same.

Additional aspects will be set forth in part in the description which follows and, in part, will be apparent from the description, or may be learned by practice of the presented embodiments.

An aspect provides an organometallic compound represented by Formula 1:

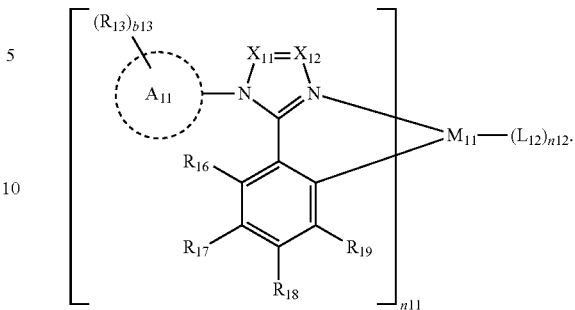

Formula 1

In Formula 1, $M_{11}$ may be selected from transition metals of Periods I to III of the Periodic Table, $A_{11}$ may be a 5-membered ring, $A_{11}$ may be selected from N and $CR_{11}$, $X_{12}$ may be selected from N and $CR_{12}$, $R_{11}$ to $R_{13}$ and $R_{16}$ to $R_{16}$ may each independently be selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, $R_{11}$ and $R_{12}$ may optionally be linked to form a ring, at least one selected from $R_{16}$ to $R_{19}$ may be a cyano group, two, three, or four selected from a plurality of $R_{11}$ to $R_{13}$ and $R_{16}$ to $R_{19}$ that are adjacent to each other may be optionally linked to form a tetradentate ligand, a hexadentate ligand, or an octadentate ligand, respectively, b13 may be selected from 1, 2, 3, 4, 5, 6, and 7, n11 may be selected from 1, 2, 3, and 4, n12 may be selected from 0, 1, 2, 3, and 4, $L_{12}$ may be selected from a monodentate ligand, a bidentate ligand, and a tridentate ligand, and $Q_1$ to $Q_9$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Another aspect provides an organic light-emitting device including:

a first electrode, a second electrode, and an organic layer disposed between the first electrode and the second electrode, wherein the organic layer includes an emission layer and the organometallic compound as described above.

The organometallic compound may act as a dopant in the emission layer.

BRIEF DESCRIPTION OF THE DRAWING

These and/or other aspects will become apparent and more readily appreciated from the following description of the embodiments, taken in conjunction with the accompanying drawings in which.

DETAILED DESCRIPTION

Figure 1:
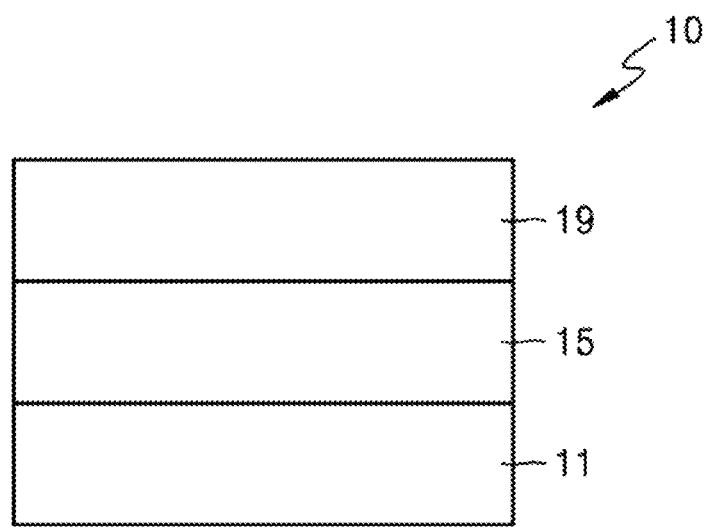
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment may be represente by Formula 1:

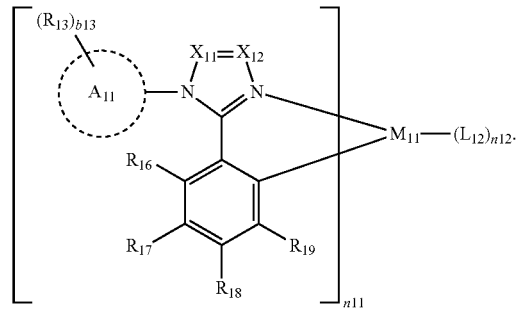

Formula 1

In Formula 1, $M^{11}$ may be selected from transition metals of Periods I to III of the Periodic Table.

For example, $M_{11}$ in Formula 1 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), but embodiments of the present disclosure are not limited thereto.

In an embodiment, $M^{11}$ in Formula 1 may be selected from Rh, Ir, Ru, and Os, but embodiments of the present disclosure are not limited thereto.

In an embodiment, $M_{11}$ in Formula 1 may be Ir, but embodiments of the present disclosure are not limited thereto.

In an embodiment, $A_{11}$ in Formula 1 may be a 5-membered ring, wherein a case where $A_{11}$ in Formula 1 is a 6-membered ring, such as a phenyl group, is excluded.

For example, $A_{11}$ in Formula 1 may be selected from a 5-membered aromatic hetero ring, 5-membered non-aromatic ring, and a 5-membered non-aromatic hetero ring, wherein the 5-membered aromatic hetero ring and the 5-membered non-aromatic hetero ring may each independently include at least one heteroatom selected from Si, N, O, and S, but embodiments of the present disclosure are not limited thereto.

In an embodiment, $A_{11}$ in Formula 1 may be selected from a pyrrole group, a pyrazole group, a triazole group, a tetrazole group, a furan group, an oxazole group, an isoxazole group, an oxadiazole group, a thiophene group, a thiazole group, an isothiazole group, a thiadiazole group, a pyrrolidine group, a pyrazolidine group, a triazolidine group, a tetrazolidine group, a tetrahydrofuran group, an oxazolidine group, an isoxazolidine group, an oxadiazolidine group, a tetrahydrothiophene group, a thiazolidine group, an isothiazolidine group, and a thiadiazolidine group, but embodiments of the present disclosure are not limited thereto.

In an embodiment, $A_{11}$-$(R_{13})_{b13}$ in Formula 1 may be a group represented by one selected from Formulae 2-1 to 2-5, but embodiments of the present disclosure are not limited thereto:

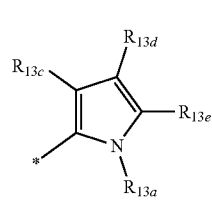

2-1

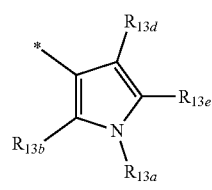

2-2

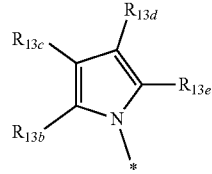

2-3

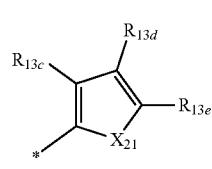

2-4

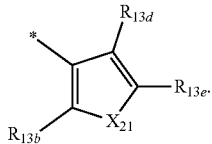

2-5

In Formulae 2-1 to 2-5, $X_{21}$ may be selected from O and S, $R_{13a}$ to $R_{13e}$ may each independently be understood by referring to the description provided herein in connection with $R_{13}$ in Formula 1, and "*" indicates a binding site to a neighboring atom.

For example, $A_{11}$-$(R_{13})_{b13}$ may be a group represented by Formula 2-2, $R_{13a}$ to $R_{13e}$ in Formula 2-2 may each independently be selected from:

hydrogen, deuterium, —F, —Cl, —Br, —I, a $C_1$-$C_{10}$ alkyl group, and a $C_6$-$C_{20}$ aryl group;

a $C_1$-$C_{10}$ alkyl group substituted with at least one selected from deuterium and —F; and a $C_6$-$C_{20}$ aryl group substituted with at least one selected from deuterium, —F, —CD$_3$, —CD$_2$H, —CDH$_2$, —CF$_3$, —CF$_2$H, —CFH$_2$, and a $C_1$-$C_{10}$ alkyl group, but embodiments of the present disclosure are not limited thereto.

In an embodiment, $A_{11}$-$(R_{13})_{b13}$ in Formula 1 may be a group represented by one selected from Formulae 2-11 to 2-18, but embodiments of the present disclosure are not limited thereto:

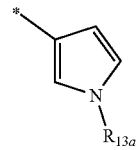

2-11

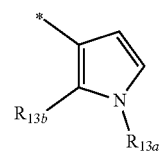

2-12

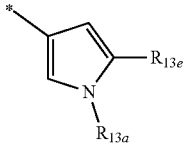

2-13

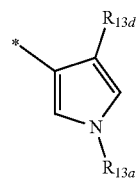

2-14

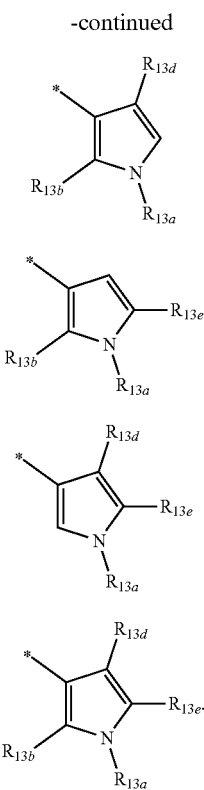

In Formulae 2-11 to 2-18, $R_{13a}$, $R_{13b}$, $R_{13d}$, and $R_{13e}$ may each independently be selected from a $C_1$-$C_{10}$ alkyl group and a $C_6$-$C_{20}$ aryl group, and "*" indicates a binding site to a neighboring atom.

In Formula 1, $X_{11}$ may be selected from N and $CR_{11}$, and $X_{12}$ may be selected from N and $CR_{12}$, wherein the description of $R_{11}$ and $R_{12}$ may refer to the following description.

For example, in Formula 1, $X_{11}$ may be N, and $X_{12}$ may be $CR_{12}$, $X_{11}$ may be $CR_{11}$, and $X_{12}$ may be N, $X_{11}$ may be N, and $X_{12}$ may be N, or $X_{11}$ may be $CR_{11}$, and $X_{12}$ may be $CR_{12}$, but embodiments of the present disclosure are not limited thereto.

In an embodiment, in Formula 1, $X_{11}$ may be $CR_{11}$, and $X_{12}$ may be $CR_{12}$, but embodiments of the present disclosure are not limited thereto.

In Formula 1, $R_{11}$ to $R_{13}$ and $R_{16}$ to $R_{19}$ may each independently be selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), and $R_{11}$ and $R_{12}$ may optionally be linked to form a ring.

For example, in Formula 1, $R_{11}$ to $R_{13}$ and $R_{16}$ to $R_{19}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclophentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinayl group, a pyridazinyl group, an isoindolyl group, an indolyl group, an indazolyl group, a purinyl group, a quinolinyl group, an isoquinolinyl group, a benzoquinolinyl group, a qunoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a trizolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cycloctyl group, a cycloctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(═O)($Q_8$)($Q_9$), and $Q_1$ to $Q_9$ and $Q_{33}$ to $Q_{35}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CH$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In an embodiment, in Formula 1, $R_{11}$ to $R_{13}$ and $R_{16}$ to $R_{19}$ may each independently be selected from hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —CD$_3$, —CD$_2$H, —CDH$_2$, —CF$_3$, —CF$_2$H, —CFH$_2$, a cyano group, a nitro group, a $C_1$-$C_{10}$ alkyl group, a $C_1$-$C_{10}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(═O)($Q_8$)($Q_9$), and $Q_1$ to $Q_9$ and $Q_{33}$ to $Q_{35}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CH$_2$CD$_3$, —CD$_2$CD$_2$H, and —CD$_2$CDH$_{12}$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In an embodiment, in Formula 1, $R_{11}$ to $R_{13}$ and $R_{16}$ to $R_{19}$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-21, groups represented by Formulae 10-1 to 10-246, —N($Q_1$)($Q_2$), —Si($Q_3$)($Q_4$)($Q_5$), —B($Q_6$)($Q_7$), and —P(=O)($Q_8$)($Q_9$), but embodiments of the present disclosure are not limited thereto:

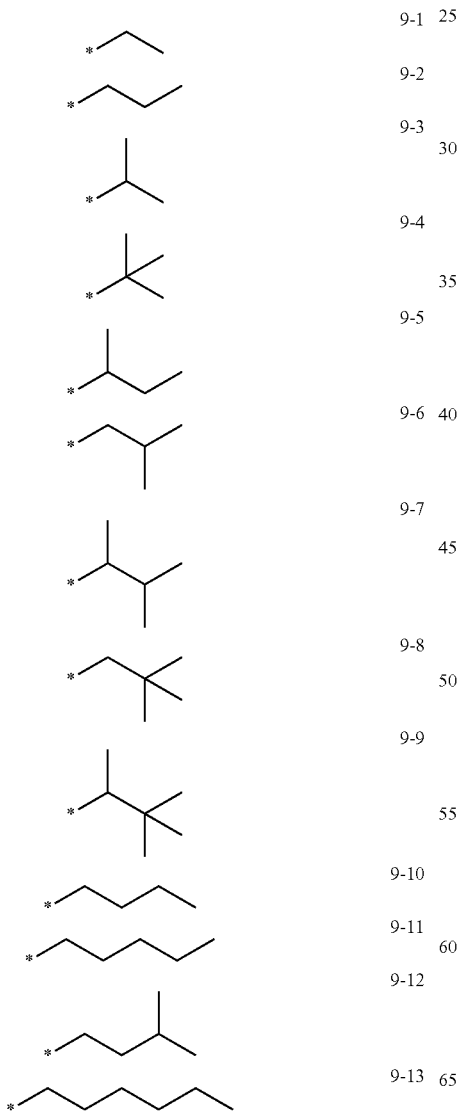

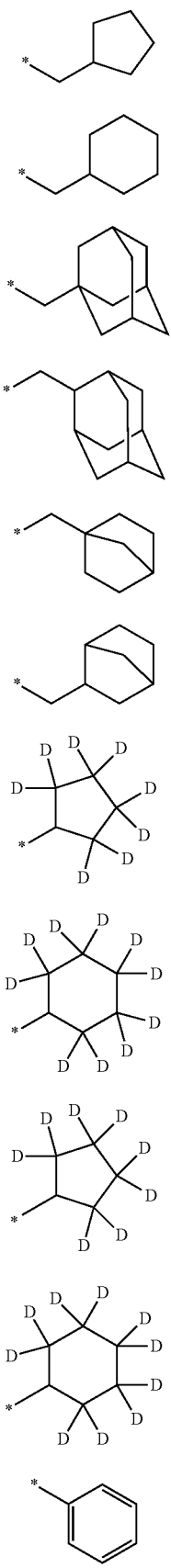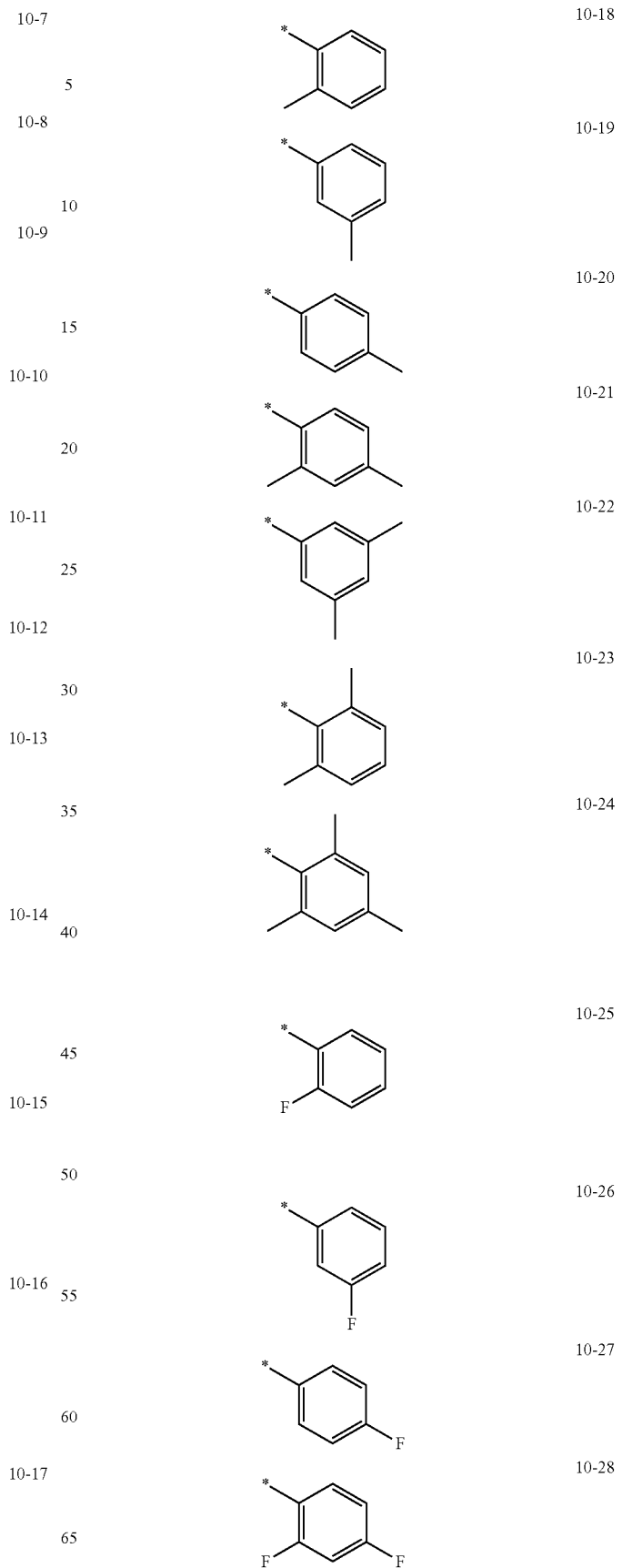

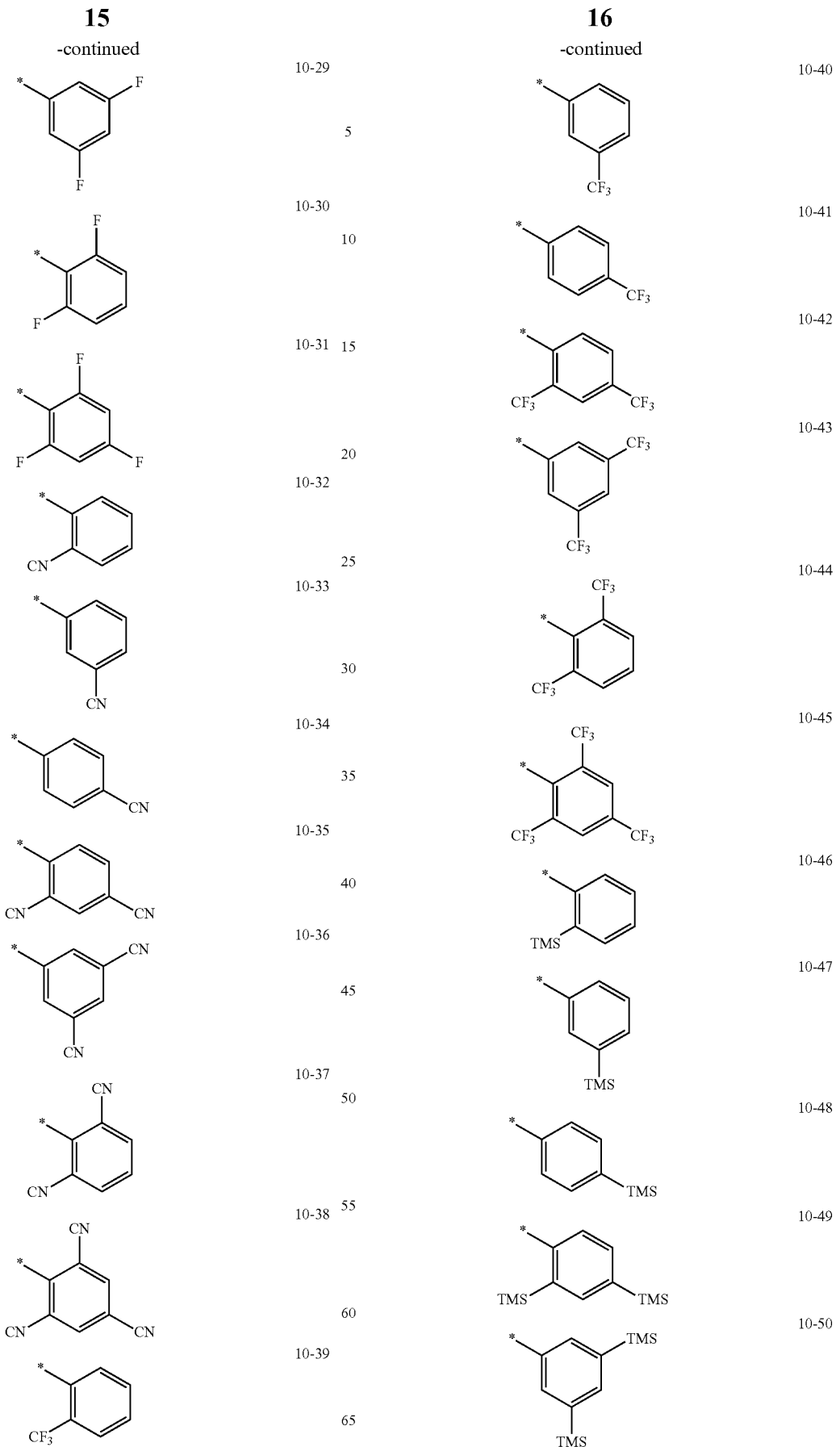

| | |
|---|---|
| 10-51 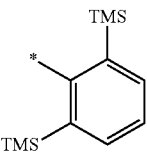 | 10-62 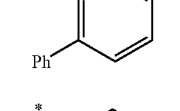 |
| 10-52 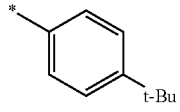 | 10-63 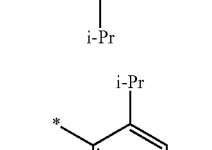 |
| 10-53 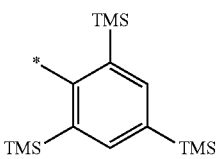 | 10-64 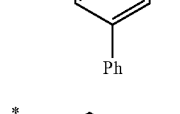 |
| 10-54 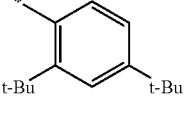 | 10-65 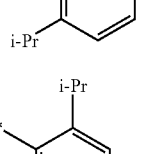 |
| 10-55 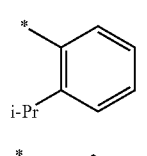 | 10-66 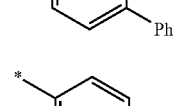 |
| 10-56 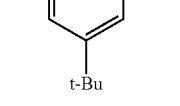 | 10-67 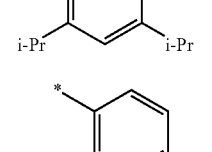 |
| 10-57 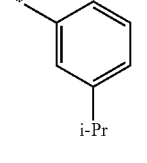 | 10-68 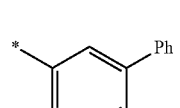 |
| 10-58 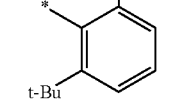 | 10-69 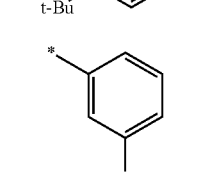 |
| 10-59 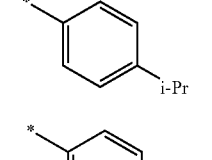 | 10-70 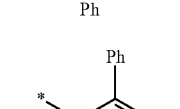 |
| 10-60 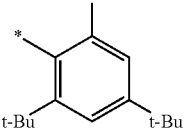 | 10-71 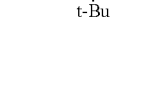 |
| 10-61 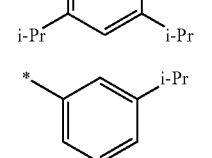 | 10-72 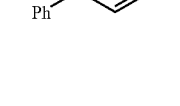 |

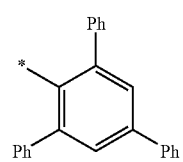 10-73
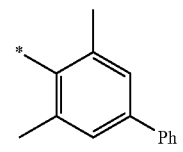 10-74
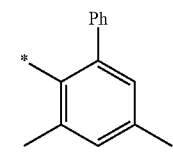 10-75
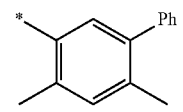 10-76
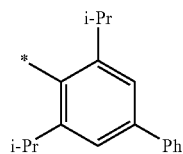 10-77
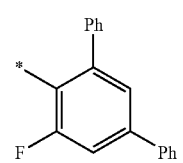 10-78
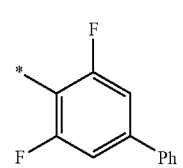 10-79
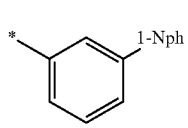 10-80
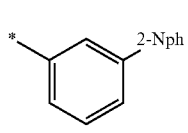 10-81
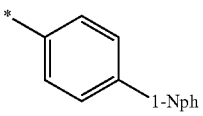 10-82
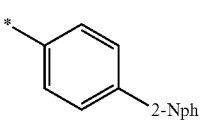 10-83
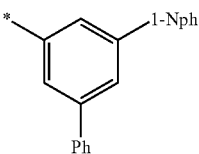 10-84
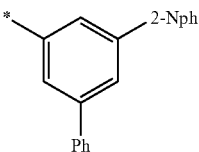 10-85
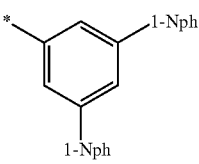 10-86
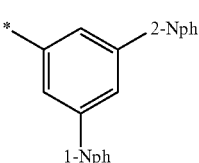 10-87
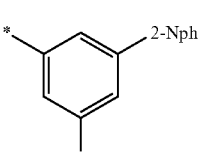 10-88
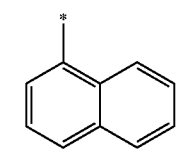 10-89
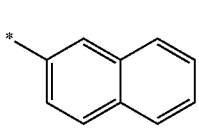 10-90
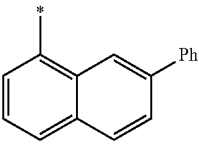 10-91
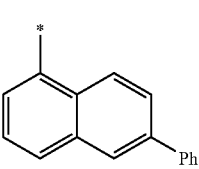 10-92
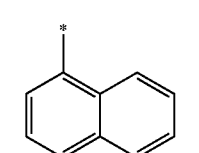 10-93

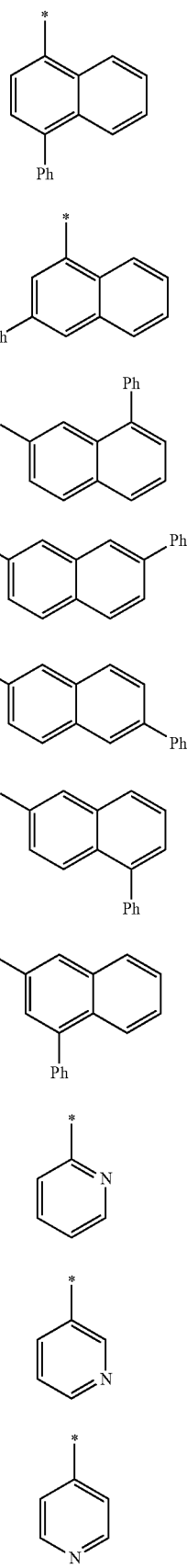
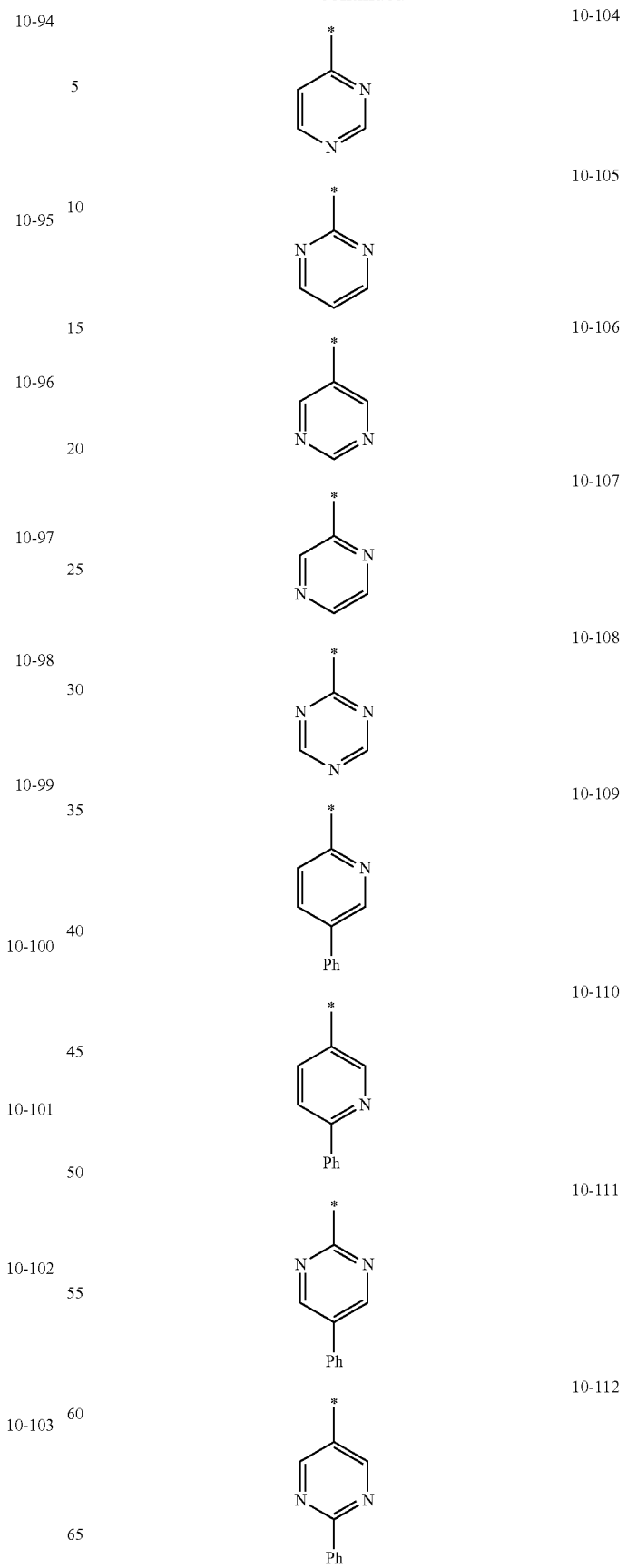

10-113
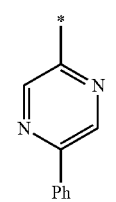
10-114
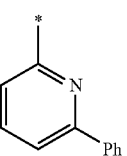
10-115
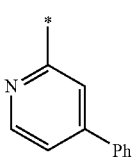
10-116
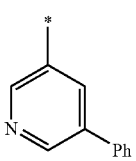
10-117
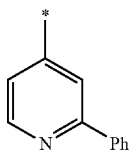
10-118
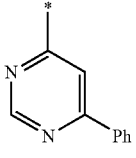
10-119
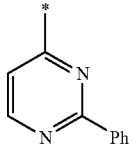
10-120
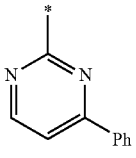
10-121
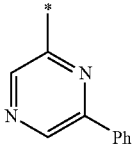
10-122
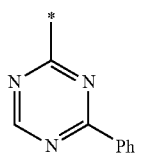
10-123
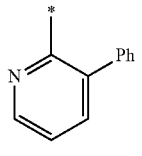
10-124
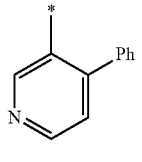
10-125
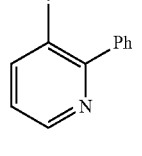
10-126
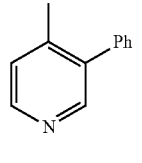
10-127
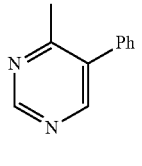
10-128
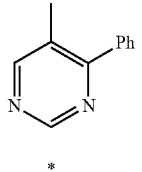
10-129
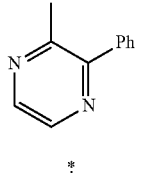
10-130
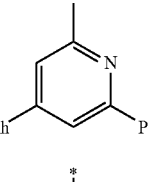
10-131
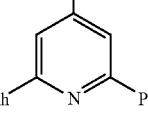

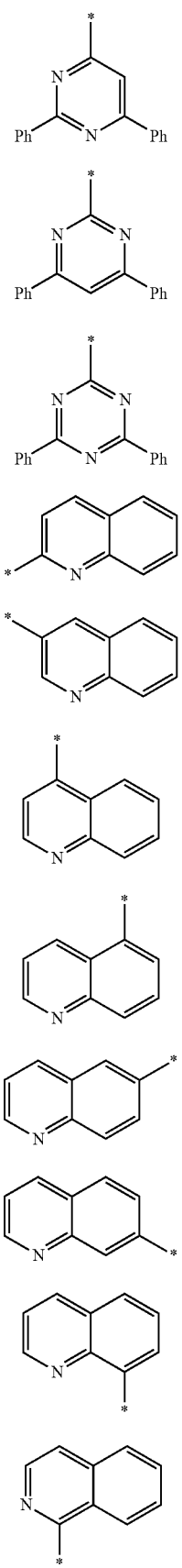
10-132
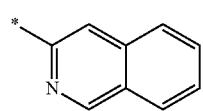
10-143
10-133
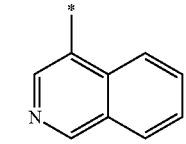
10-144
10-134
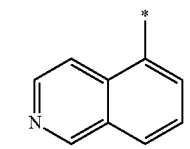
10-145
10-135
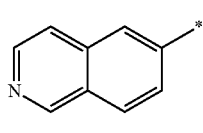
10-146
10-136
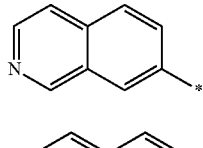
10-147
10-137
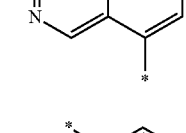
10-148
10-138
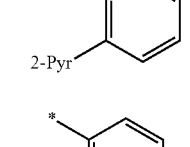
10-149
10-139
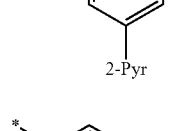
10-150
10-140
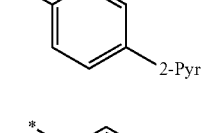
10-151
10-141
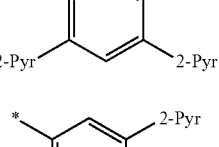
10-152
10-142
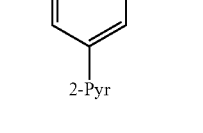
10-153

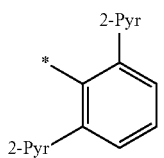
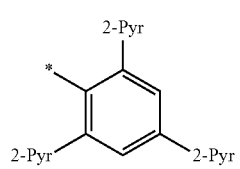
10-154
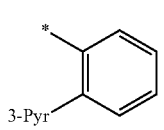
10-155
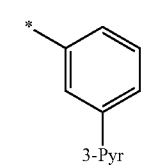
10-156
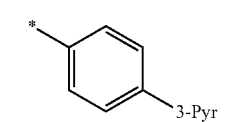
10-157
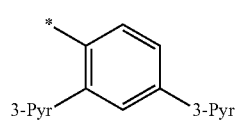
10-158
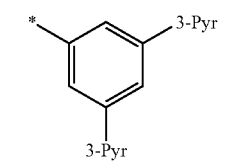
10-159
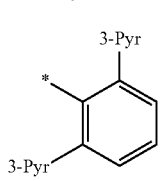
10-160
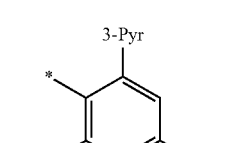
10-161
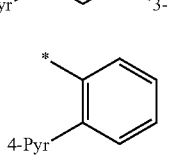
10-162
10-163
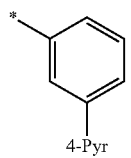
10-164
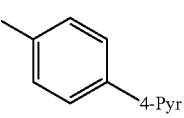
10-165
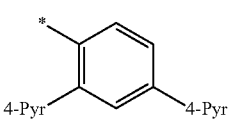
10-166
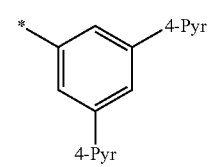
10-167
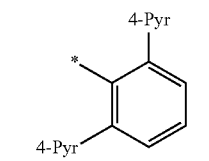
10-168
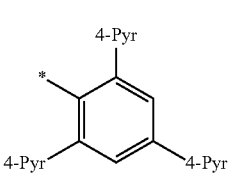
10-169
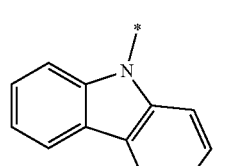
10-170
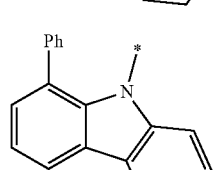
10-171
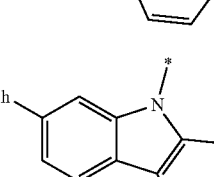
10-172
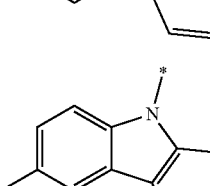
10-173

-continued
10-174 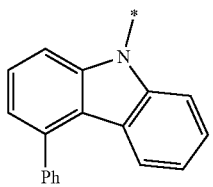
10-175 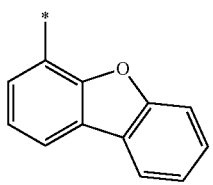
10-176 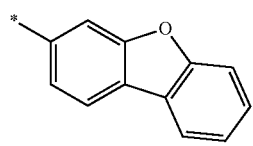
10-177 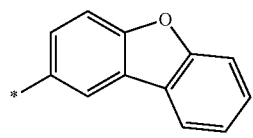
10-178 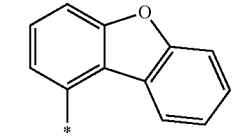
10-179 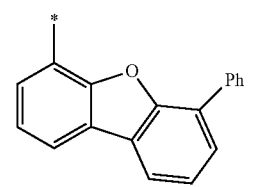
10-180 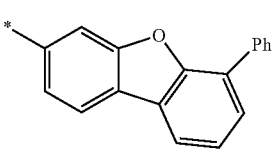
10-181 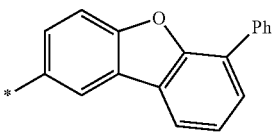
10-182 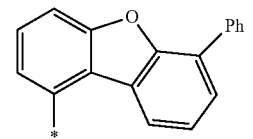
-continued
10-183 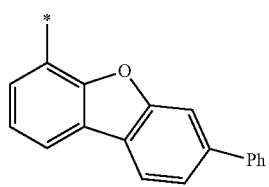
10-184 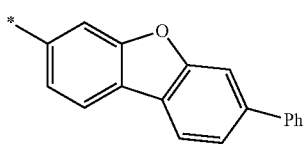
10-185 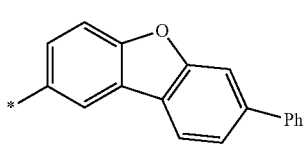
10-186 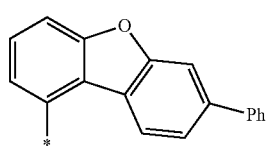
10-187 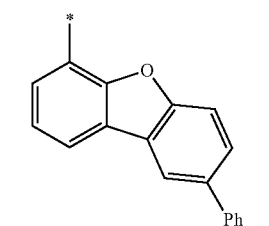
10-188 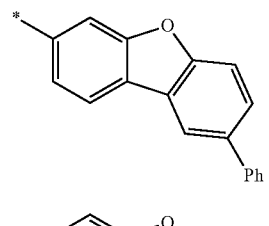
10-189 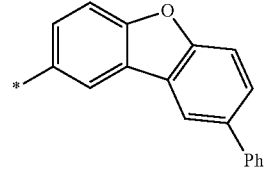
10-190 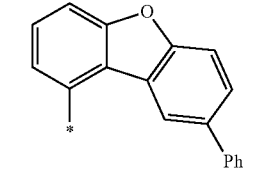

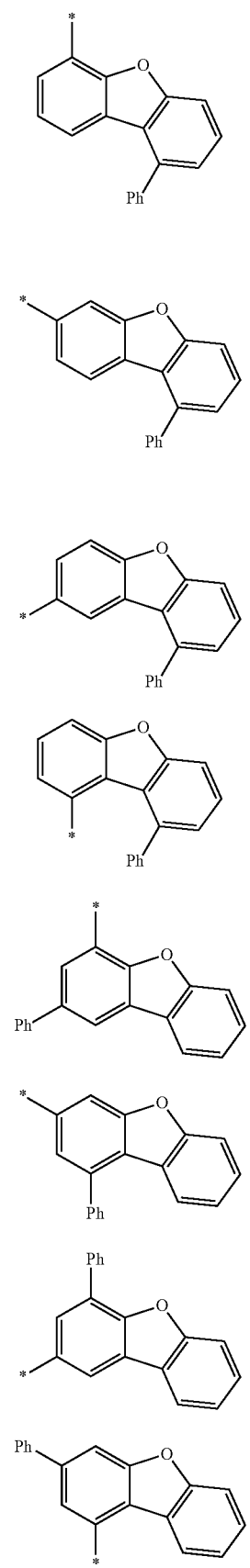
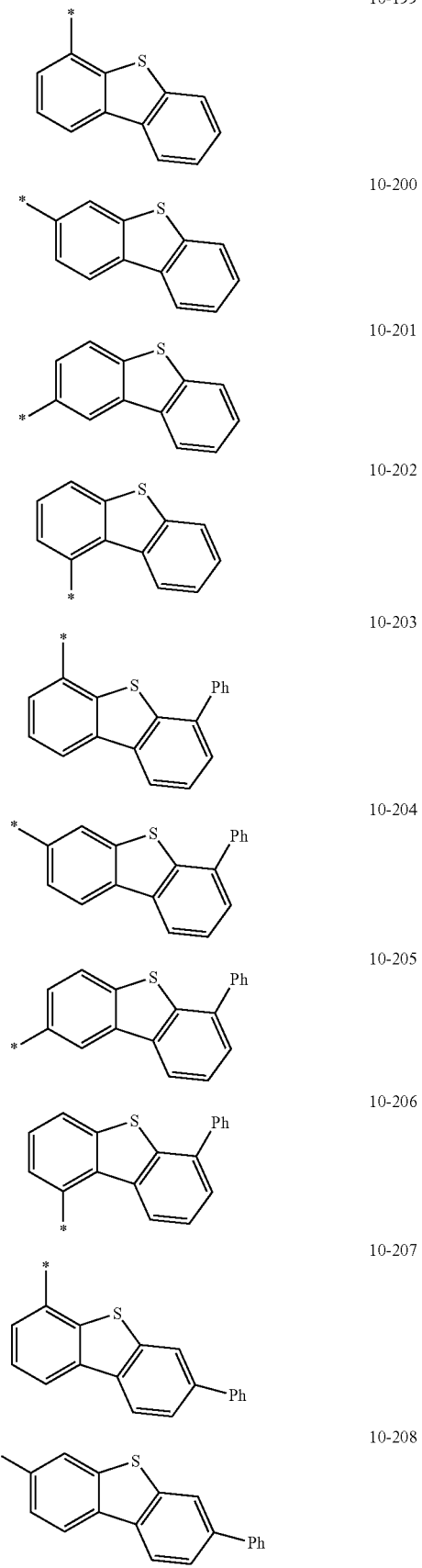

-continued
10-209
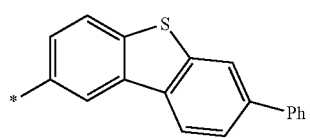
10-210
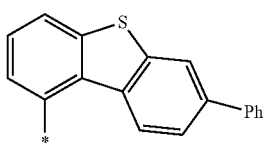
10-211
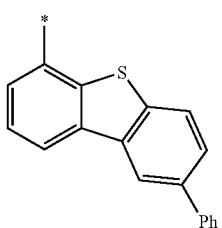
10-212
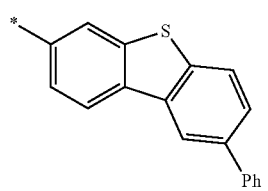
10-213
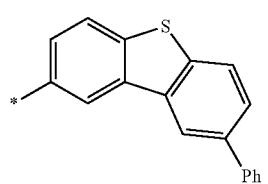
10-214
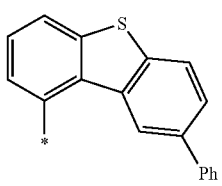
10-215
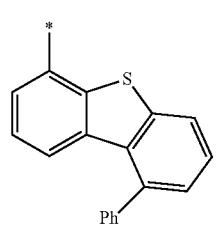
10-216
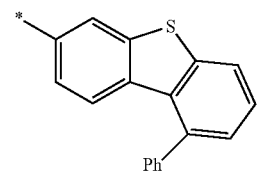
-continued
10-217
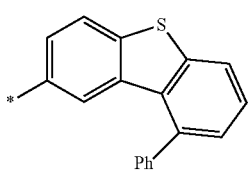
10-218
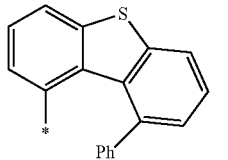
10-219
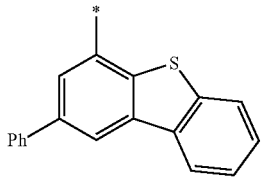
10-220
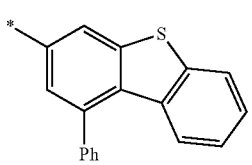
10-221
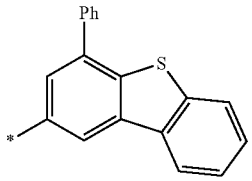
10-222
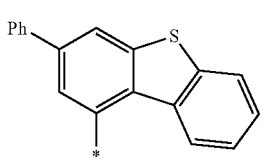
10-223
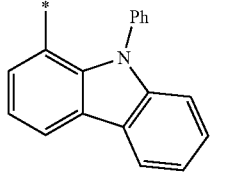
10-224
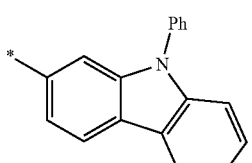
10-225
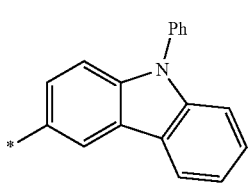

10-226 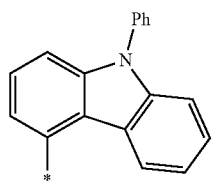
10-227 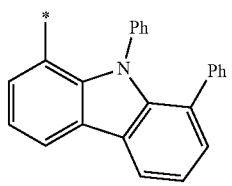
10-228 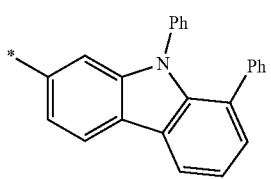
10-229 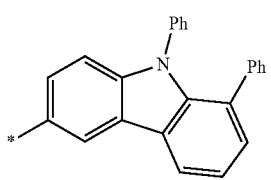
10-230 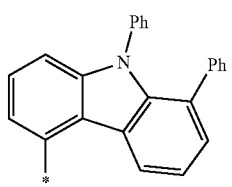
10-231 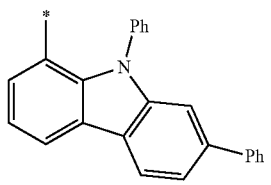
10-232 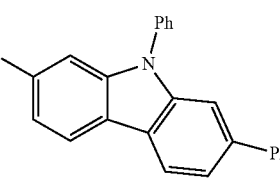
10-233 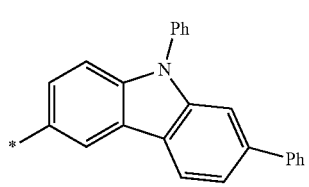
10-234 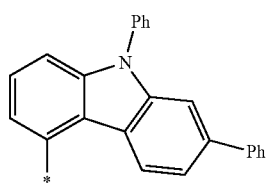
10-235 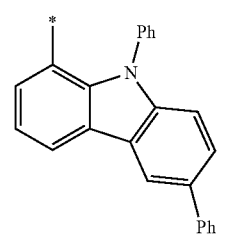
10-236 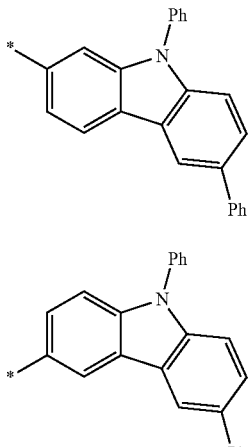
10-237
10-238 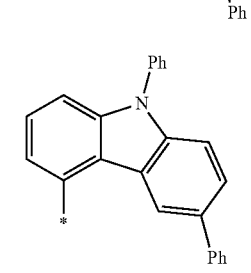
10-239 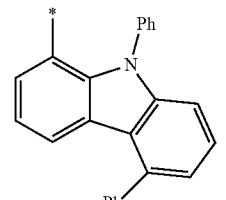
10-240 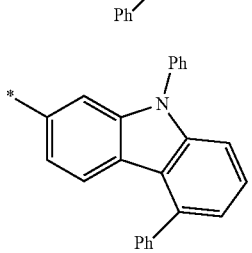

-continued

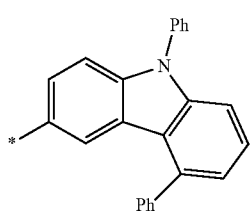
10-241

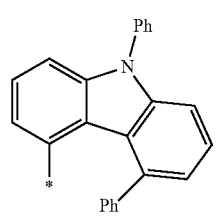
10-242

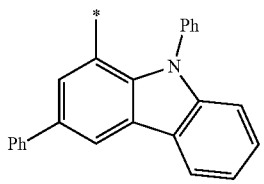
10-243

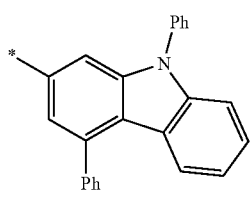
10-244

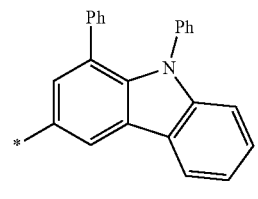
10-245

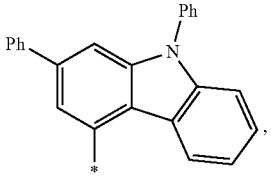
10-246 and

Q$_1$ to Q$_9$ may each independently be selected from:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CH$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group, wherein, in Formulae 9-1 to 9-21 and 10-1 to 10-246.

In Formulae 9-1 to 9-21 and 10-1 to 10-246, "*" indicates a binding site to a neighboring atom, "i-Pr" indicates an iso-propyl group, "t-Bu" indicates a tert-butyl group, "Ph" indicates a phenyl group, "1-Nph" indicates 1-naphthyl group, and "2-Nph" indicates 2-naphthyl group, "2-Pyr" indicates a 2-pyridyl group, "3-Pyr" indicates a 3-pyridyl group, "4-Pyr" indicates a 4-pyridyl group, and "TMS" indicates a trimethylsilyl group.

In an embodiment, in Formula 1, R$_{11}$ to R$_{13}$ and R$_{16}$ to R$_{19}$ may each independently be selected from hydrogen, deuterium, —F, a cyano group, a nitro group, —SF$_5$, —CH$_3$, —CF$_3$, groups represented by Formulae 9-1 to 9-13, and groups represented by Formulae 10-17 to 10-79, but embodiments of the present disclosure are not limited thereto:

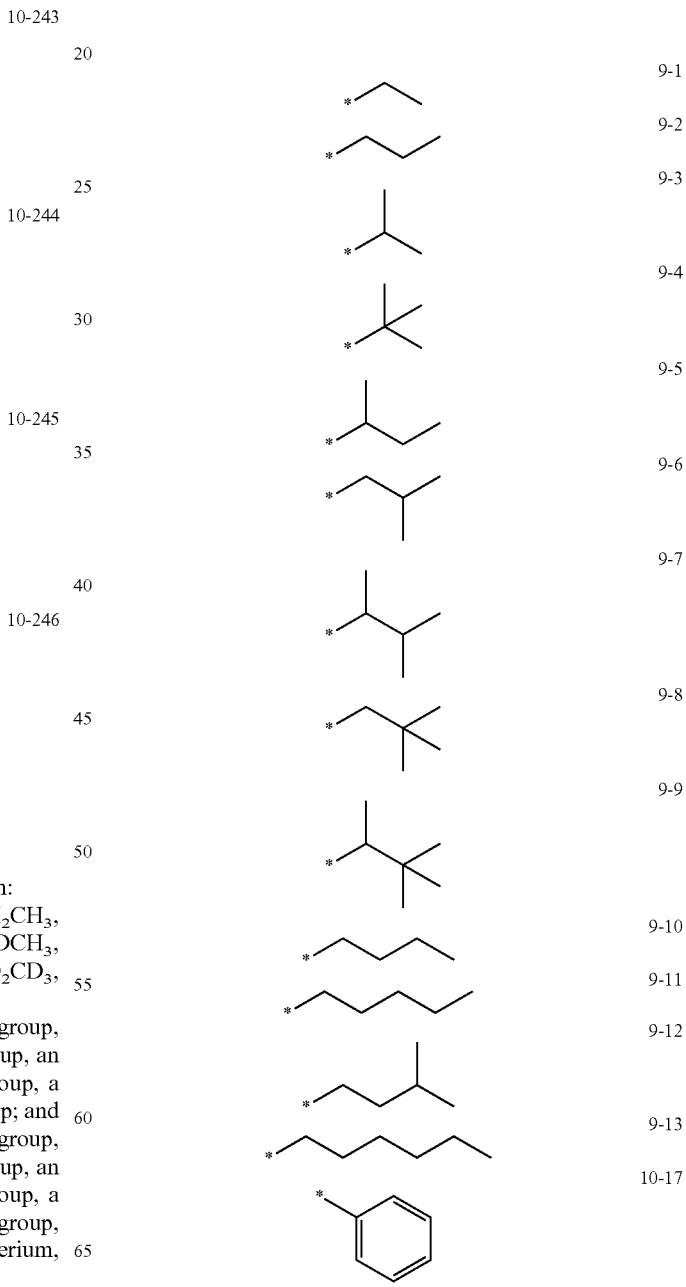

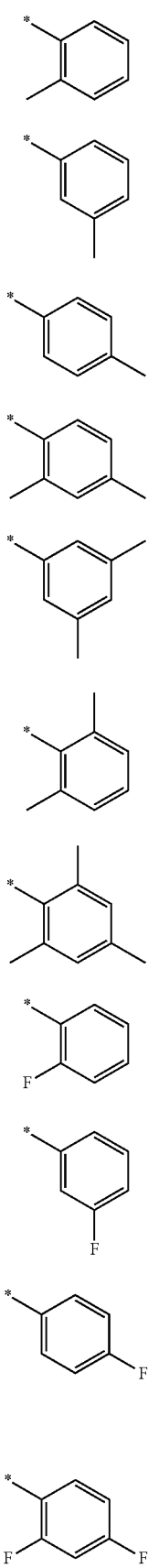
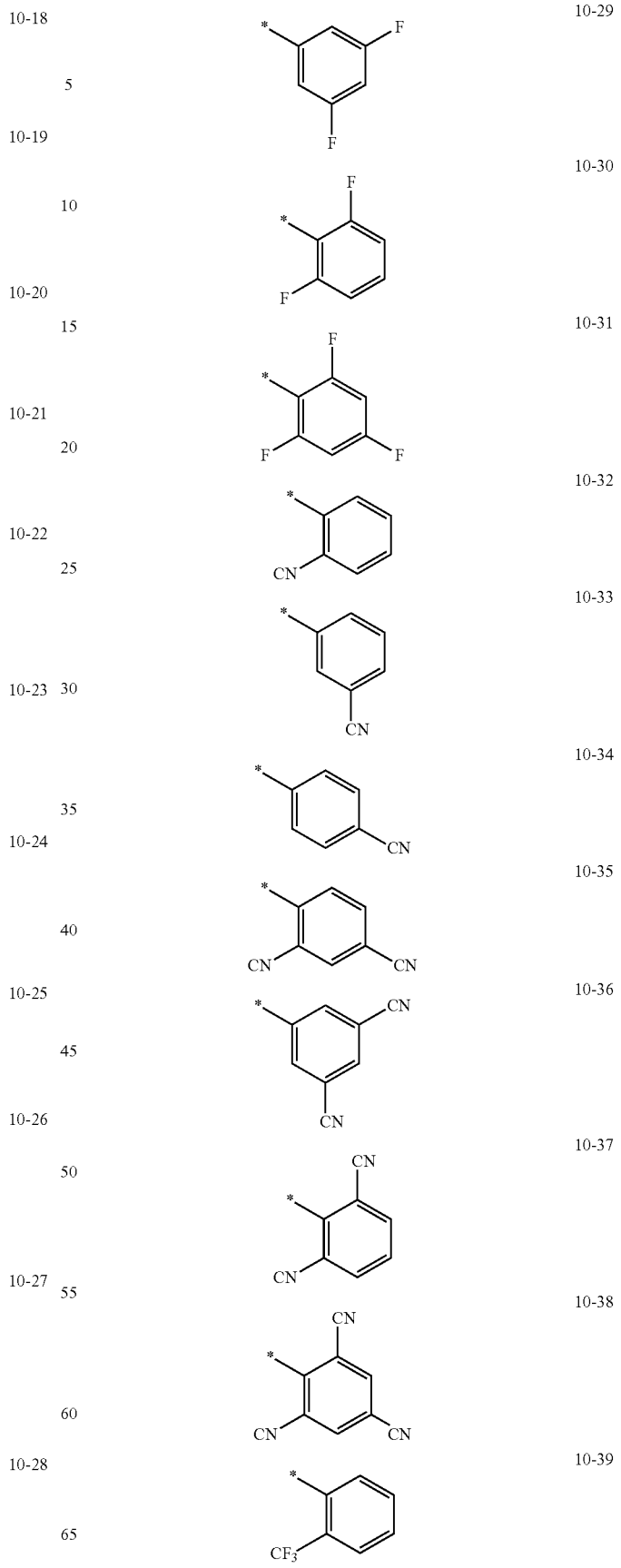

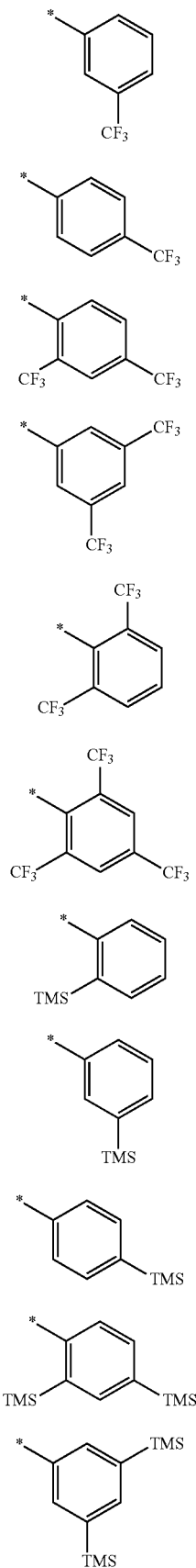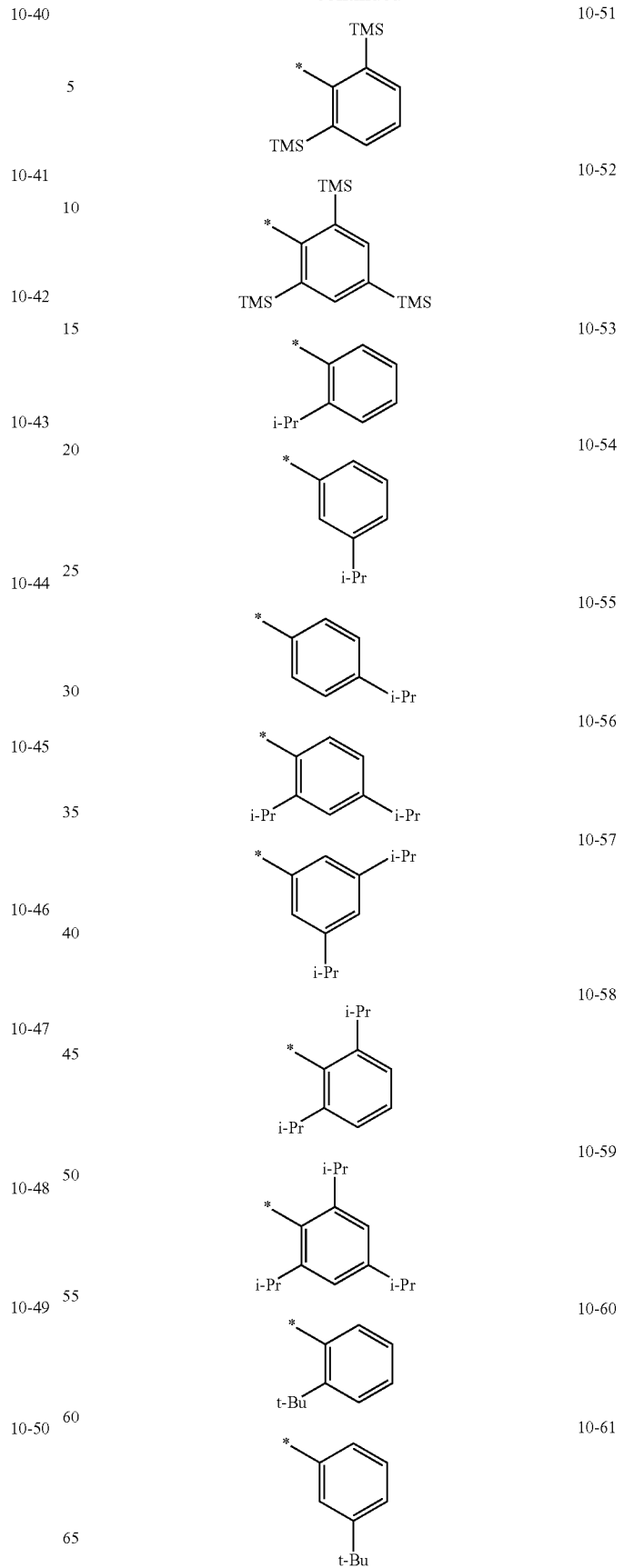

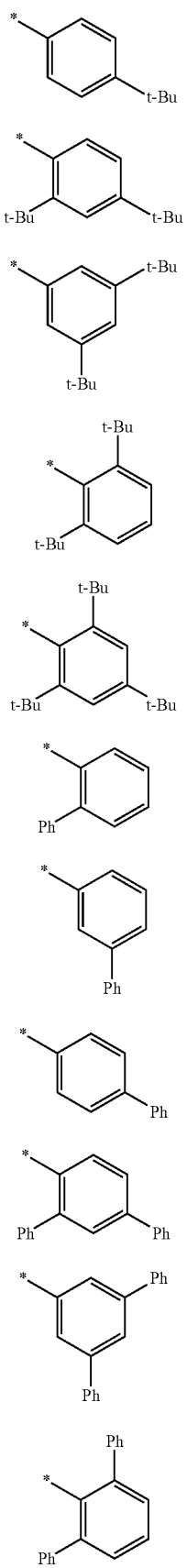

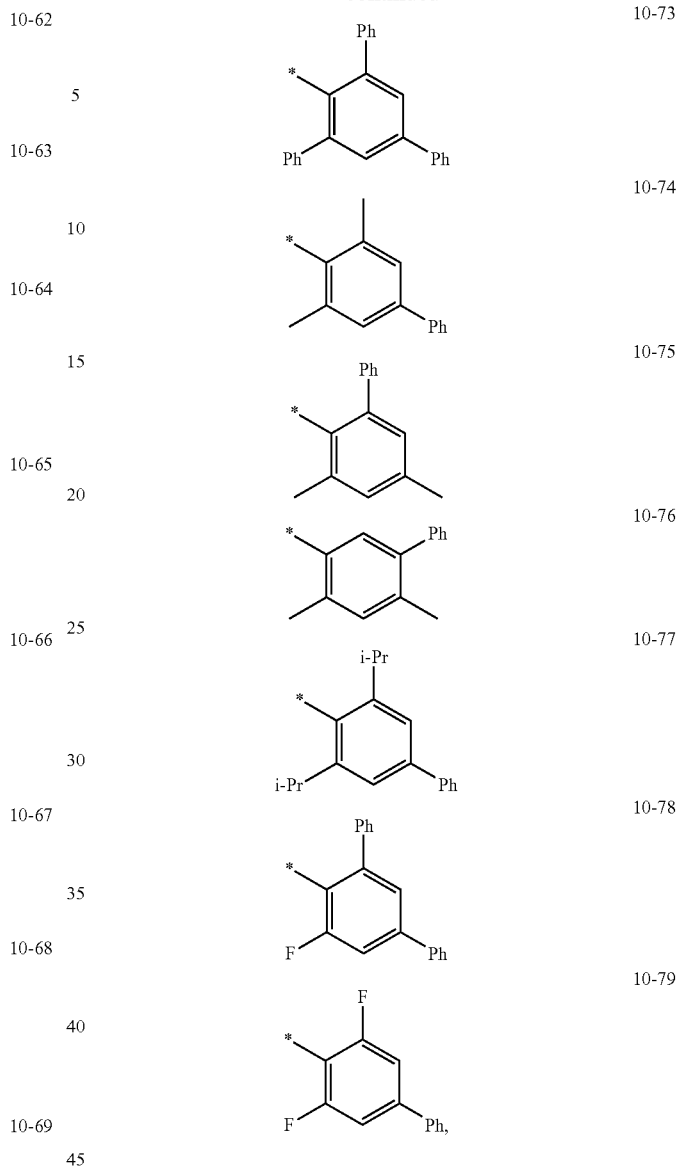

wherein, in Formulae 9-1 to 9-13 and 10-17 to 10-79,

"*" indicates a binding site to a neighboring atom,

"i-Pr" indicates an iso-propyl group, and "t-Bu" indicates a tert-butyl group,

"Ph" indicates a phenyl group, and

"TMS" indicates a trimethylsilyl group.

In Formula 1, at least one selected from $R_{16}$ to $R_{19}$ may be a cyano group.

For example, in Formula 1, $R_{17}$ may be a cyano group, but embodiments of the present disclosure are not limited thereto.

In Formula 1, two, three, or four selected of a plurality of $R_{11}$ to $R_{13}$ and $R_{16}$ to $R_{19}$ that are adjacent to each other may optionally be linked to form a tetradentate, hexadentate, or octadentate ligand, respectively.

For example, two of group $R_{11}$ in Formula 1 that are adjacent to each other may optionally be linked to form a tetradentate ligand, but embodiments of the present disclosure are not limited thereto.

In an embodiment, two of group $R_{12}$ in Formula 1 that are adjacent to each other may optionally be linked to form a tetradentate ligand, but embodiments of the present disclosure are not limited thereto.

In an embodiment, two of group $R_{19}$ in Formula 1 that are adjacent to each other may optionally be linked to form a tetradentate ligand, but embodiments of the present disclosure are not limited thereto.

For example, three of group $R_{11}$ in Formula 1 that are adjacent to each other may optionally be linked to form a hexadentate ligand, but embodiments of the present disclosure are not limited thereto.

In an embodiment, three of group $R_{12}$ in Formula 1 that are adjacent to each other may optionally be linked to form a hexadentate ligand, but embodiments of the present disclosure are not limited thereto.

In an embodiment, three of group $R_{19}$ in Formula 1 that are adjacent to each other may optionally be linked to form a hexadentate ligand, but embodiments of the present disclosure are not limited thereto.

In Formula 1, b13 indicates the number of $R_{13}$, and may be selected from 1, 2, 3, 4, 5, 6, and 7. When b13 is two or more, a plurality of group $R_{13}$ may be identical to or different from each other.

In Formula 1, n11 indicates the number of a ligand represented by

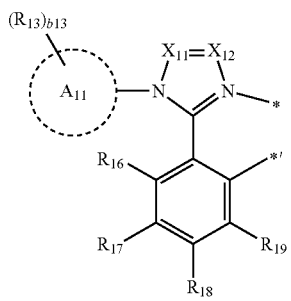

(wherein * and *' each indicate a binding site to M of Formula 1), and may be selected from 1, 2, 3, and 4. When n11 is two or more, ligands represented by

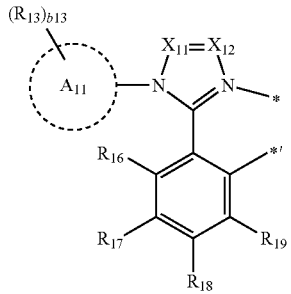

by in Formula 1 may be may be identical to or different from each other.

For example, n11 in Formula 1 may be selected from 1, 2, and 3, but embodiments of the present disclosure are not limited thereto.

In Formula 1, n12 indicates the number of $L_{12}$, and may be selected from 0, 1, 2, 3, and 4. When n12 is two or more, group $L_{12}$ in Formula 1 may be identical to or different from each other.

For example, n12 in Formula 1 may be selected from 0, 1, and 2, but embodiments of the present disclosure are not limited thereto.

In an embodiment, in Formula 1, $M_{11}$ may be Ir, n11 may be selected from 2 and 3, and n12 may be selected from 0, 1, and 2, but embodiments of the present disclosure are not limited thereto.

In Formula 1, $L_{12}$ may be selected from a monodentate ligand, a bidentate ligand, and a tridentate ligand.

For example, in Formula 1, $L_{12}$ may be a monodentate ligand, and may be selected from $I^-$, $Br^-$, $Cl^-$, sulfide, nitrate, azide, hydroxide, cyanate, isocyanate, thiocyanate, water, acetonitrile, pyridine, ammonia, carbon monoxide, $P(Ph)_3$, $P(Ph)_2CH_3$, $PPh(CH_3)_2$, and $P(CH_3)_3$. However, embodiments of the present disclosure are not limited thereto.

In an embodiment, $L_{12}$ in Formula 1 may be a bidentate ligand, and for example, may be selected from oxalate, acetylacetonate, picolinic acid, 1,2-bis(diphenylphosphino)ethane, 1,1-bis(diphenylphosphino)methane, glycinate, and ethylenediamine, but embodiments of the present disclosure are not limited thereto.

In an embodiment, $L_{12}$ in Formula 1 may be a ligand represented by one selected from Formulae 7-1 to 7-11, but embodiments of the present disclosure are not limited thereto:

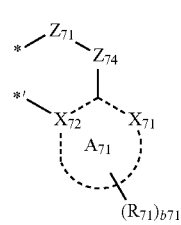

7-1

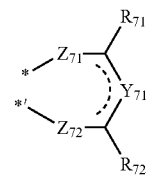

7-2

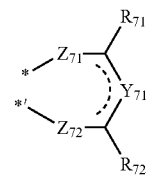

7-3

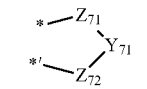

7-4

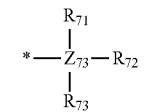

7-5

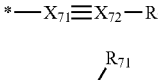

7-6

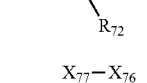

7-7

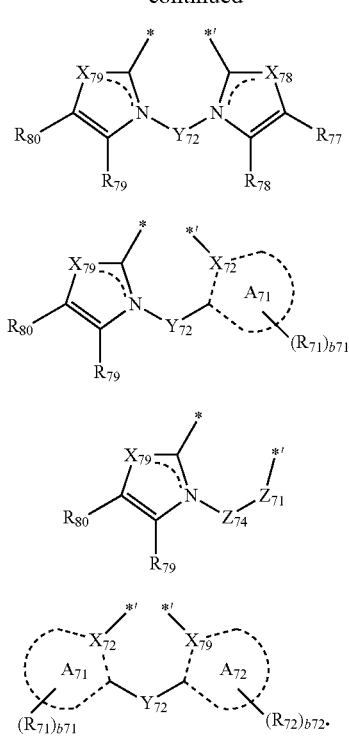

In Formulae 7-1 to 7-11, $A_{71}$ and $A_{72}$ may each be selected from a $C_5$-$C_{20}$ carbocyclic group and a $C_1$-$C_{20}$ heterocyclic group, $X_{71}$, $X_{72}$, $X_{78}$, and $X_{79}$ may each independently be selected from C and N, $X_{73}$ may be N or $C(Q_{73})$, $X_{24}$ may be N or $C(Q_{74})$, $X_{75}$ may be N or $C(Q_{75})$, $X_{76}$ may be N or $C(Q_{76})$, $X_{27}$ may be N or $C(Q_{77})$, $X_{78}$ may be O, S, or $N(Q_{78})$, $X_{29}$ may be O, S, or $N(Q_{79})$, $Y_{71}$ and $Y_{72}$ may each be selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_{71}$ and $Z_{72}$ may each be selected from N, O, $N(R_{75})$, $P(R_{75})(R_{76})$, and $As(R_{75})(R_{76})$, $Z_{73}$ may be selected from P and As, $Z_{74}$ may be selected from CO and $CH_2$, $R_{71}$ to $R_{80}$ and $Q_{73}$ to $Q_{79}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{71}$ and $R_{72}$ may optionally be linked to form a ring, $R_{77}$ and $R_{78}$ may optionally be linked to form a ring, $R_{78}$ and $R_{79}$ may optionally be linked to form a ring, $R_{79}$ and $R_{80}$ may optionally be linked to form a ring, b71 and b72 may each independently be selected from 1, 2, and 3, and

* and *' each indicate a binding site to a neighboring atom.

For example, $A_{71}$ and $A_{72}$ in Formula 7-1 may each be selected from a benzene group, a naphthalene group, an imidazole group, a benzimidazole group, a pyridine group, a pyrimidine group, a triazine group, a quinoline group, and an isoquinoline group, but embodiments of the present disclosure are not limited thereto.

For example, $X_{72}$ and $X_{79}$ in Formula 7-1 may each be N, but embodiments of the present disclosure are not limited thereto.

For example, un Formula 7-7, $X_{73}$ may be $C(Q_{73})$, $X_{74}$ may be $C(Q_{74})$, $X_{75}$ may be $C(Q_{76})$, $X_{76}$ may be $C(Q_{76})$, and $X_{77}$ may be $C(Q_{77})$, but embodiments of the present disclosure are not limited thereto.

For example, in Formula 7-8, $X_{78}$ may be $N(Q_{78})$, and $X_{79}$ may be $N(Q_{79})$, but embodiments of the present disclosure are not limited thereto.

For example, in Formulae 7-2, 7-3, and 7-8, $Y_{71}$ and $Y_{72}$ may each be selected from a substituted or unsubstituted methylene group and a substituted or unsubstituted phenylene group, but embodiments of the present disclosure are not limited thereto.

For example, in Formulae 7-1 and 7-2, $Z_{71}$ and $Z_{72}$ may each be O, but embodiments of the present disclosure are not limited thereto.

For example, in Formula 7-4, $Z_{73}$ may be P, but embodiments of the present disclosure are not limited thereto.

For example, in Formulae 7-1 to 7-8, $R_{71}$ to $R_{80}$ and $Q_{73}$ to $Q_{79}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a diabenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyrindinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, a oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, but embodiments of the present disclosure are not limited thereto.

In an embodiment, $L_{12}$ in Formula 1 may be a ligand represented by one selected from Formulae 5-1 to 5-116 and 8-1 to 8-23, but embodiments of the present disclosure are not limited thereto:

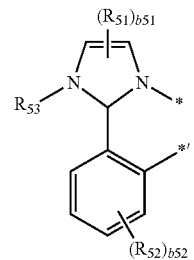

5-1

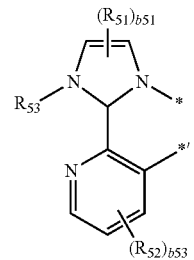

5-2

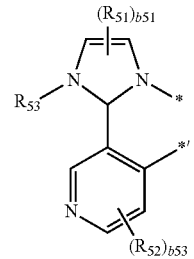

5-3

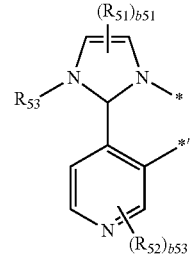

5-4

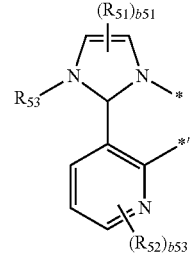

5-5

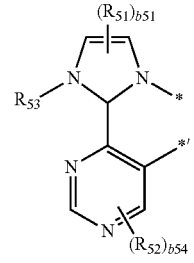

5-6

-continued
5-7
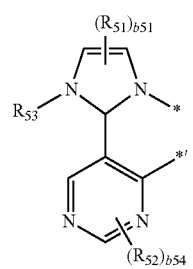
5-8
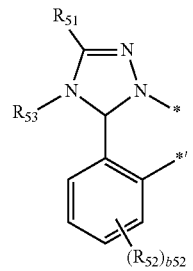
5-9
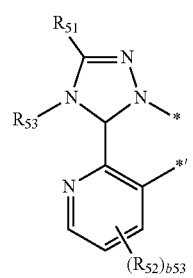
5-10
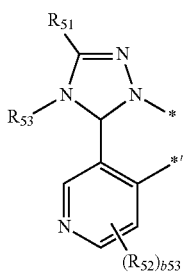
5-11
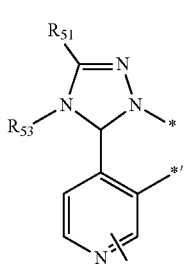
5-12
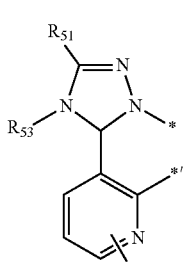
-continued
5-13
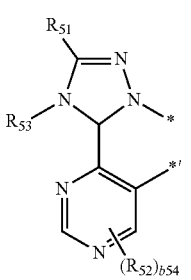
5-14
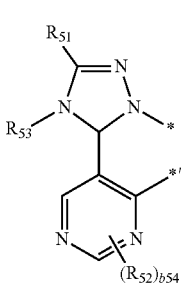
5-15
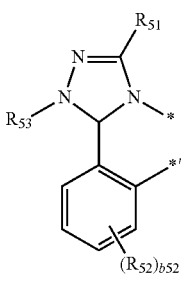
5-16
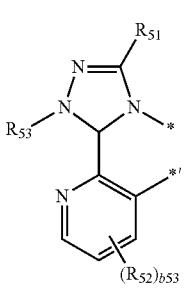
5-17
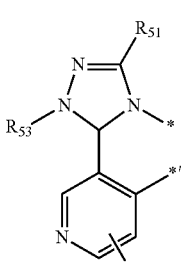

-continued
5-18
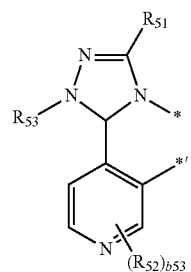
5-19
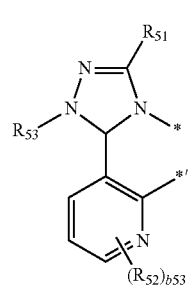
5-20
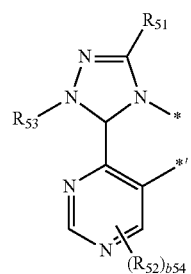
5-21
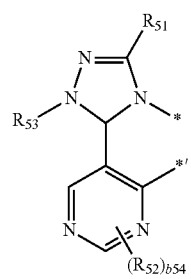
5-22
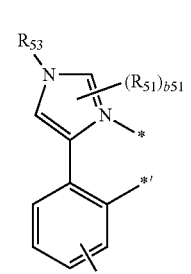
-continued
5-23
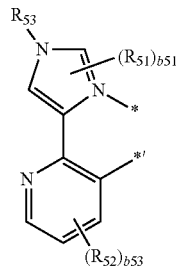
5-24
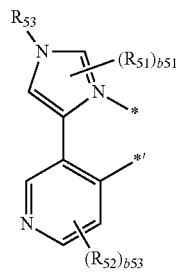
5-25
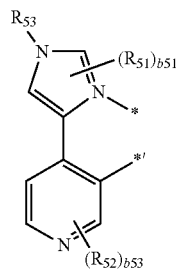
5-26
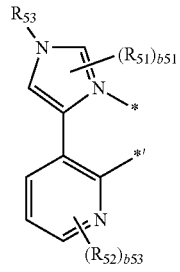
5-27
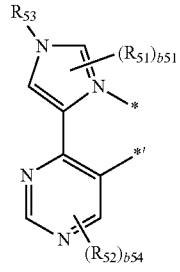
5-28
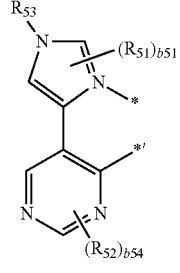

| | | |
|---|---|---|
| 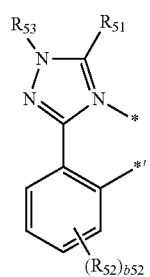 5-29 | | 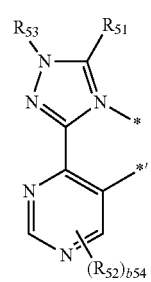 5-34 |
| 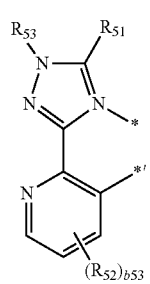 5-30 | | 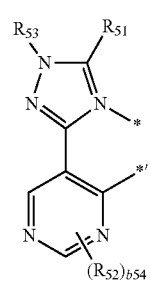 5-35 |
| 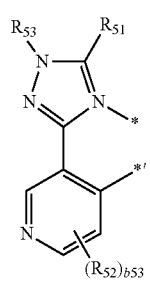 5-31 | | 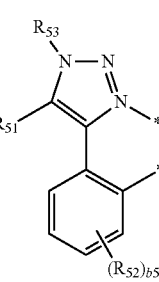 5-36 |
| 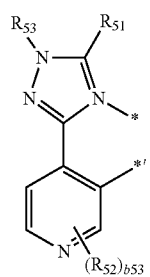 5-32 | | 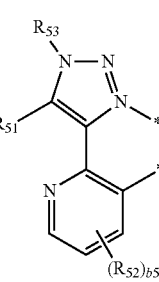 5-37 |
| 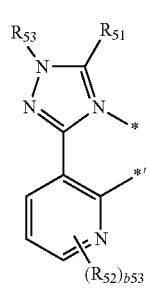 5-33 | | 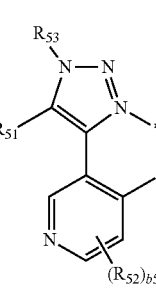 5-38 |

-continued
5-39
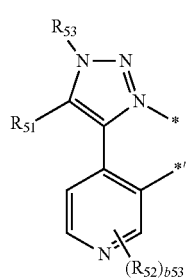
5-40
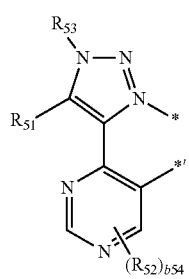
5-41
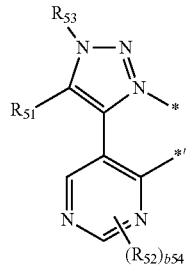
5-42
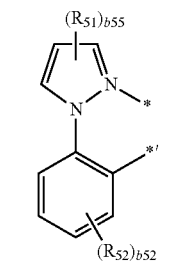
5-43
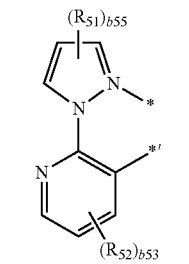
5-44
-continued
5-45
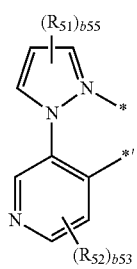
5-46
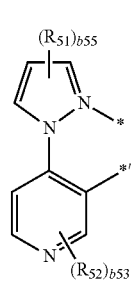
5-47
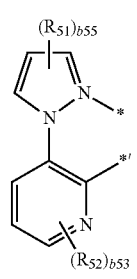
5-48
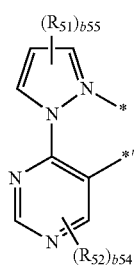
5-49
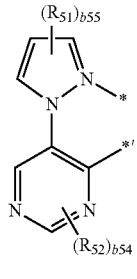
5-50
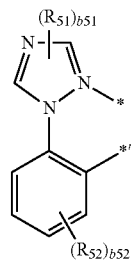

5-51 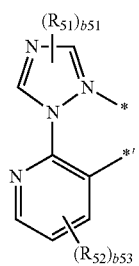
5-52 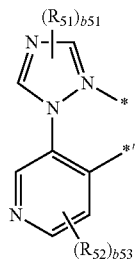
5-53 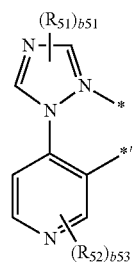
5-54 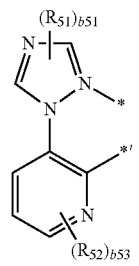
5-55 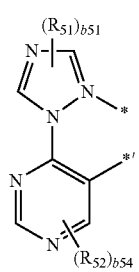
5-56 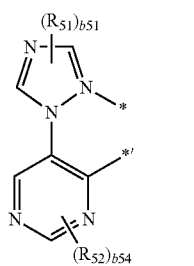
5-57 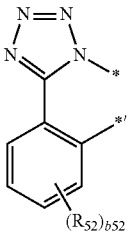
5-58 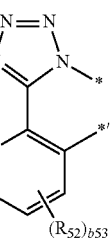
5-59 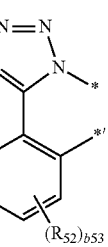
5-60 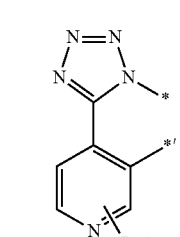
5-61 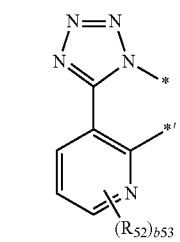
5-62 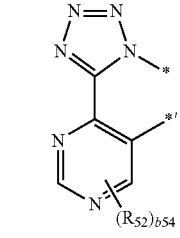

-continued
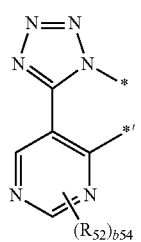
5-63
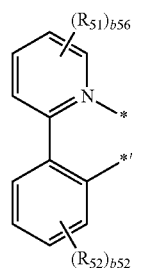
5-64
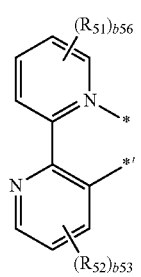
5-65
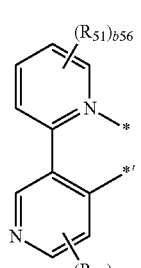
5-66
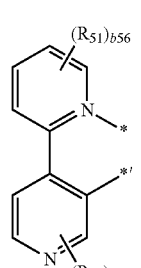
5-67
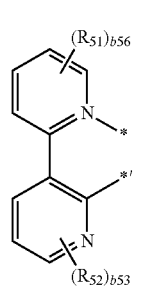
5-68
-continued
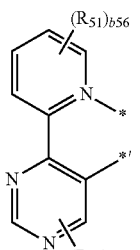
5-69
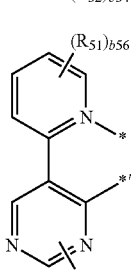
5-70
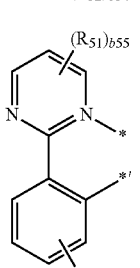
5-71
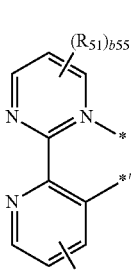
5-72
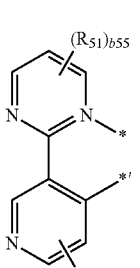
5-73
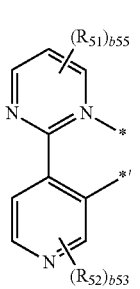
5-74

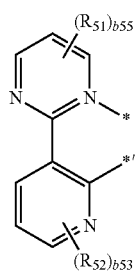 5-75
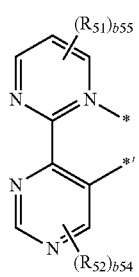 5-76
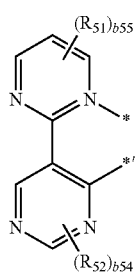 5-77
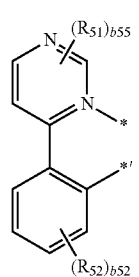 5-78
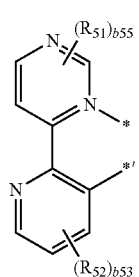 5-79
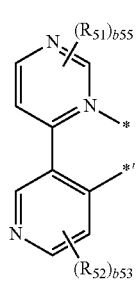 5-80
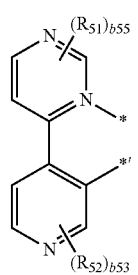 5-81
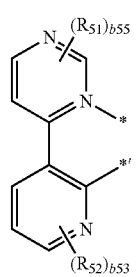 5-82
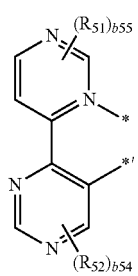 5-83
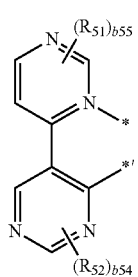 5-84
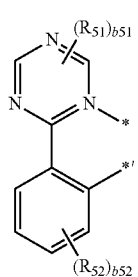 5-85
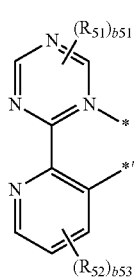 5-86

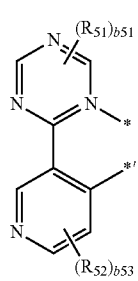
5-87
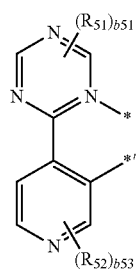
5-88
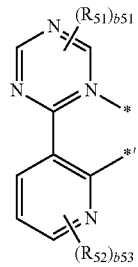
5-89
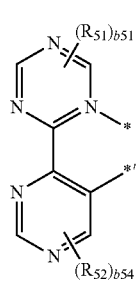
5-90
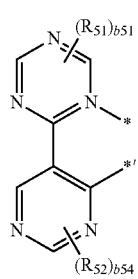
5-91
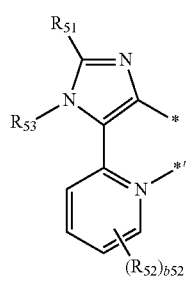
5-92
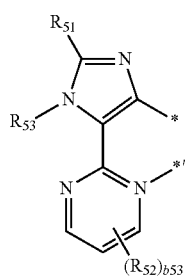
5-93
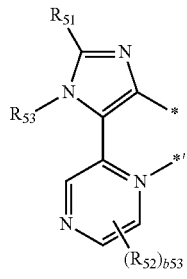
5-94
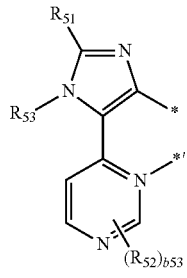
5-95
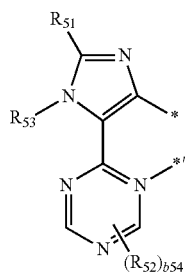
5-96
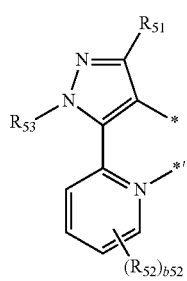
5-97

67
-continued
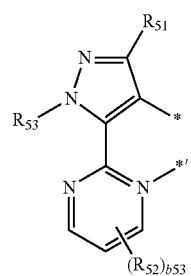
5-98
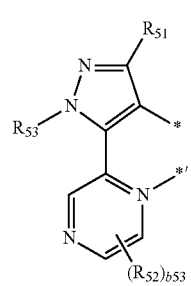
5-99
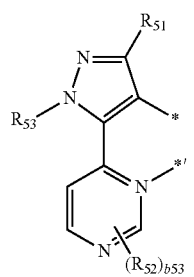
5-100
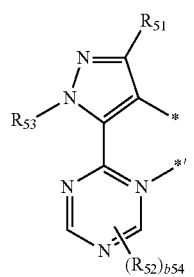
5-101
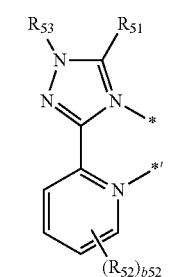
5-102
68
-continued
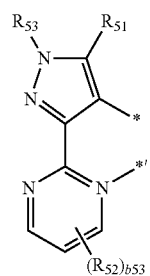
5-103
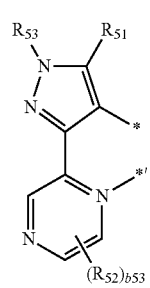
5-104
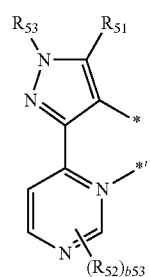
5-105
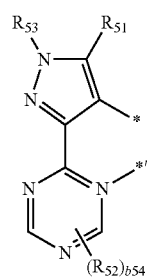
5-106
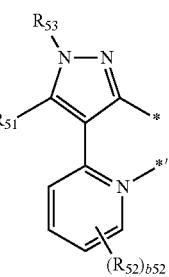
5-107

-continued 5-108 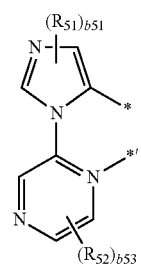

5-109 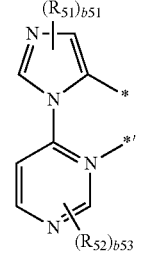

5-110 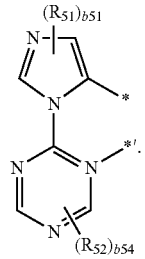

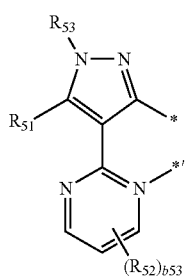

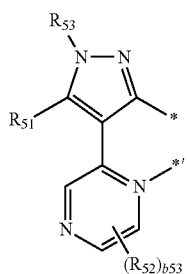

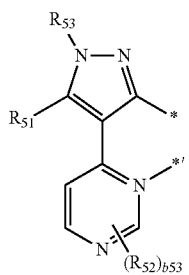

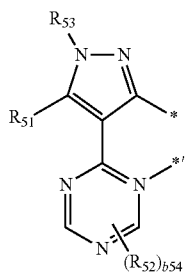

5-111

5-112 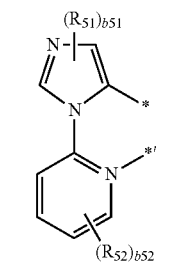

5-113 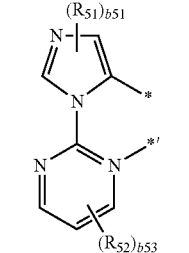

5-114

5-115

5-116

In Formulae 5-1 to 5-116 and 8-1 to 8-23, $R_{51}$ to $R_{53}$ may each independently be selected from:

hydrogen, —F, a cyano group, a nitro group, a methyl group, an ethyl group, a propyl group, an n-butyl group, an iso-butyl group, a sec-butyl group, a tert-butyl group, an n-pentyl group, an iso-pentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decanyl group, an isodecanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group; and a methyl group, an ethyl group, a propyl group, an n-butyl group, an iso-butyl group, a sec-butyl group, a tert-butyl group, an n-pentyl group, an iso-pentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decanyl group, an isodecanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group, each substituted with at least one selected from —F, a cyano group, and a nitro group, b51 and b54 may each be selected from 1 and 2,
b53 and b55 may each be selected from 1, 2, and 3,
b52 may be selected from 1, 2, 3, and 4,
"Ph" indicates a phenyl group,
"Ph-d5" indicates a phenyl group in which all hydrogens are substituted with deuterium, and
* and *' each indicate a binding site to a neighboring atom.

In an embodiment, the organometallic compound represented by Formula 1 may be represented by one selected from Formulae 1-1 to 1-5, but embodiments of the present disclosure are not limited thereto:

1-1
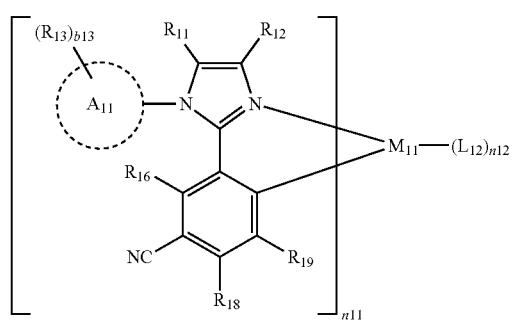

1-2
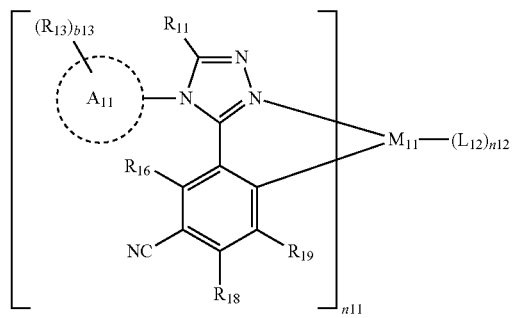

1-3
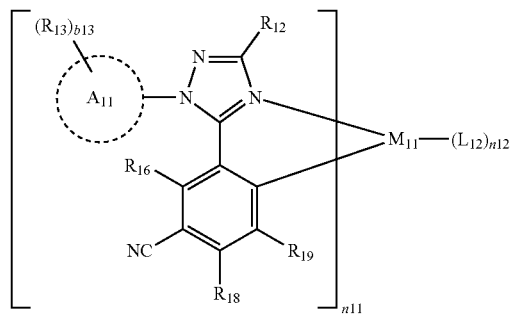

1-4
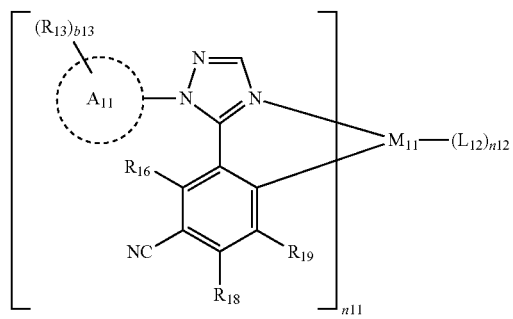

1-5
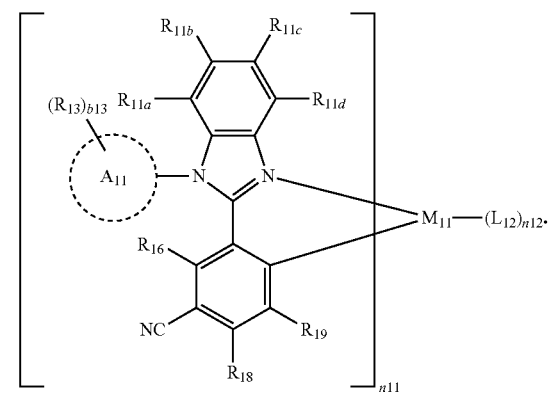

In Formulae 1-1 to 1-5, $M_{11}$, $A_{11}$, $R_{11}$ to $R_{13}$, $R_{16}$ to $R_{19}$, b13, n11, n12, and $L_{12}$ may each independently be the same as those described in Formula 1, and $R_{11a}$ to $R_{11d}$ may each independently be the same as $R_{11}$ in Formula 1.

The organometallic compound represented by Formula 1 may be selected from Compounds 1 to 24, but embodiments of the present disclosure are not limited thereto:

1
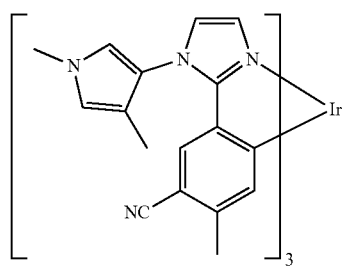

2
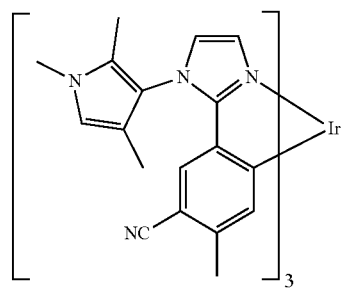

3
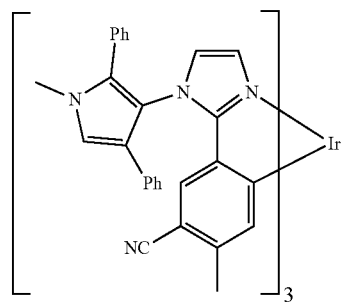

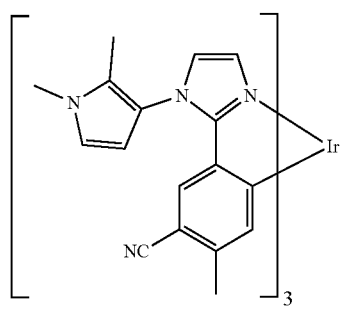
4
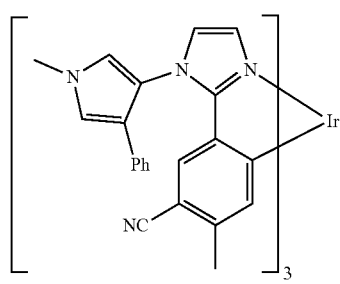
5
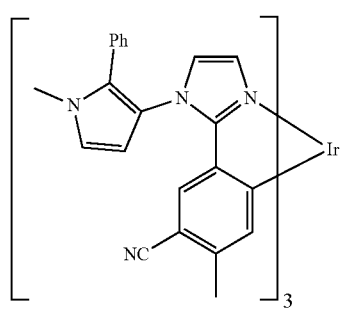
6
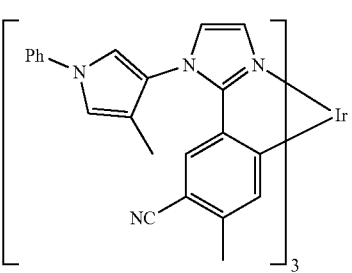
7
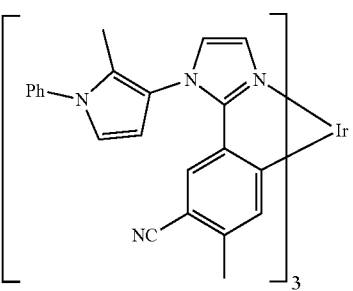
8
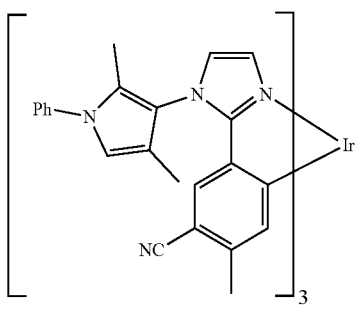
9
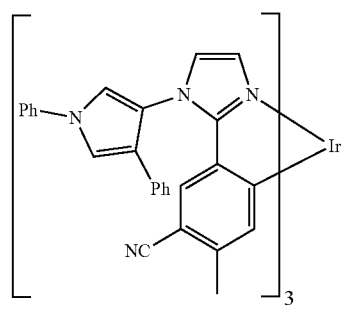
10
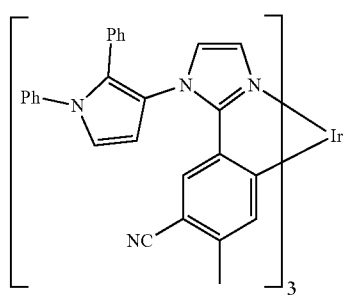
11
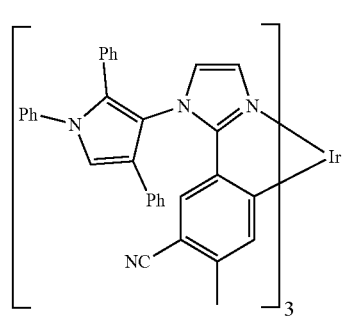
12
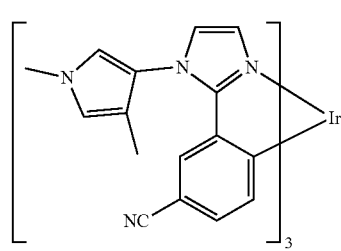
13

14
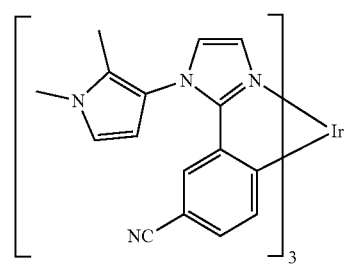

15
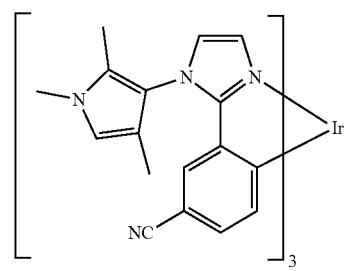

16
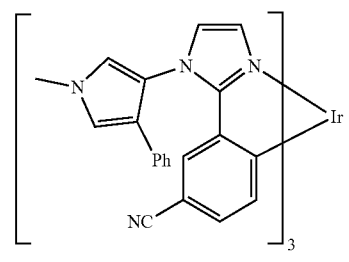

17
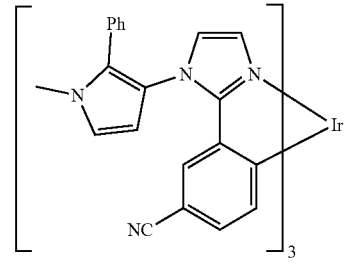

18
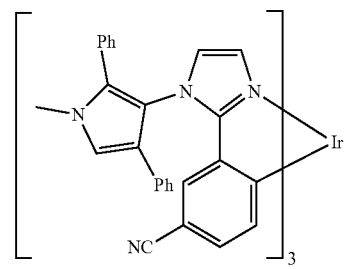

19
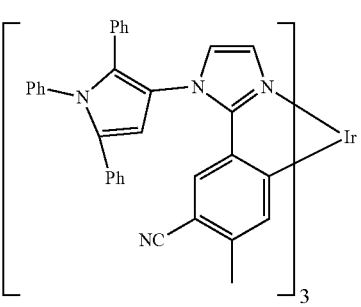

20
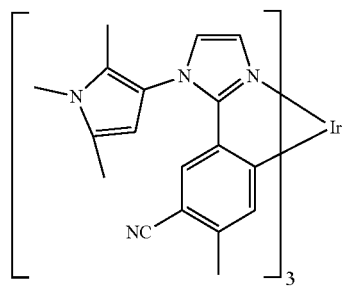

21
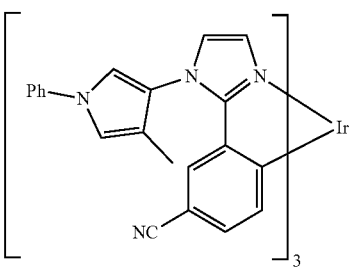

22
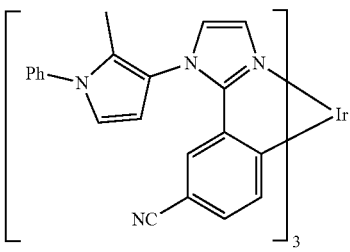

23
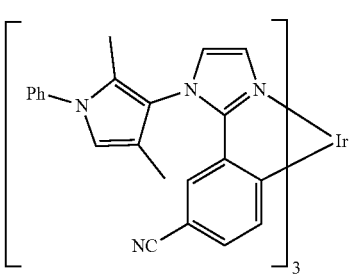

24
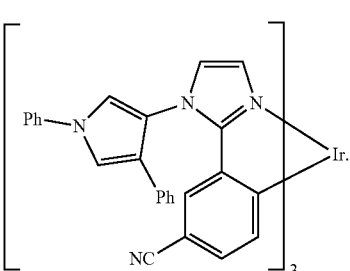

The organometallic compound represented by Formula 1 may have a maximum emission wavelength (experimental value) of about 440 nanometers (nm) or more and less than about 500 nm, for example, in a range of about 440 nm to about 495 nm and about 440 nm to about 460 nm. While not wishing to be bound by theory, it is understood that when the maximum emission wavelength is within a range of about 440 nm to about 465 nm, an organic light-emitting device having an emission color of deep blue may be provided.

The organometallic compound represented by Formula 1 may essentially include $A_{11}$, which is a 5-membered ring, and in this regard, the organometallic compound represented by Formula 1 may have a shallow lowest unoccupied molecular orbital (LUMO) energy level. Therefore, the organometallic compound represented by Formula 1 may have a high triplet energy level due to a wide band gap, so that an organic light-emitting device having an emission color of deep blue may be provided.

Furthermore, the organometallic compound represented by Formula 1 may include "a cyano group" at "a specific position", so that an organic light-emitting device having an emission color of deep blue may be provided:

Formula 1'

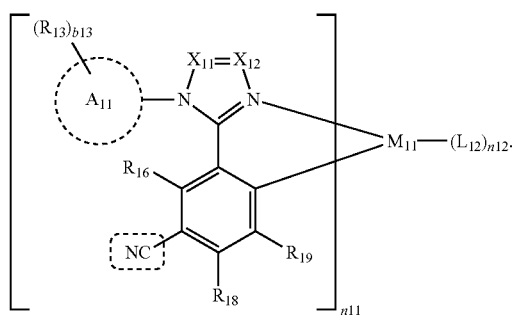

As shown in Formula 1', a cyano group is located at a para-position with respect to an Ir—C bonding position, so that the organometallic compound represented by Formula 1 may have a deep highest occupied molecular orbital (HOMO) energy level. Therefore, the organometallic compound represented by Formula 1 may have a high triplet energy level due to a wide band gap, so that an organic light-emitting device having an emission color of deep blue may be provided.

Therefore, the organometallic compound represented by Formula 1 may have a triplet energy level suitable for blue light, and may have a relatively short radiative decay time. Accordingly, the organometallic compound represented by Formula 1 may serve as a blue dopant having a high absolute quantum yield.

Properties including a HOMO energy level, a LUMO energy level, a triplet ($T_1$) energy level, and emission lifespan of some compounds among the organometallic compounds represented by Formula 1, and Compounds A and B were predicted using the Gaussian 09 program with molecular structure optimization according to a density functional theory based on B3LYP (DFT: structure optimization at B3LYP, 6-31G(d,p) level), and the results are shown in Table 1.

TABLE 1

| Compound No. | HOMO (eV) | LUMO (eV) | $T_1$ (eV) | Emission lifespan (μs) |
|---|---|---|---|---|
| 2 | −4.90 | −0.76 | 2.74 | 2.06 |
| 12 | −4.92 | −0.85 | 2.71 | 2.34 |
| 19 | −4.94 | −0.89 | 2.73 | 2.16 |
| 20 | −4.86 | 0.72 | 2.75 | 2.23 |

TABLE 1-continued

| Compound No. | HOMO (eV) | LUMO (eV) | $T_1$ (eV) | Emission lifespan (μs) |
|---|---|---|---|---|
| A | −4.37 | −0.39 | 2.64 | 2.57 |
| B | −5.28 | −1.17 | 2.71 | 2.49 |

From Table 1, it is confirmed that the organometallic compound represented by Formula 1 has such electric characteristics that are suitable for use in an electric device, for example, for use as a dopant for an organic light-emitting device.

Synthesis methods of the organometallic compound represented by Formula 1 may be understood by one of ordinary skill in the art by referring to Synthesis Examples provided below.

The organometallic compound represented by Formula 1 may be suitable for use in an organic layer of an organic light-emitting device, for example, for use as a dopant in an emission layer of the organic layer. Thus, another aspect of the present description provides an organic light-emitting device that includes:

a first electrode, a second electrode, and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). Such a dopant may emit blue light.

The expression "(an organic layer) includes at least one organometallic compound" as used herein may include an embodiment in which "(an organic layer) includes identical compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 may all be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes at least one selected from a hole injection layer, a hole transport layer, and an electron blocking layer, and wherein the electron transport region includes at least one selected from a hole blocking layer, an electron transport layer, and an electron injection layer.

The term "organic layer" as used herein refers to a single layer and/or a plurality of layers between the first electrode and the second electrode of the organic light-emitting device. The "organic layer" may include, in addition to an organic compound, an organometallic compound including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary depending on the material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0 Angstroms per second (Å/sec) to about 100 Å/sec. However, the deposition conditions are not limited thereto.

When the hole injection layer is formed using spin coating, coating conditions may vary depending on the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

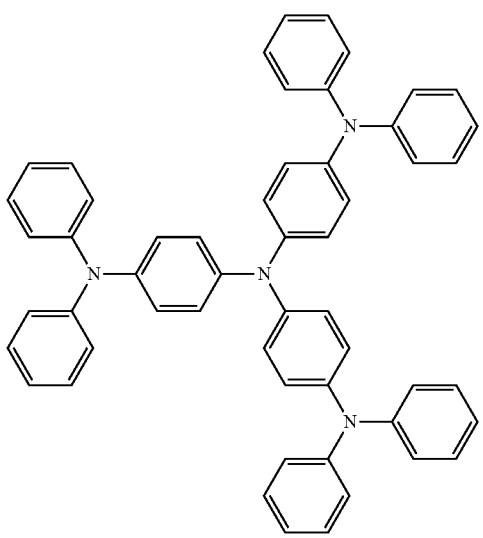

TDATA

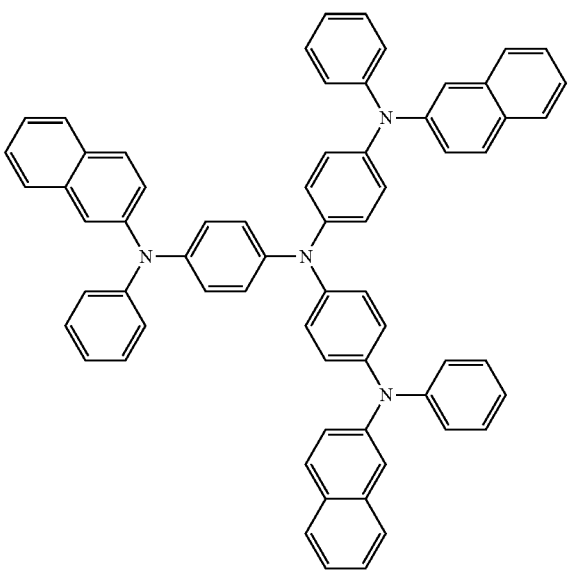

2-TNATA

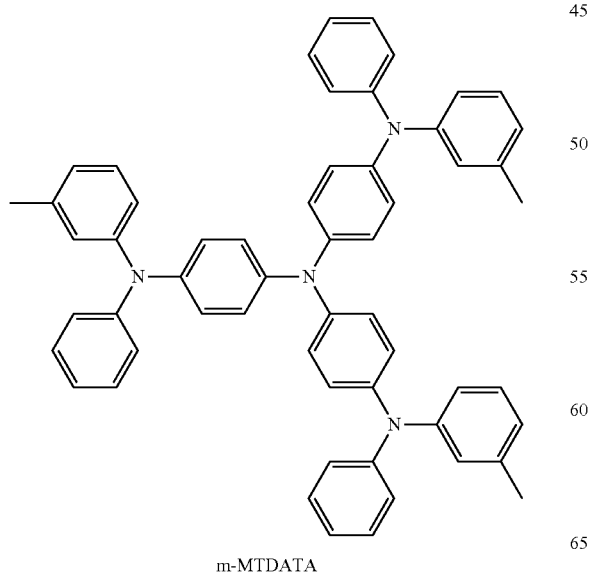

m-MTDATA

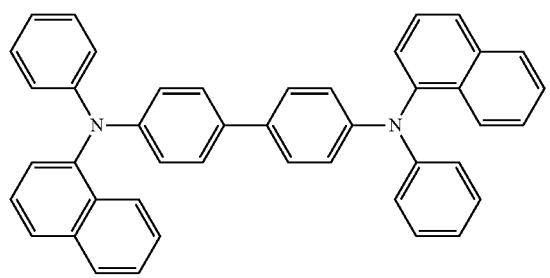

NPB

-continued

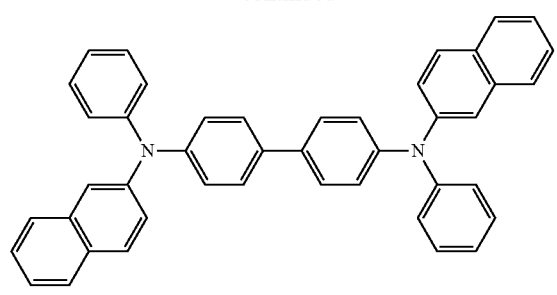

β-NPB

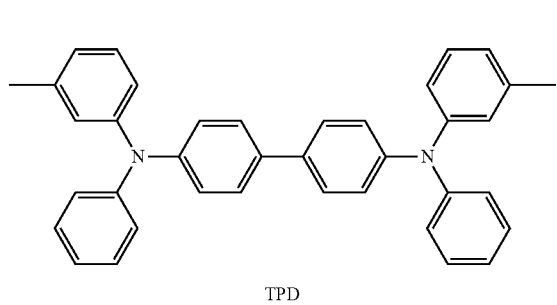

TPD

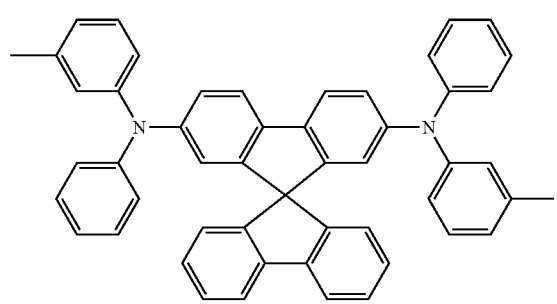

Spiro-TPD

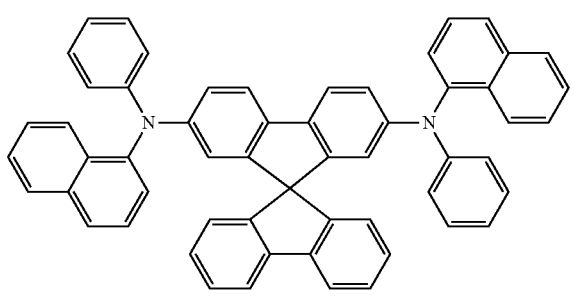

Spiro-NPB

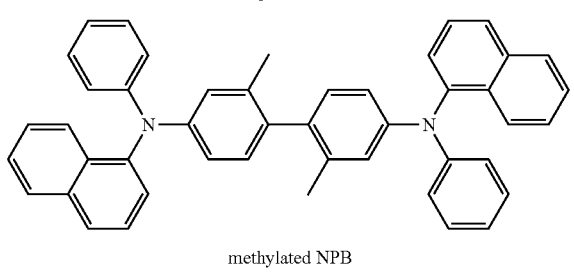

methylated NPB

-continued

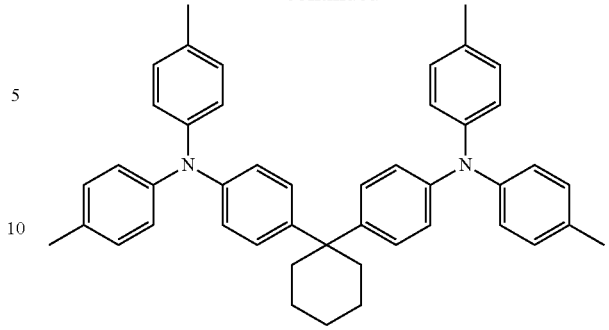

TAPC

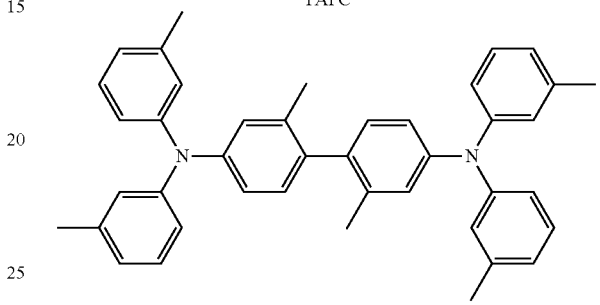

HMTPD

Formula 201

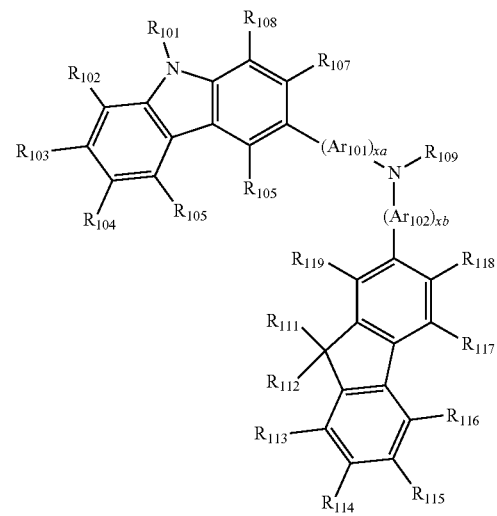

Formula 202

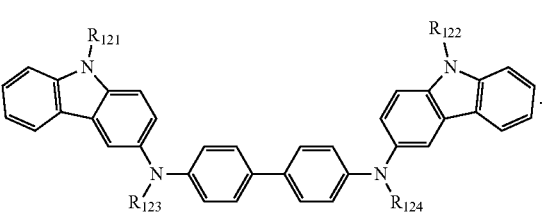

In Formula 201, $Ar_{101}$ and $Ar_{102}$ may each be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each be an integer from 0 to 5, or may each be 0, 1 or 2. For example, xa may be 1, and xb may be 0, but xa and xb are not limited thereto.

In Formulae 201 and 202, $R_{101}$ to $R_{108}$, $R_{111}$ to $R_{119}$, and $R_{121}$ to $R_{124}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, etc), and a $C_1$-$C_{10}$ alkoxy group (for example, a methoxy group, an ethoxy group, a propoxy group, a butoxy group, a pentoxy group, etc.);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

In Formula 201, $R_{109}$ may be selected from:
a phenyl group, a naphthyl group, an anthracenyl group, and a pyridinyl group; and
a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

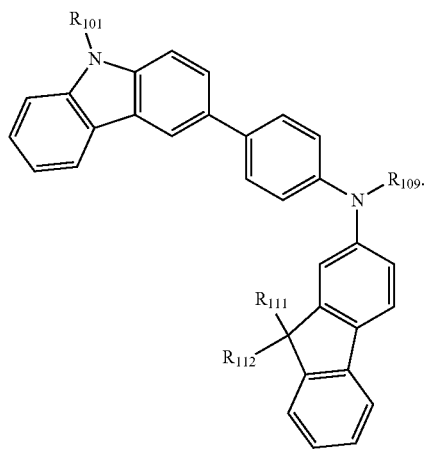

In Formula 201A, $R_{101}$, $R_{111}$, $R_{112}$, and $R_{109}$ may each independently be the same as those described above.

For example, the compound represented by Formula 201 and the compound represented by Formula 202 may each include Compounds HT1 to HT20, but embodiments of the present disclosure are not limited thereto:

HT1

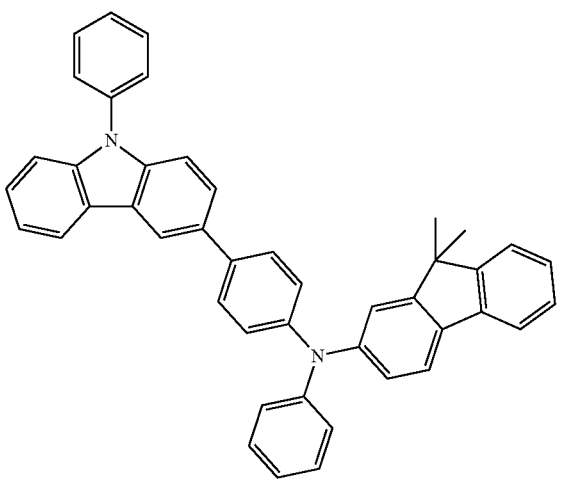

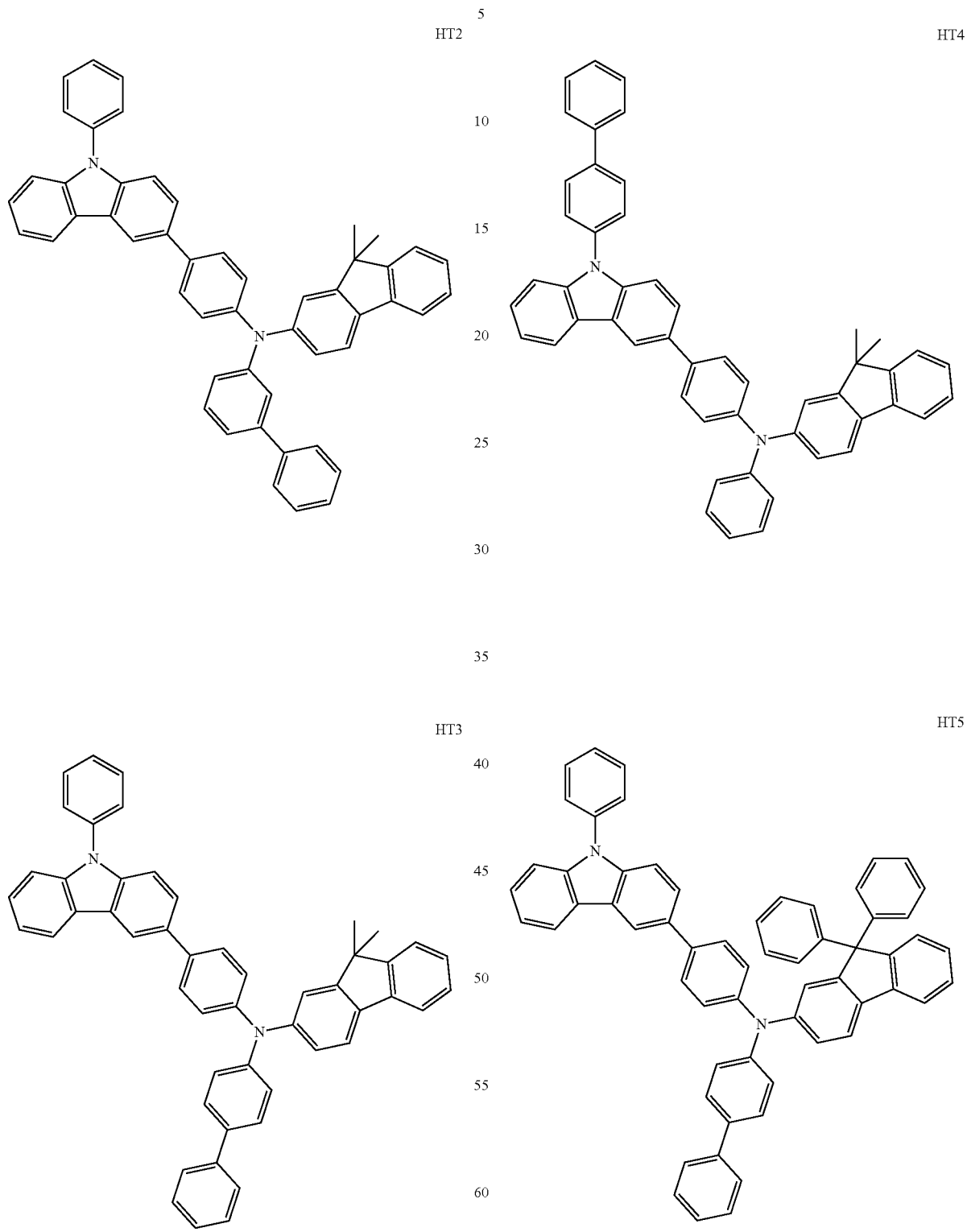

HT6
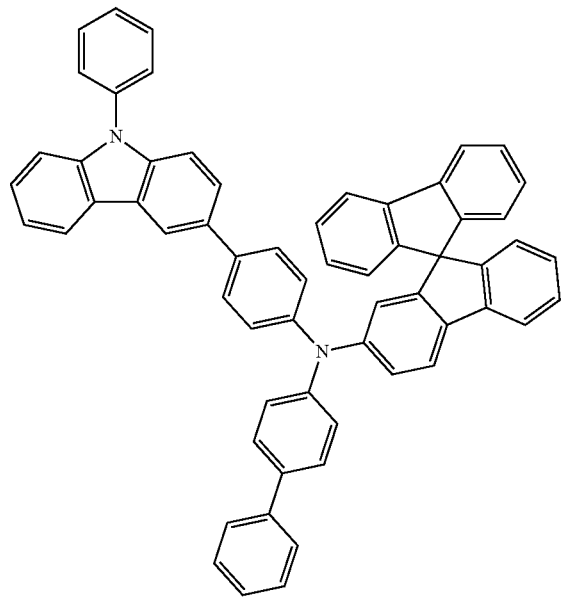
HT7
HT8
HT9
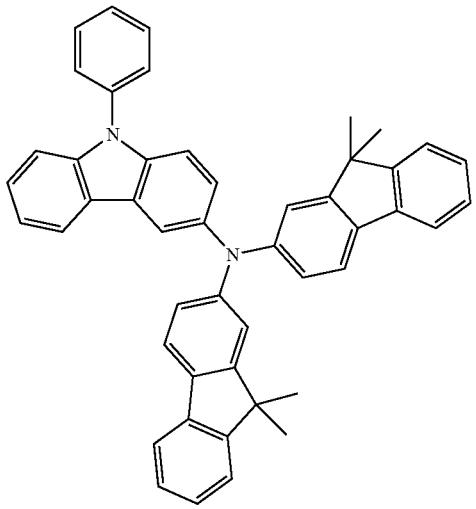
HT10
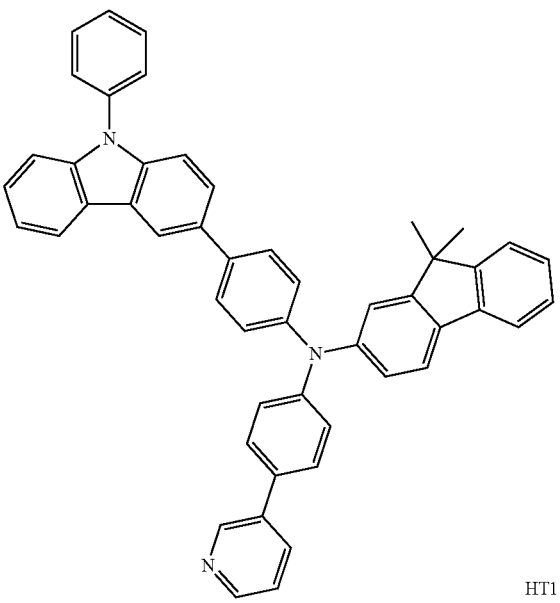
HT11
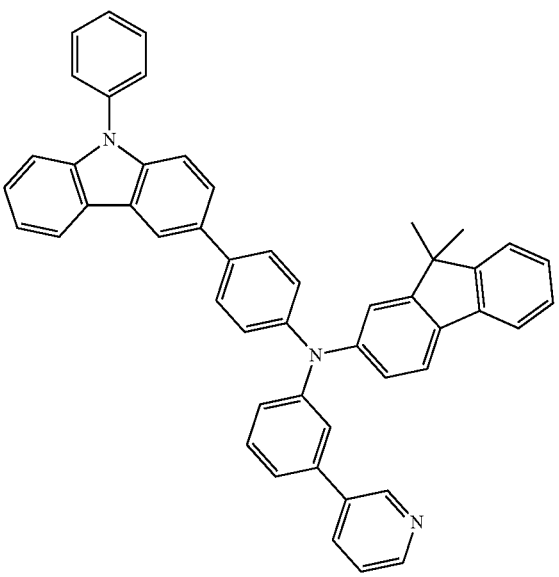

HT12
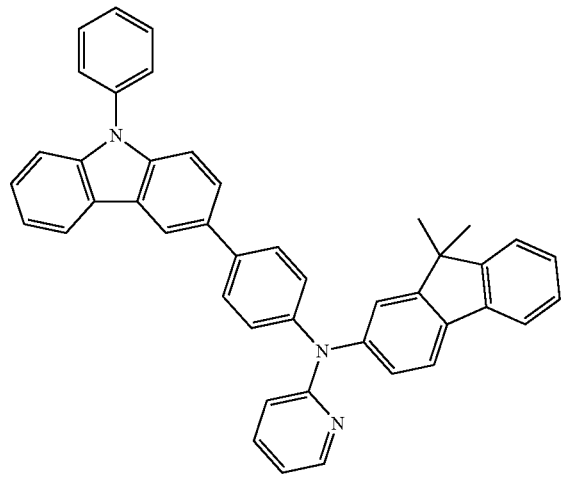
HT13
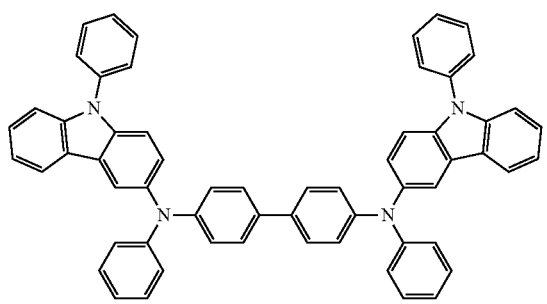
HT14
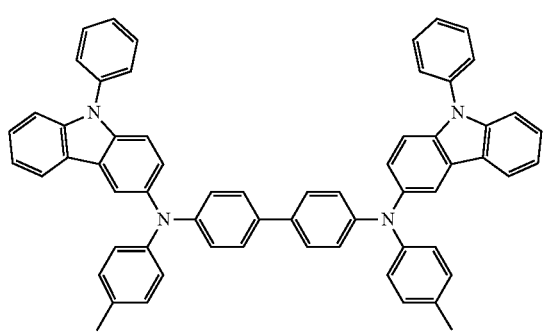
HT15
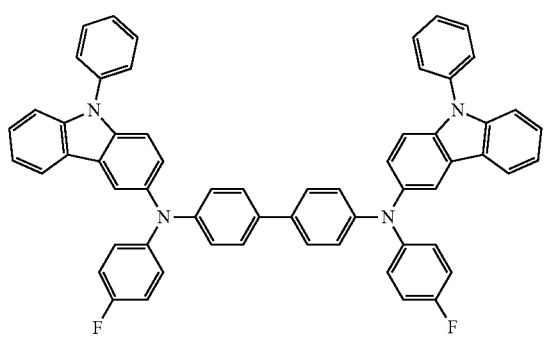
HT16
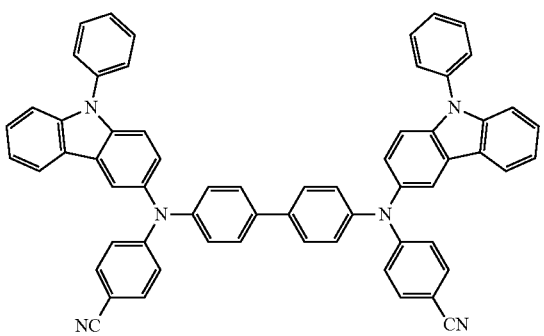
HT17
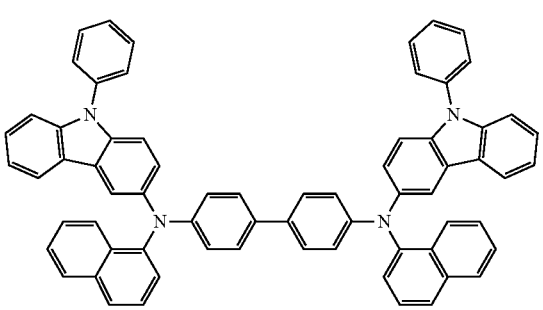
HT18
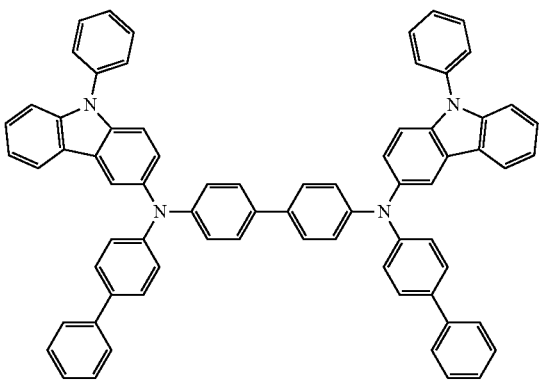
HT19
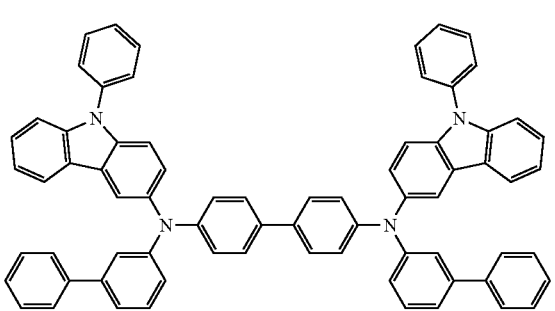

HT20

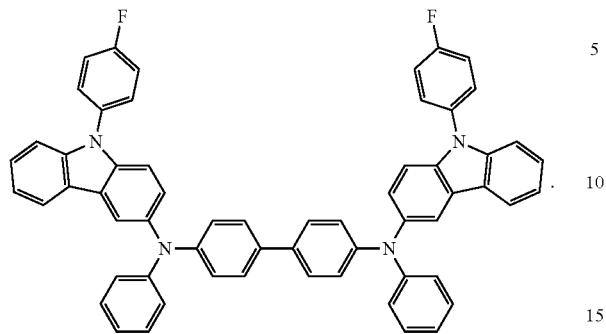

A thickness of the hole transport region may be in a range of about 100 Å to about 10,000 Å, for example, about 100 Å to about 10,000 Å. When the hole transport region includes both a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2, but are not limited thereto:

HT-D1

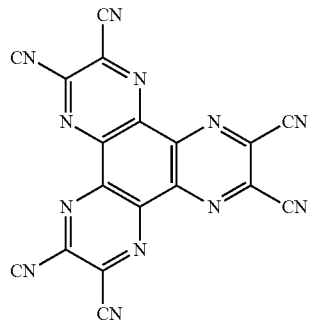

F4-TCNQ

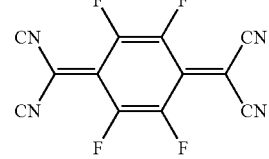

HT-D2

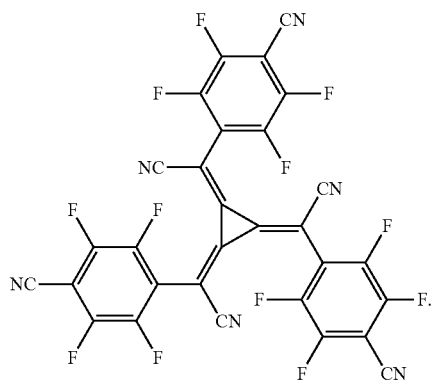

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H52:

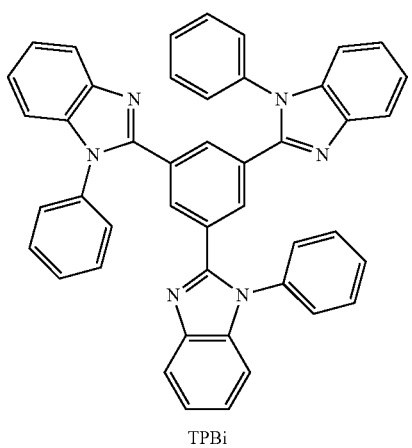
TPBi
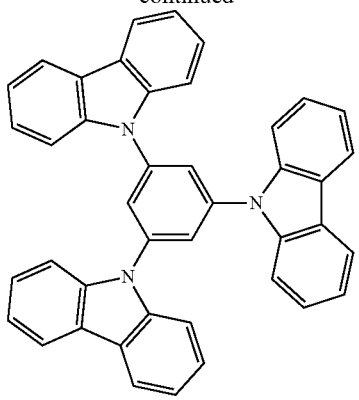
TCP
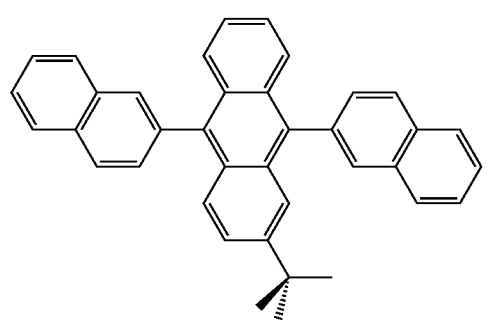
TBADN
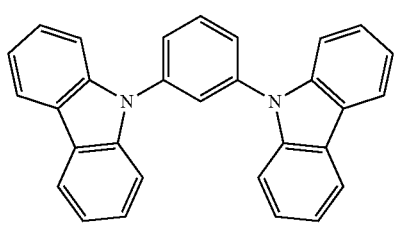
mCP
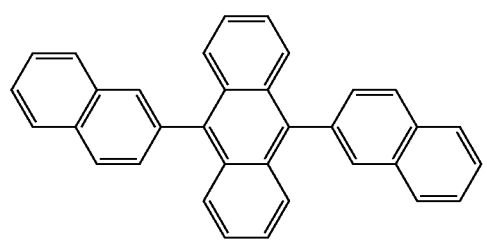
ADN
Compound H50
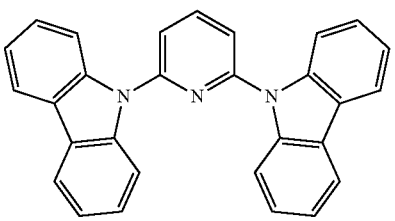
Compound H51
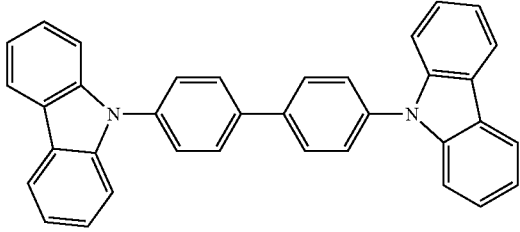
CBP
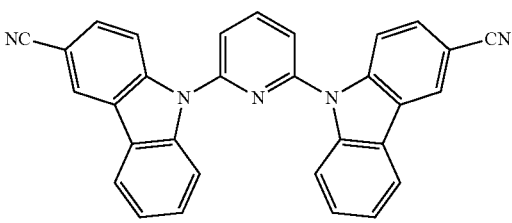
H52
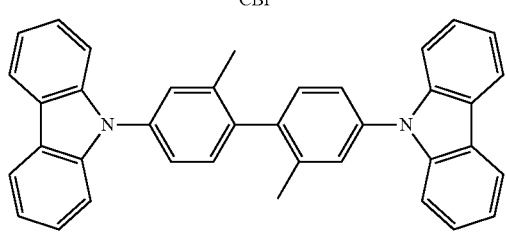
CDBP
In one or more embodiments, the host may further include a compound represented by Formula 301:

Formula 301

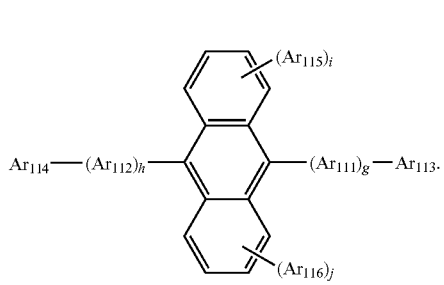

In Formula 301, $Ar_{111}$ and $Ar_{112}$ may each be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

In Formula 301, g, h, i, and j may each independently be an integer from 0 to 4, and may be, for example, 0, 1, or 2.

In Formula 301, $Ar_{113}$ to $Ar_{116}$ may each independently be selected from:

a $C_1$-$C_{10}$ alkyl group, substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

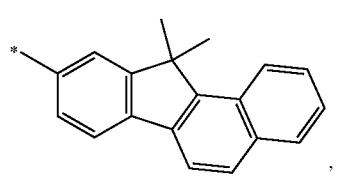 [SMILES: Cc1ccc2c(c1)C(C)(C)c1c-2ccc2ccccc12]

but embodiments of the present disclosure are not limited thereto.

In one or more embodiments, the host may include a compound represented by Formula 302:

Formula 302

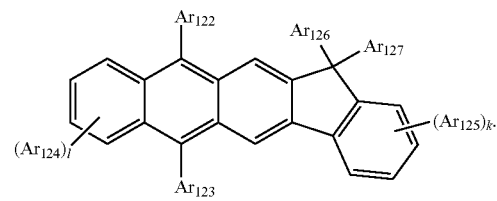

In Formula 302, $Ar_{122}$ to $Ar_{125}$ may each independently the same as those described in connection with $Ar_{113}$ in Formula 301.

In Formula 302, $Ar_{126}$ and $Ar_{127}$ may each be a $C_1$-$C_{10}$ alkyl group (for example, a methyl group, an ethyl group, or a propyl group).

In Formula 302, k and l may each be an integer from 0 to 4. For example, k and l may be 0, 1, or 2.

The compound represented by Formula 301 and the compound represented by Formula 302 may each include Compounds H1 to H42, but embodiments of the present disclosure are not limited thereto:

H1

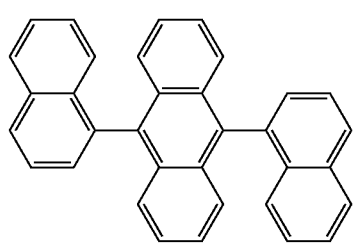

H2

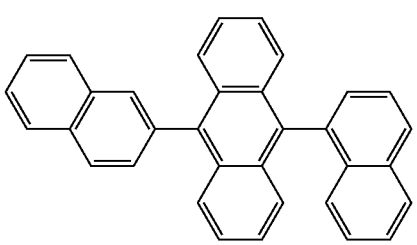

H3

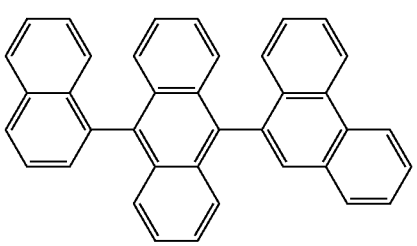

H4

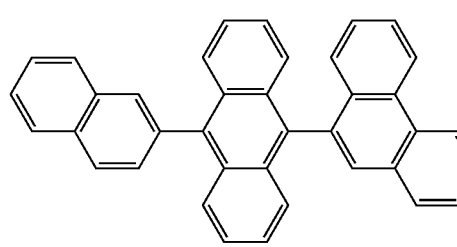

H5
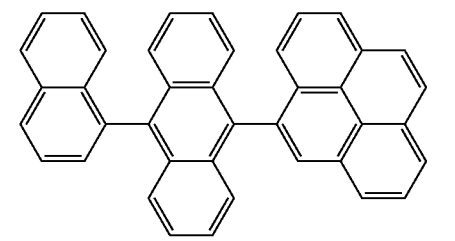
H6
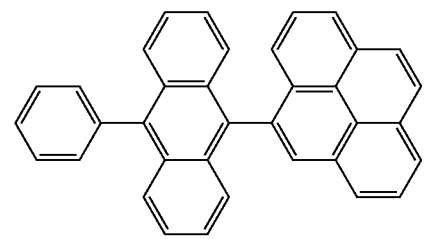
H7
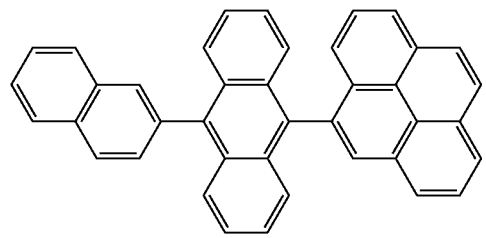
H8
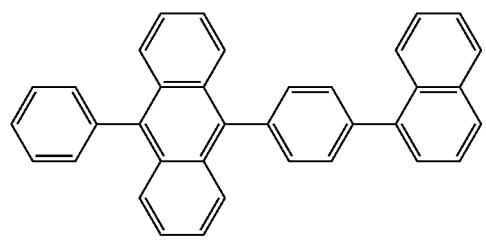
H9
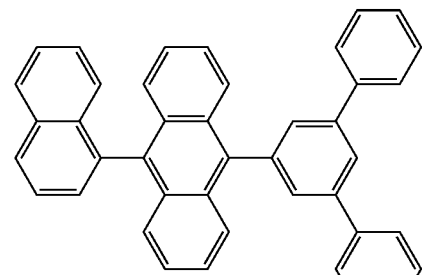
H10
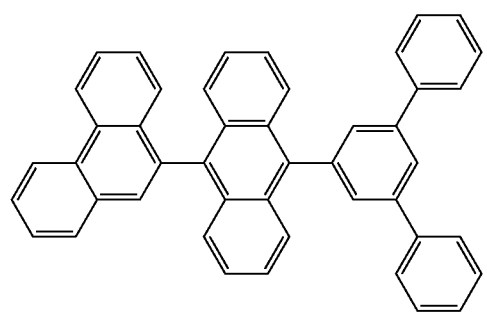
H11
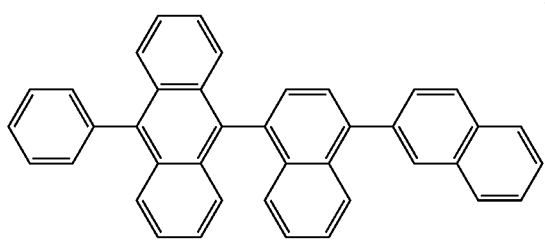
H12
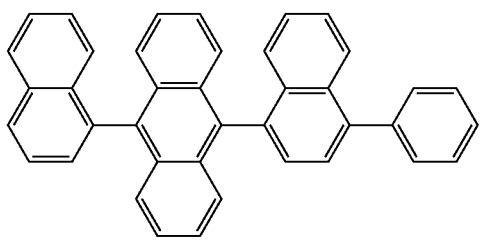
H13
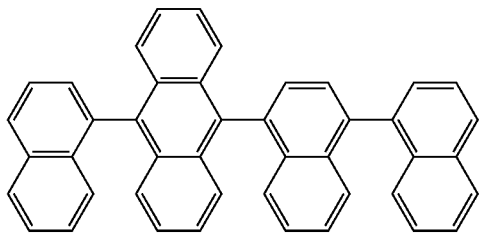
H14
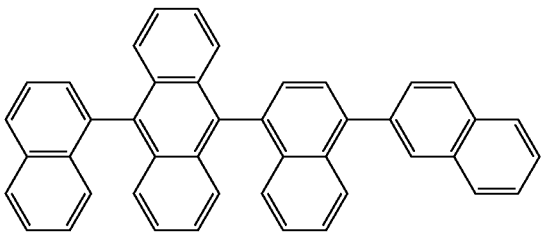
H15
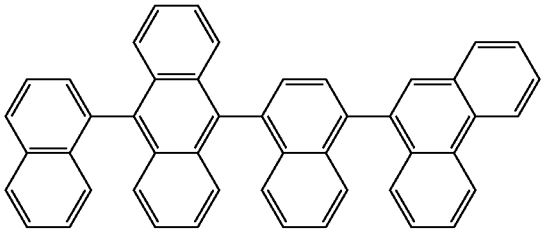
H16
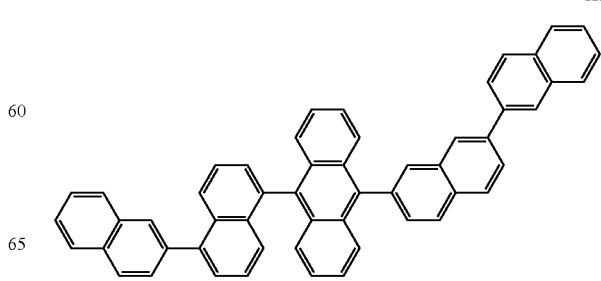

-continued
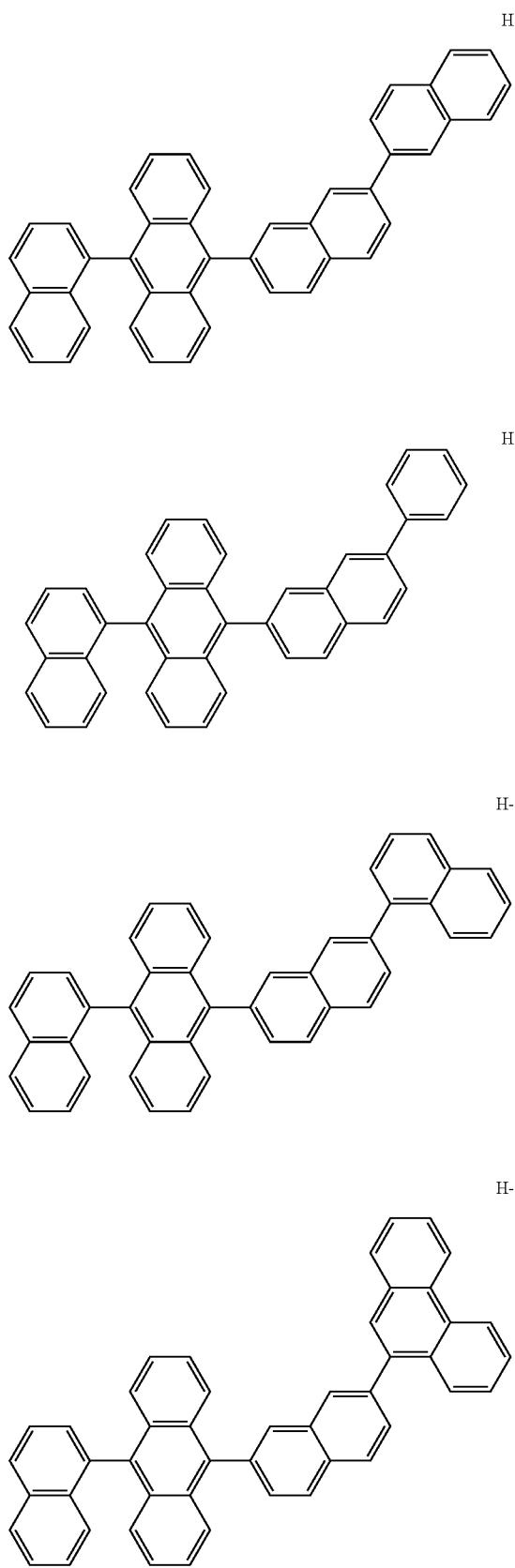
H17
H18
H-19
H-20
-continued
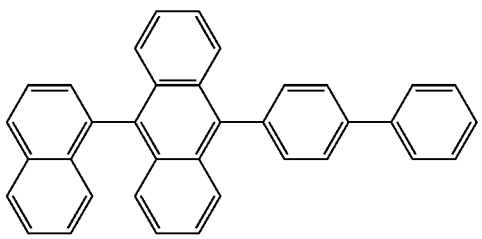
H-21
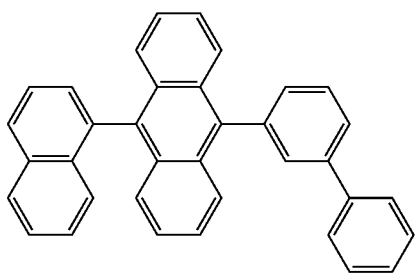
H-22
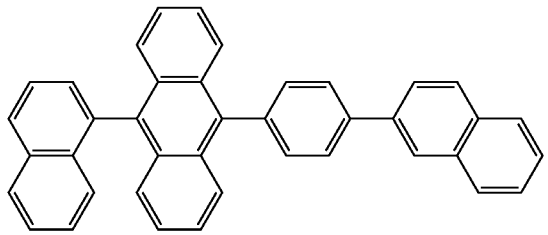
H-23
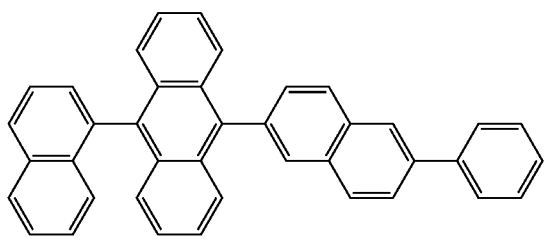
H24
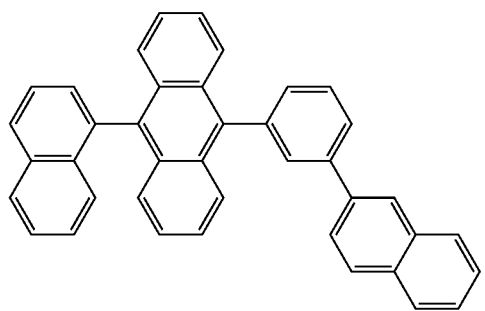
H25

H26
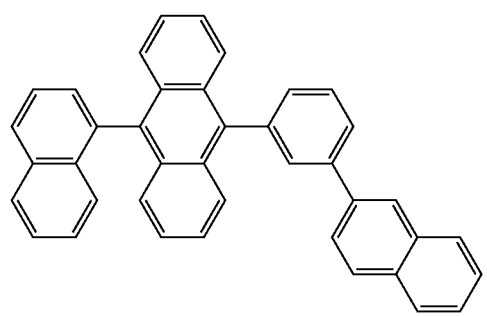
H27
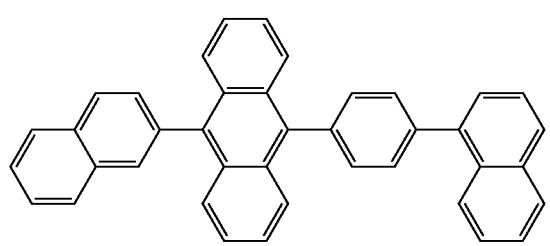
H28
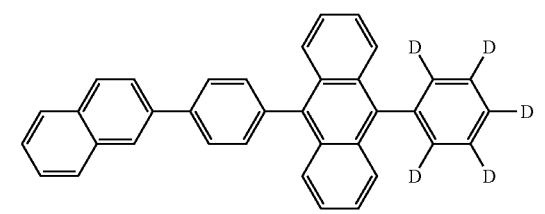
H29
H30
H31
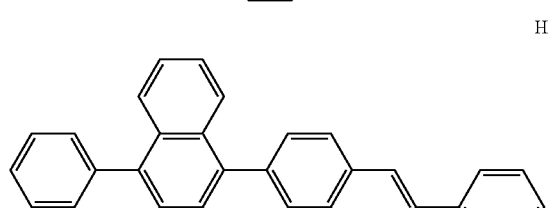
H32
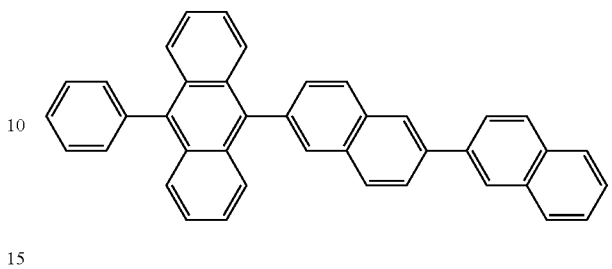
H33
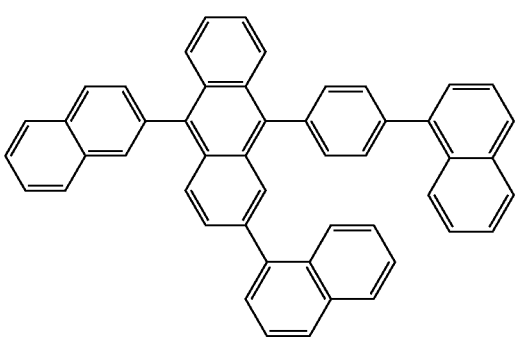
H34
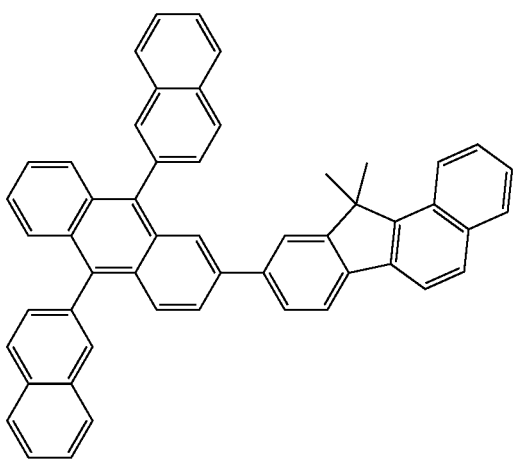
H35
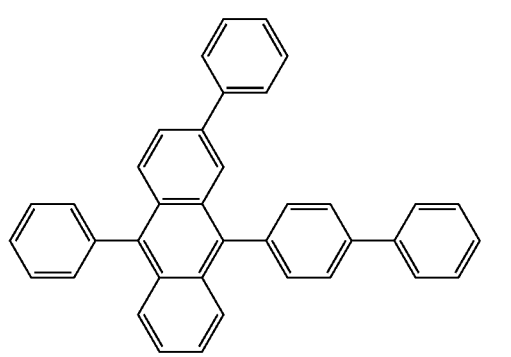

H36
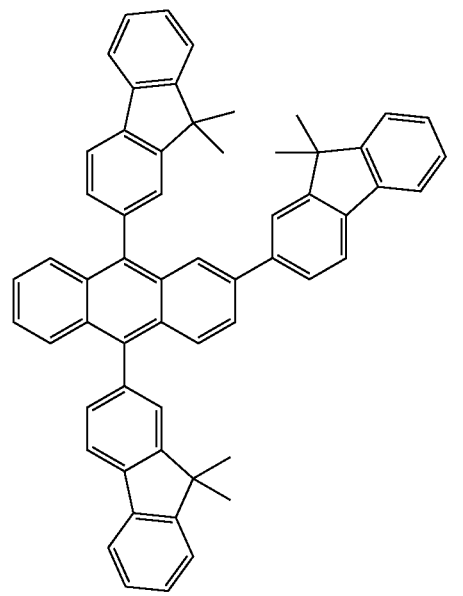
H37
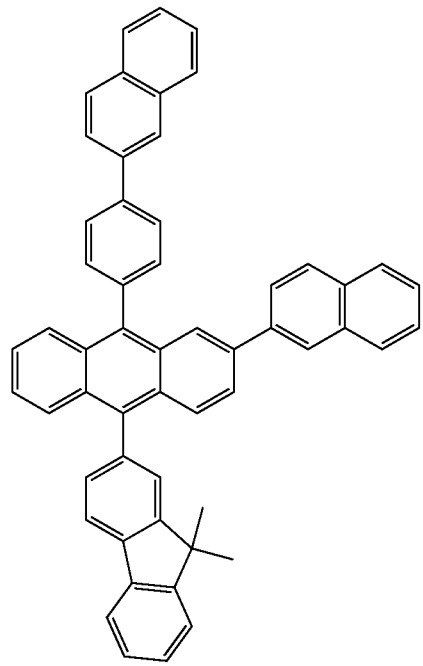
H38
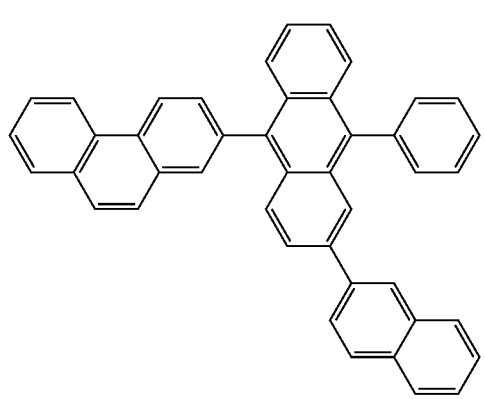
H39
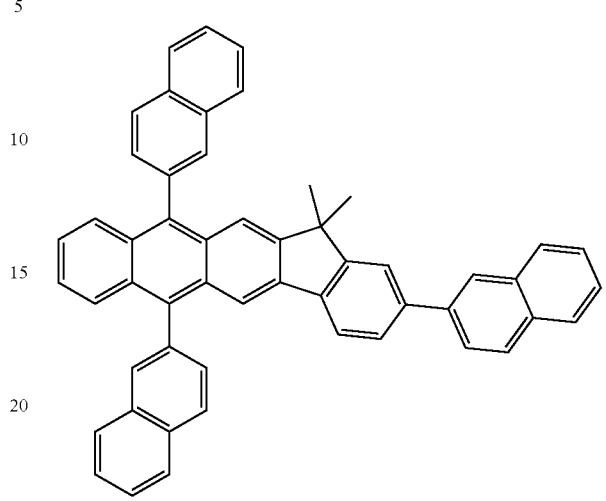
H40
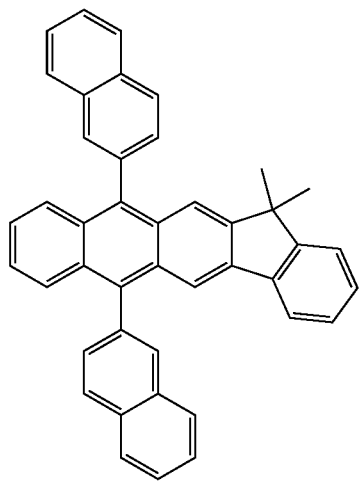
H41

H42

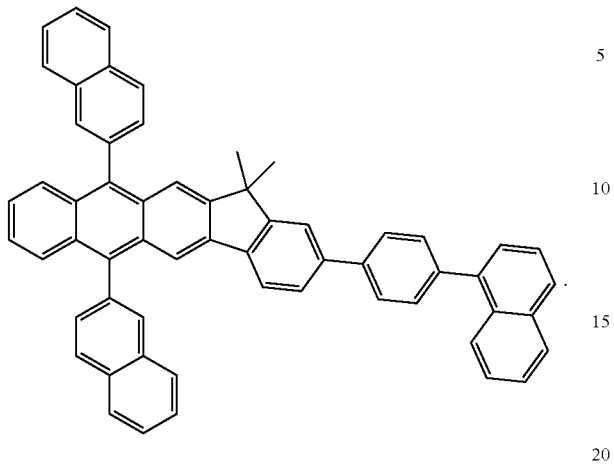

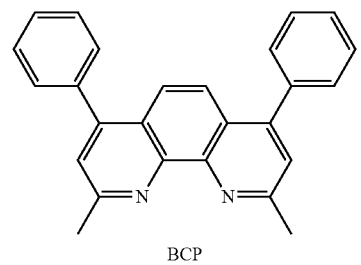
BCP

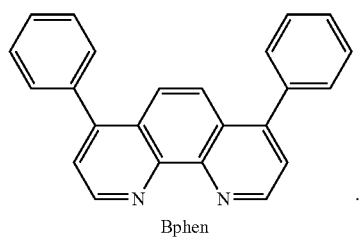
Bphen

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts to about 15 parts by weight based on 100 parts by weight of the host, but embodiments of the present disclosure are not limited thereto.

The dopant may include at least one of organometallic compounds represented by Formula 1.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have excellent hole blocking characteristics without a substantial increase in driving voltage.

The electron transport layer may include at least one selected from BCP, Bphen, Alq$_3$, BAlq, TAZ, and NTAZ:

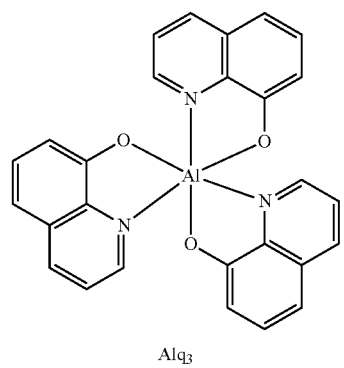
Alq$_3$

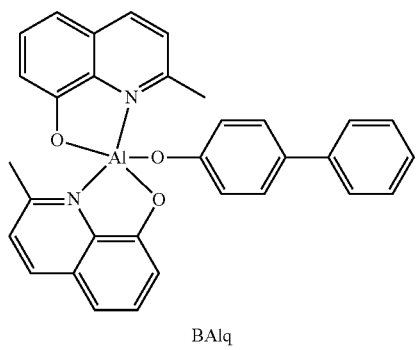
BAlq

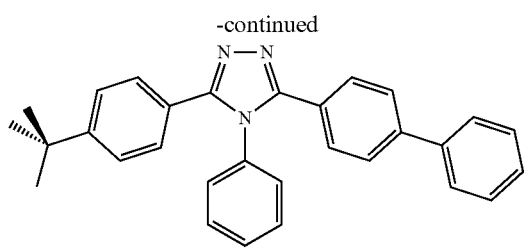
TAZ
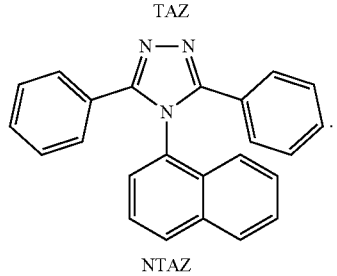
NTAZ
In one or more embodiments, the electron transport layer may include at least one of ET1 to ET25, but are not limited thereto:
ET1
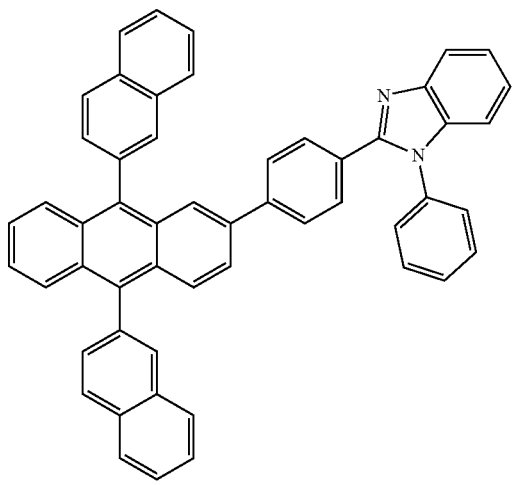
ET2
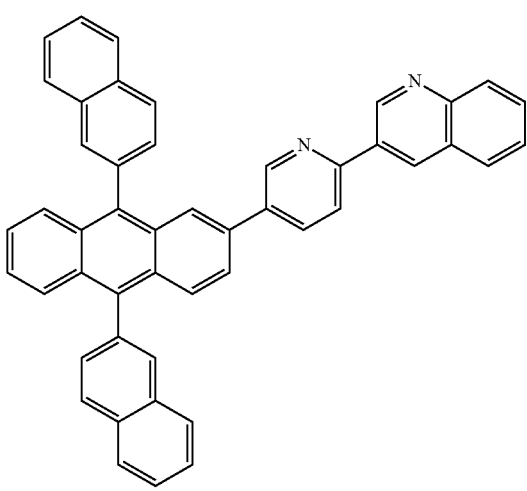
ET3
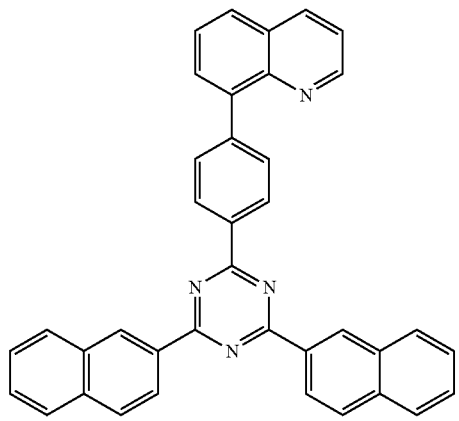
ET4
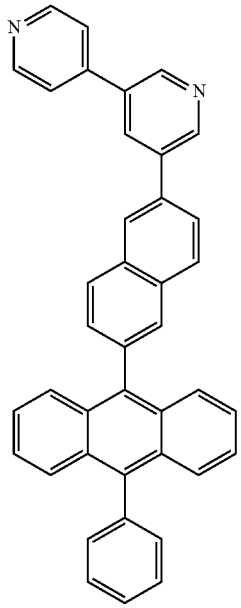
ET5
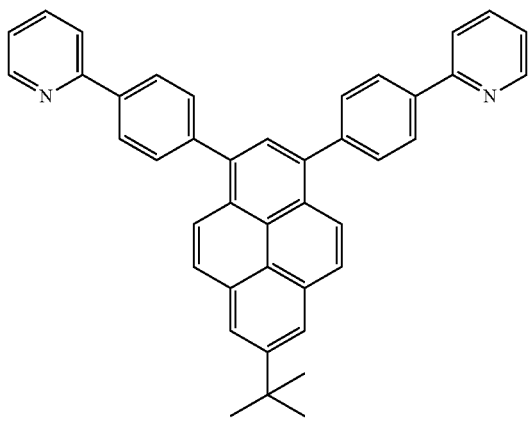

ET6
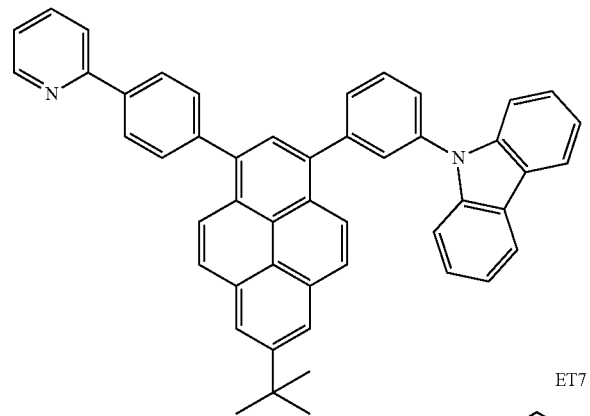
ET7
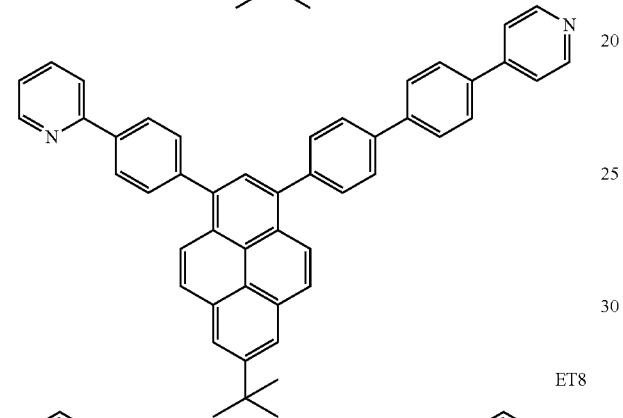
ET8
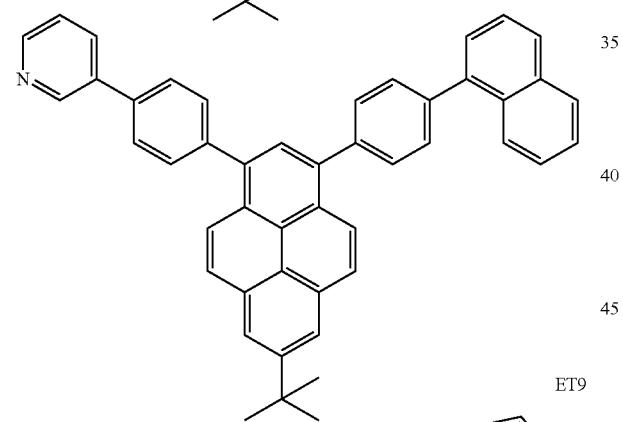
ET9
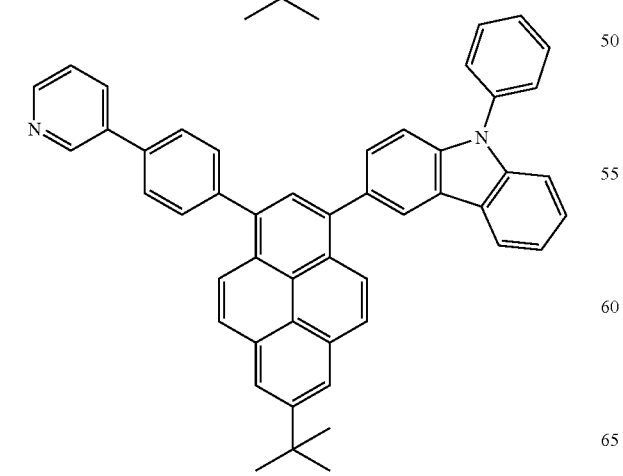
ET10
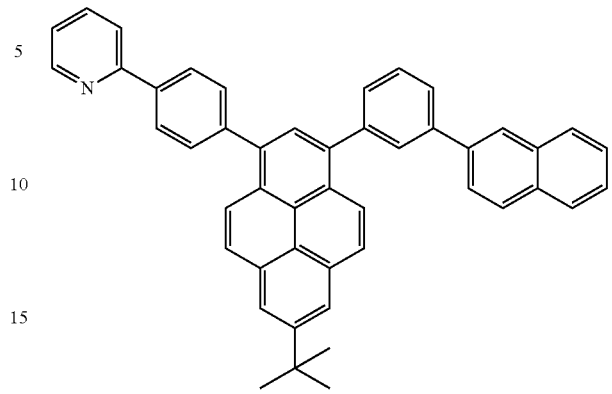
ET11
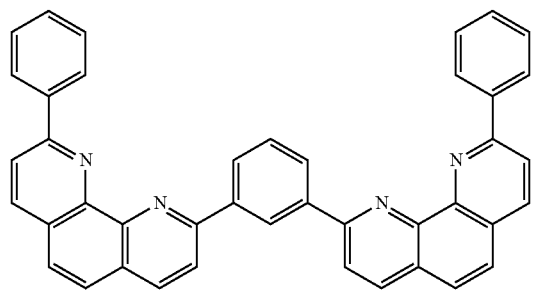
ET12
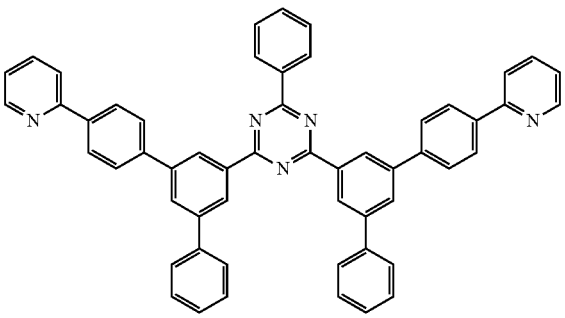
ET13
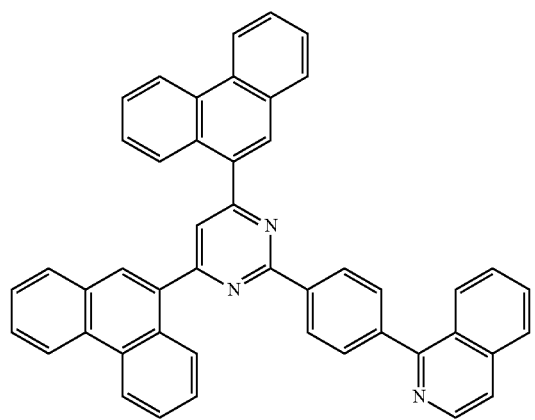

ET14
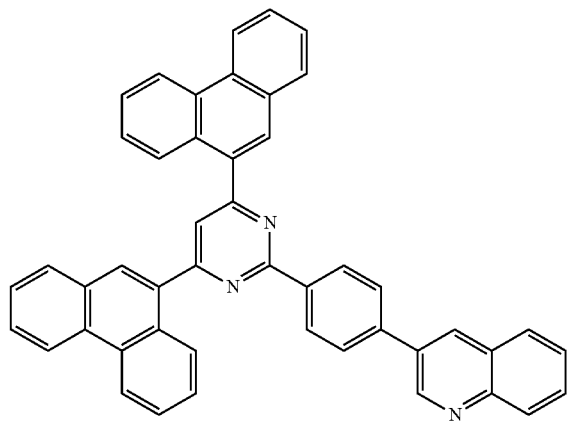
ET18
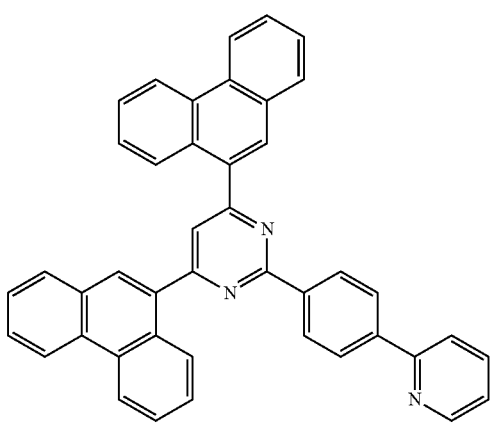
ET15
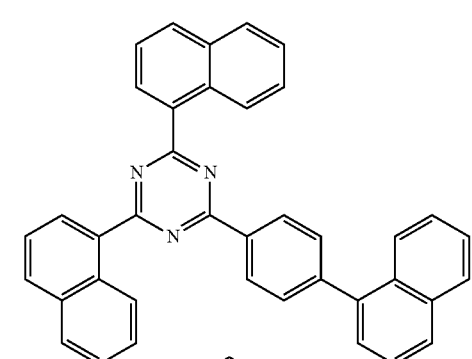
ET19
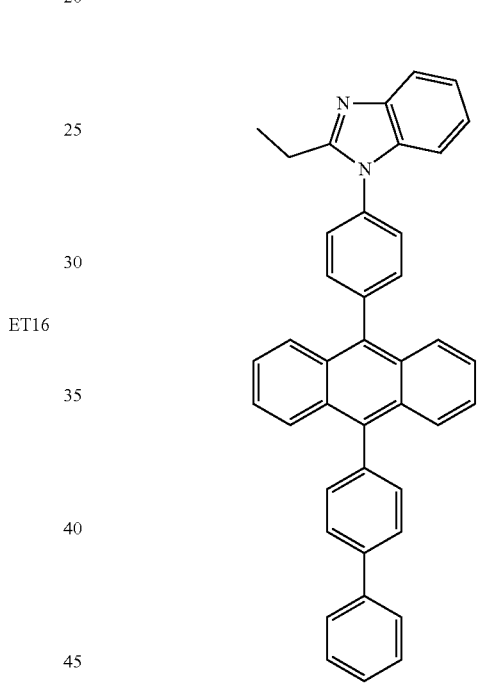
ET16
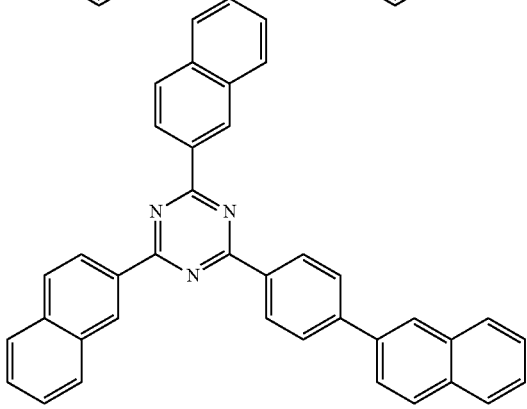
ET17
ET20
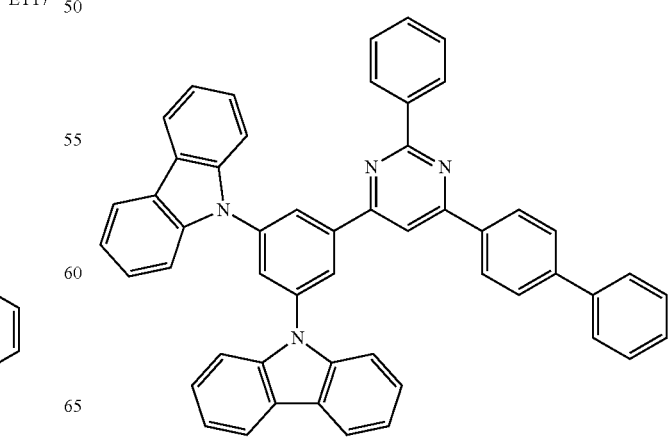

ET21 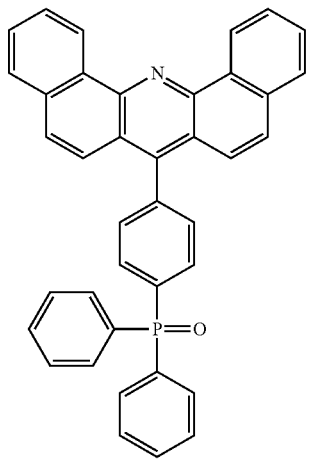

ET22 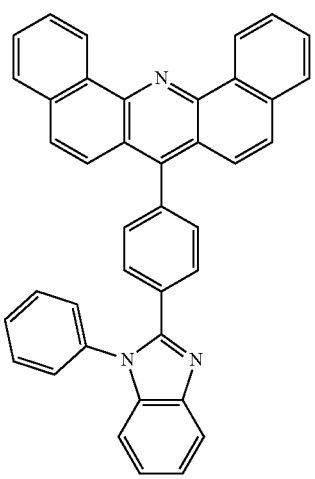

ET23 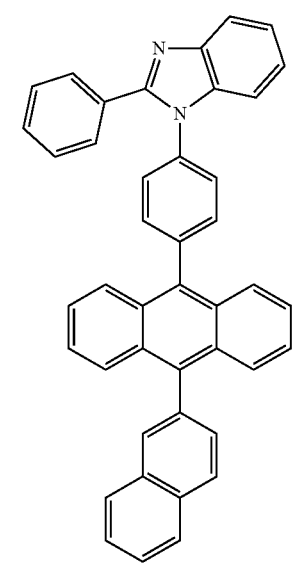

ET24 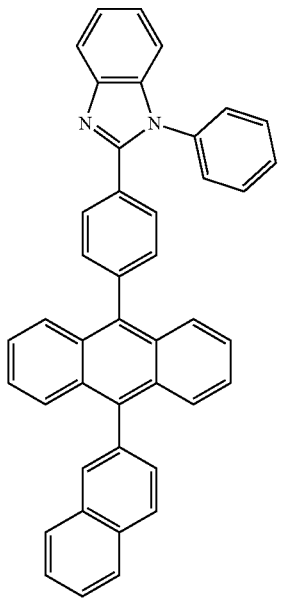

ET25 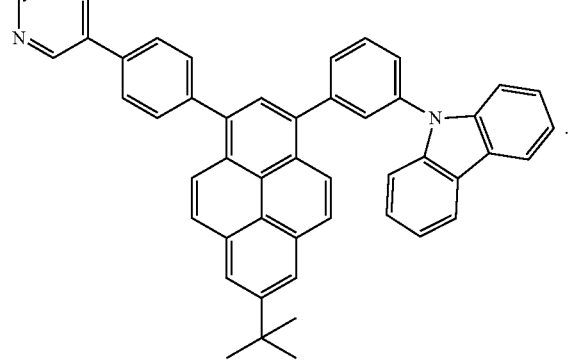

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

ET-D1

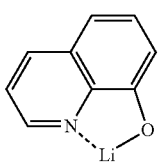

ET-D2

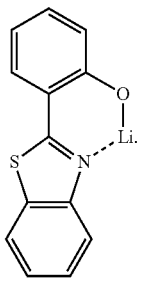

The electron transport region may include an electron injection layer that promotes flow of electrons from the second electrode 19 thereinto.

The electron injection layer may include at least one selected from LiF, NaCl, CsF, Li$_2$O, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

The term "transition metal of Period I of the Periodic Table" as used herein refers to an element selected from Period 4 elements and d-block elements of the Periodic Table, and examples thereof include scandium (Sc), titanium (Ti), vanadium (V), chromium (Cr), manganese (Mn), iron (Fe), cobalt (Co), nickel (Ni), copper (Cu), and zinc (Zn).

The term "transition metal of Period II of the Periodic Table" as used herein refers to an element selected from Period 5 elements and d-block elements of the period table, and examples thereof include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "transition metal of Period III of the period table" as used herein refers to Period 6 elements, d- and f-block elements of the Periodic Table, and examples thereof include lanthanum (La), samarium (Sm), europium (Eu), terbium (Tb), thulium (Tm), ytterbium (Yb), lutetium (Lu), hafnium (Hf), tantalum (Ta), tungsten(W), rhenium (Re), osmium (Os), iridium (Ir), platinum (Pr), gold (Au), and mercury (Hg).

The term "$C_1$-$C_{60}$ alkyl group" as used herein refers to a linear or branched aliphatic saturated hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by OA$_{101}$ (wherein A$_{101}$ is the $C_1$-$C_{60}$ alkyl group). Examples thereof include a methoxy group, an ethoxy group, and an iso-propyloxy group.

The term "$C_2$-$C_{60}$ alkenyl group" as used herein refers to a hydrocarbon group formed by having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms. Non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms. Non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic hydrocarbon group that has 3 to 10 carbon atoms, at least one carbon-carbon double bond in the ring thereof, and no aromaticity. Non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, and S as a ring-forming atom, and 1 to 60 carbon atoms. The term $C_1$-$C_{60}$ heteroarylene group" as used herein refers to a divalent group having a heterocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates $OA_{102}$ (wherein $A_{102}$ is the $C_6$-$C_{60}$ aryl group), and a $C_6$-$C_{60}$ arylthio group as used herein indicates $-SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The term "$C_5$-$C_{30}$ carbocyclic group" as used herein refers to a monocyclic group or a polycyclic group, and, according to its chemical structure, a monovalent, divalent, trivalent, tetravalent, pentavalent, or hexavalent group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The term "$C_1$-$C_{30}$ heterocyclic group" as used herein refers to a monocyclic group or a polycyclic group, and, according to its chemical structure, a monovalent, divalent, trivalent, tetravalent, pentavalent, or hexavalent group.

The term "5-membered aromatic hetero ring" as used herein refers to an aromatic ring having 3 to 5 atoms as a ring-forming atom, wherein these atoms include, in addition to carbon atom, at least one hetero atom selected from N, O, P, Si, and S.

The term "5-membered non-aromatic ring" as used herein refers to a saturated or unsaturated ring having 3 to 5 carbon atoms as a ring-forming atom.

The term "5-membered non-aromatic hetero ring" as used herein refers to a saturated or unsaturated ring having 3 to 5 atoms as a ring-forming atom, wherein these atoms include, in addition to carbon atom, at least one hetero atom selected from N, O, P, Si, and S.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and
—$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "'B' was used instead of 'A'" used in describing Synthesis Examples means that a molar equivalent of 'A' was identical to a molar equivalent of 'B'.

EXAMPLES

Synthesis Example 1: Synthesis of Compound 19

Synthesis of Ligand

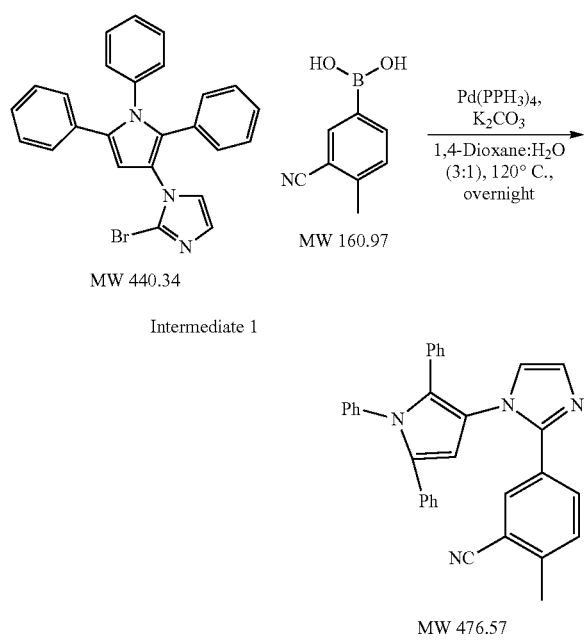

Intermediate 1

14 millimoles (mmol) (6.16 grams (g)) of Intermediate 1, 14 mmol (2.25 g) of (3-cyano-4-fluorophenyl)boronic acid, 0.45 mmol (0.52 g) of tetrakis-(triphenylphosphine) palladium (0), and 45 mmol (6.21 g) of potassium carbonate were mixed with 120 milliliters (mL) of a solution of 1,4-dioxane and water (mixed at a volume ratio of 3:1), and the mixed solution was refluxed at a temperature of 120° C. for 72 hours. The reaction mixture was cooled down and extracted by using ethyl acetate and water. The organic layer was washed with water three times and dried by using magnesium sulfate ($MgSO_4$). The solvent was removed under reduced pressure to obtain a crude product. The crude product was purified by silica gel chromatography (eluent: dichloromethane and hexane), thereby obtaining 2 mmol (0.96 g) of a ligand. The structure and purity of the ligand were identified by NMR, HPLC, and LCMS analyses.

$^1$H NMR (300 MHz, $CDCl_3$, rt): δ 8.80 (d, J=7.26 Hz, 2H), 7.80 (m, 4H), 7.61-7.41 (m, 13H), 7.16 (s, 1H), 6.47 (s, 1H), 2.50 (s, 3H).

Synthesis of Compound 19

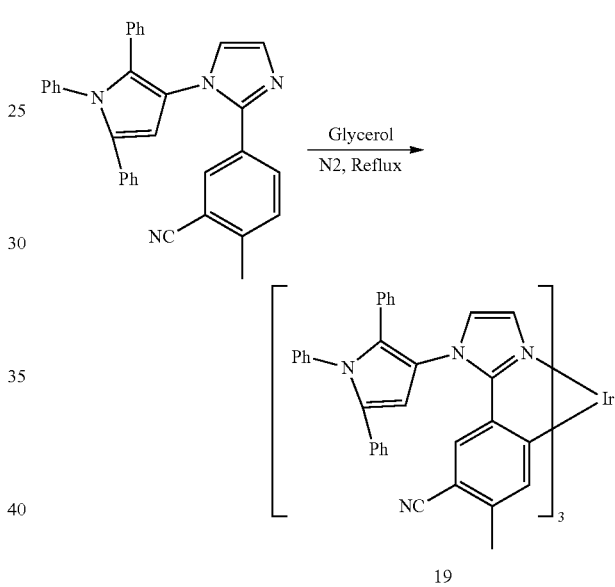

0.05 mmol of $Ir(acac)_3$, 2 mmol of the ligand, and glycerol were added to a reaction plate, and the mixture was refulxed in a nitrogen atmosphere for 12 hours. After completion of the reaction, the mixture was cooled to room temperature. Dichloromethane and distilled water were added thereto to separate the organic layer. The separated organic layer was washed with distilled water twice, and dried by using $MgSO_4$. The solvent was removed to obtain a crude product. The crude product was purified by silica gel chromatography (eluent: dichloromethane and n-hexane), thereby obtaining 0.1 mmol of Compound 19. The structure and purity (97% or more) of Compound 19 were identified by NMR, HPLC, and LCMS analyses.

$^1$H NMR (300 MHz, $CDCl_3$, rt): δ 7.80 (m, 5H), 7.60-7.40 (m, 14H), 6.47 (s, 1H), 2.50 (s, 3H).

Evaluation Example 1

Evaluation of HOMO, LUMO, and Triplet ($T_1$) Energy Levels

Figure 2:
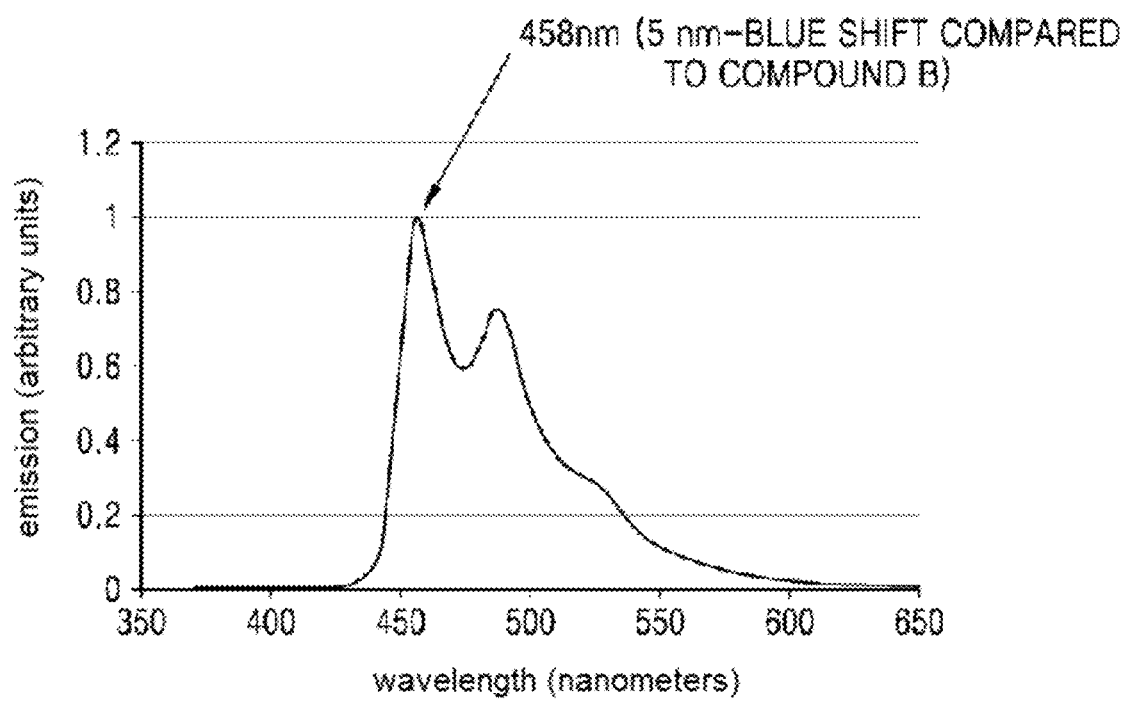
FIG. 2 shows an emission spectrum of Compound 19.

HOMO and LUMO energy levels of Compound 19 and Compounds A and B were evaluated according to the methods described in Table 2, and the results are shown in Table 3. In addition, FIG. 2 shows an emission spectrum of Compound 19.

TABLE 2

| | |
|---|---|
| HOMO energy level evaluation method | Cyclic voltammetry (CV) (electrolyte: 0.1 molar (M) BU$_4$NClO$_4$/solvent: CH$_2$Cl$_2$/electrode: 3-electrode system (working electrode: GC, reference electrode: Ag/AgCl, auxiliary electrode: Pt)) was used to obtain a potential (volts, V)-current (amperes, A) graph of each compound, and based on a reduction onset of the graph, a HOMO energy level of each compound was calculated. |
| LUMO energy level evaluation method | Each compound was diluted in CHCl$_3$ to a concentration of 1 × 10$^{-5}$M, and then, a Shimadzu UV-350 spectrometer was used to obtain a UV absorbent spectrum of each compound at room temperature. Then, based on an optical band gap ($E_g$) from an edge of the absorbent spectrum, a LUMO energy of each compound was calculated. |
| Emission spectrum evaluation method | Each compound was diluted in CH$_2$Cl$_2$ to a concentration of 10 millimolar (mM), and an ISC PC1 spectrofluorometer equipped with an xenon lamp was used to measure a photoluminescence (PL) spectrum at room temperature. Here, T1 (electron volts, eV) was an electron volt value converted from a $\lambda_{max}$ (nm) value. |

TABLE 3

| Compound No. | HOMO (eV) | LUMO (eV) | $\lambda_{max}$ (nm) | T1 (eV) |
|---|---|---|---|---|
| 19 | -5.07 | -0.95 | 458 | 2.71 |
| A | -4.37 | -0.39 | 479 | 2.59 |
| B | -5.28 | -1.18 | 463 | 2.68 |

Referring to Table 3 and FIG. 2, it was confirmed that Compound 19 had characteristics that are suitable for use as a material for a blue organic light-emitting device, compared to existing Compounds A and B.

According to one or more embodiments, an organometallic compound has improved electric characteristics and/or thermal stability, and because of that, an organic light-emitting device including the organometallic compound has improved lifespan, efficiency, and color purity characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organometallic compound represented by Formula 1:

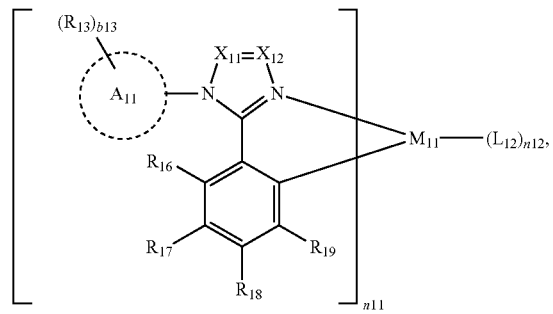

Formula 1 wherein, in Formula 1, $M_{11}$ is selected from transition metals of Periods I to III of the Periodic Table, $X_{11}$ is selected from N and $CR_{11}$, $X_{12}$ is selected from N and $CR_{12}$, $R_{11}$ to $R_{12}$ and $R_{16}$ to $R_{19}$ are each independently selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropolycyclic group, -N(Q$_1$)(Q$_2$), —Si(Q$_3$)(Q$_4$)(Q$_5$), —B(Q$_6$)(Q$_7$), and —P(=O)(Q$_8$)(Q$_9$), $R_{11}$ and $R_{12}$ are optionally linked to form a ring, at least one selected from $R_{16}$ to $R_{19}$ is a cyano group, two, three, or four selected of a plurality of $R_{11}$ to $R_{12}$ and $R_{16}$ to $R_{19}$ that are adjacent to each other are optionally linked to form a tetradentate ligand, a hexadentate ligand, or an octadentate ligand, respectively, n11 is selected from 1, 2, 3, and 4, n12 is selected from 0, 1, 2, 3, and 4, L$_{12}$ is selected from a monodentate ligand, a bidentate ligand, and a tridentate ligand, Q$_1$ to Q$_9$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_1$-C$_{60}$ alkyl group substituted with at least one selected from deuterium, a C$_1$-C$_{60}$ alkyl group, and a C$_6$-C$_{60}$ aryl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, wherein $A_{11}$-$(R_{13})_{b13}$ is a group represented by one selected from Formulae 2-11 to 2-18:

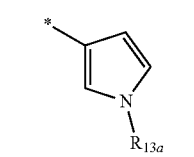

2-11

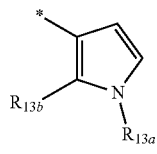

2-12

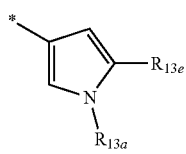

2-13

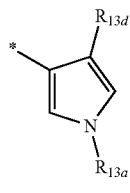

2-14

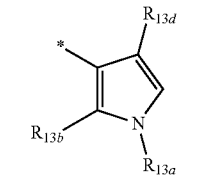

2-15

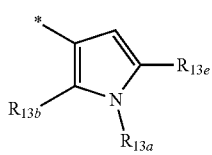

2-16

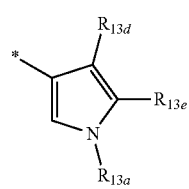

2-17

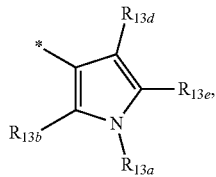

2-18 wherein, in Formulae 2-11 to 2-18, $R_{13a}$, $R_{13b}$, $R_{13d}$, and $R_{13e}$ are each independently selected from a $C_1$-$C_{10}$ alkyl group and a $C_6$-$C_{20}$ aryl group, and "*" indicates a binding site to a neighboring atom.

2. The organometallic compound of claim 1, wherein $M_{11}$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

3. The organometallic compound of claim 1, wherein $X_{11}$ is N, and $X_{12}$ is $CR_{12}$, $X_{11}$ is $CR_{11}$, and $X_{12}$ is N, $X_{11}$ is N, and $X_{12}$ is N, or $X_{11}$ is $CR_{11}$, and $X_{12}$ is $CR_{12}$.

4. The organometallic compound of claim 1, wherein $R_{11}$ to $R_{12}$ and $R_{16}$ to $R_{19}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclopentyl group substituted with deuterium, a cyclohexyl group, a cyclohexyl group substituted with deuterium, a cycloheptyl group, a cycloheptyl group substituted with deuterium, a cycloctyl group, a cycloctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cycloctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cycloctyl group, a cycloctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si($Q_{33}$)($Q_{34}$)($Q_{35}$); and —N($Q_1$)($Q_2$), —Si($Q_3$)($Q_4$)($Q_5$), —B($Q_5$)($Q_7$), and —P(=O)($Q_8$)($Q_9$), and $Q_1$ to $Q_9$ and $Q_{33}$ to $Q_{35}$ are each independently selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CH$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

5. The organometallic compound of claim 1, wherein $R_{11}$ to $R_{12}$ and $R_{16}$ to $R_{19}$ are each independently selected from:

hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cycloctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cycloctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cycloctyl group, a cycloctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —$Si(Q_{33})(Q_{34})(Q_{35})$; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ and $Q_{33}$ to $Q_{35}$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CH_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

6. The organometallic compound of claim 1, wherein $R_{17}$ is a cyano group.

7. The organometallic compound of claim 1, wherein n11 is selected from 1, 2, and 3.

8. The organometallic compound of claim 1, wherein n12 is selected from 0, 1, and 2.

9. The organometallic compound of claim 1, wherein $M_{11}$ is Ir, n11 is selected from 2 and 3, and n12 is selected from 0, 1, and 2.

10. The organometallic compound of claim 1, wherein $L_{12}$ is a ligand represented by one selected from Formulae 7-1 to 7-11:

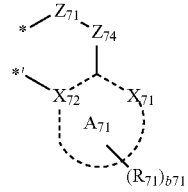
7-1

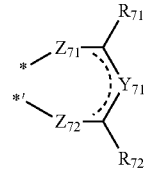
7-2

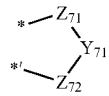
7-3

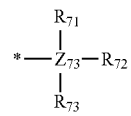
7-4

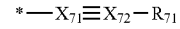
7-5

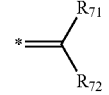
7-6

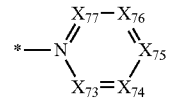
7-7

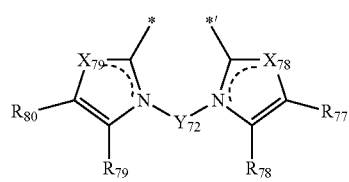
7-8

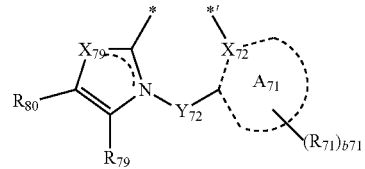
7-9

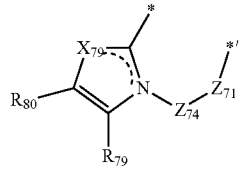
7-10

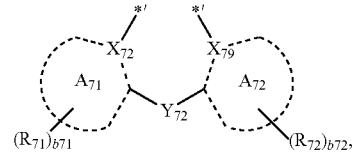
7-11 wherein, in Formulae 7-1 to 7-11, $A_{71}$ and $A_{72}$ are each selected from a $C_5$-$C_{20}$ carbocyclic group and a $C_1$-$C_{20}$ heterocyclic group, $X_{71}$, $X_{72}$, $X_{78}$, and $X_{79}$ are each independently selected from C and N, $X_{73}$ is N or $C(Q_{73})$, $X_{24}$ is N or $C(Q_{74})$, $X_{75}$ is N or $C(Q_{75})$, $X_{76}$ is N or $C(Q_{76})$, $X_{27}$ is N or $C(Q_{77})$, $X_{78}$ is O, S, or $N(Q_{78})$, $X_{29}$ is O, S, or $N(Q_{79})$, $Y_{71}$ and $Y_{72}$ are each selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_{71}$ and $Z_{72}$ are each selected from N, O, $N(R_{75})$, $P(R_{75})(R_{76})$, and $As(R_{75})(R_{76})$, $Z_{73}$ is selected from P and As, $Z_{74}$ is selected from CO and $CH_2$, $R_{71}$ to $R_{80}$ and $Q_{73}$ to $Q_{79}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $R_{71}$ and $R_{72}$ are optionally linked to form a ring, $R_{77}$ and $R_{78}$ are optionally linked to form a ring, $R_{78}$ and $R_{79}$ are optionally linked to form a ring, $R_{79}$ and $R_{80}$ are optionally linked to form a ring, b71 and b72 are each selected from 1, 2, and 3, and

* and *' each indicate a binding site to a neighboring atom.

11. The organometallic compound of claim 1, wherein the organometallic compound represented by Formula 1 is represented by one selected from Formulae 1-1 to 1-5:

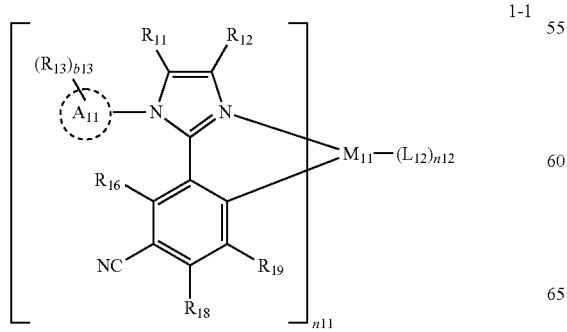

1-1

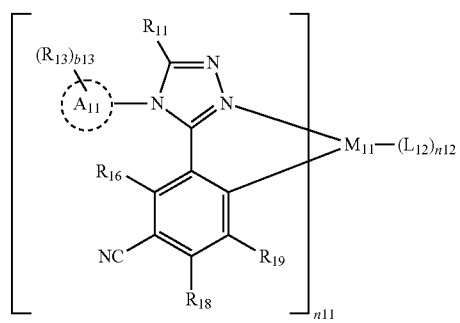

1-2

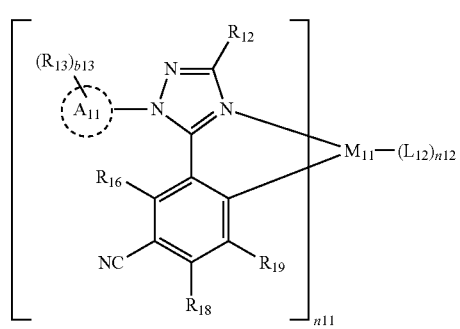

1-3

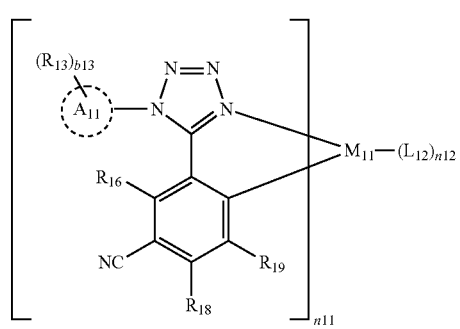

1-4

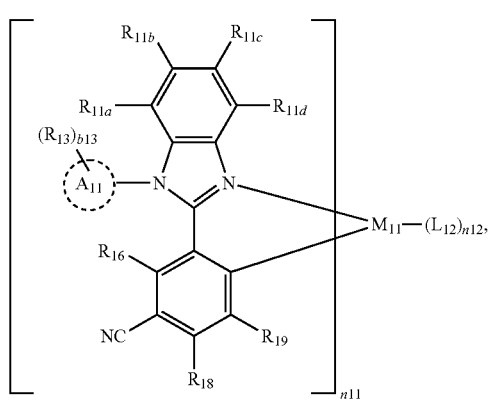

1-5 wherein, in Formulae 1-1 to 1-5, $M_{11}$, $R_{11}$ to $R_{12}$, $R_{16}$ to $R_{19}$, n11, n12, $A_{11}$-$(R_{13})_{b13}$, and $L_{12}$ are defined as those of Formula 1, and $R_{11a}$ to $R_{11d}$ are each independently defined in connection with $R_{11}$ of Formula 1.

12. The organometallic compound of claim 1, wherein the organometallic compound of Formula 1 is selected from Compounds 1 to 24:

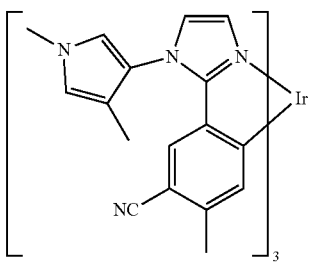
1
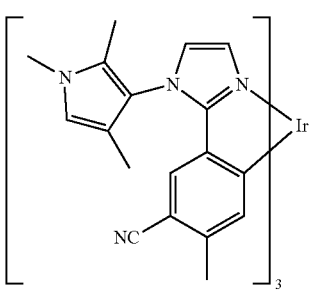
2
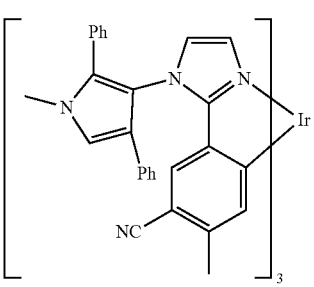
3
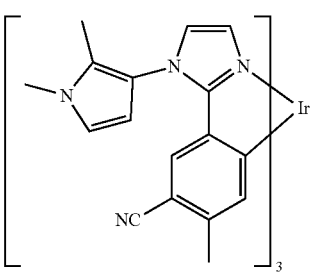
4
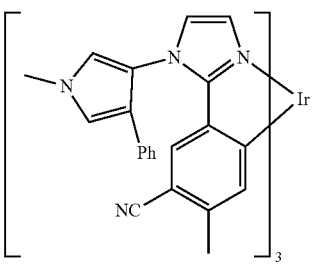
5
-continued
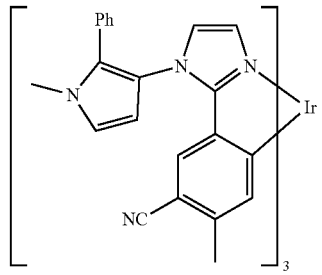
6
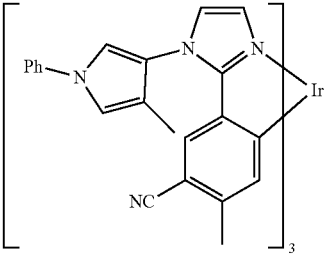
7
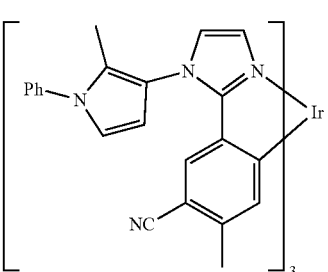
8
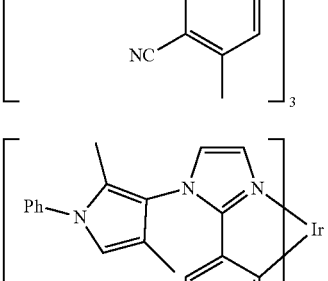
9
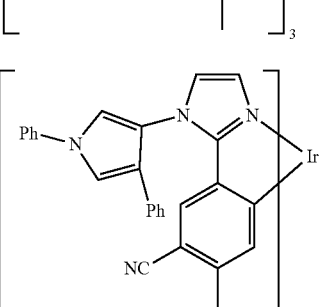
10
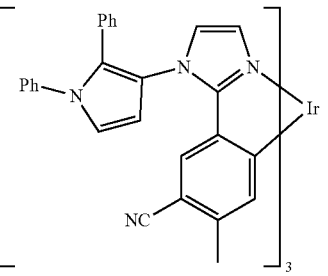
11

| | |
|---|---|
| 12 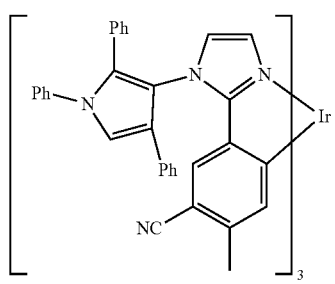 | 18 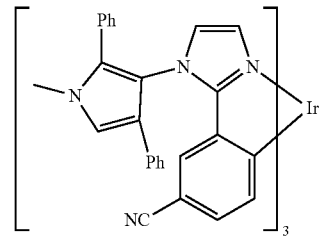 |
| 13 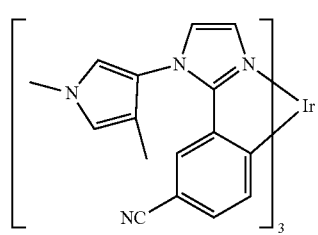 | 19 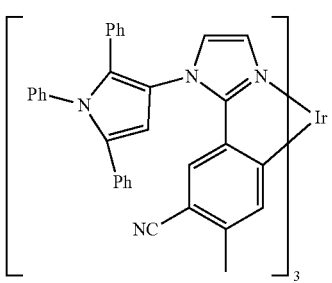 |
| 14 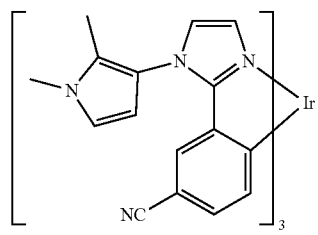 | 20 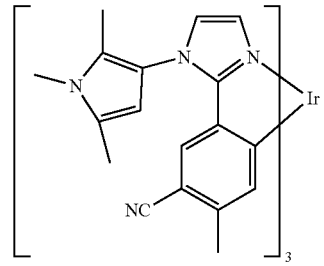 |
| 15 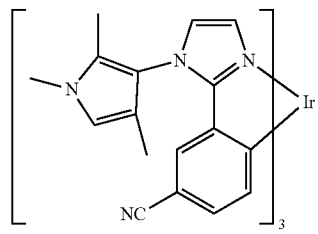 | 21 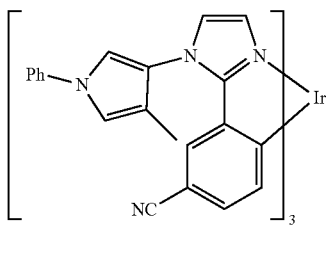 |
| 16 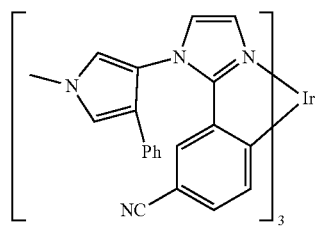 | 22 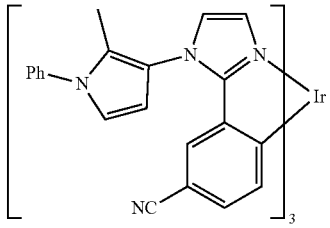 |
| 17 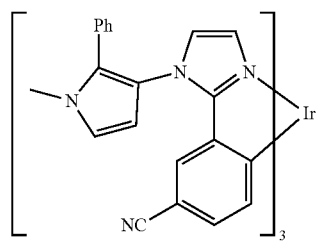 | 23 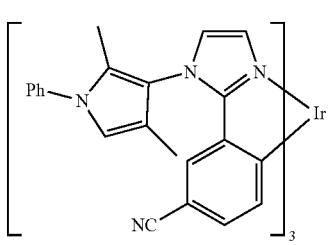 |

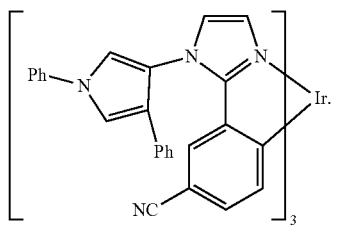

24

13. The organometallic compound of claim 1, wherein the organometallic compound emits blue light having a maximum wavelength of 440 nanometers or more and less than 500 nanometers.

14. An organic light-emitting device comprising:
a first electrode,
a second electrode, and
an organic layer disposed between the first electrode and the second electrode,
wherein the organic layer comprises an emission layer and the organometallic compound of claim 1.

15. The organic light-emitting device of claim 14, wherein the emission layer comprises the organometallic compound.

16. The organic light-emitting device of claim 15, wherein the emission layer further comprises a host, and wherein an amount of the host is greater than that of the organometallic compound.

* * * * *